(12) United States Patent
Aoyama et al.

(10) Patent No.: US 9,735,398 B2
(45) Date of Patent: Aug. 15, 2017

(54) PEELING METHOD

(71) Applicant: Semiconductor Energy Laboratory Co., Ltd., Kanagawa-ken (JP)

(72) Inventors: Tomoya Aoyama, Kanagawa (JP); Akihiro Chida, Kanagawa (JP); Ryu Komatsu, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/450,463

(22) Filed: Aug. 4, 2014

(65) Prior Publication Data

US 2015/0044792 A1    Feb. 12, 2015

(30) Foreign Application Priority Data

Aug. 6, 2013 (JP) ................. 2013-163029

(51) Int. Cl.
*H01L 51/56* (2006.01)
*H01L 51/00* (2006.01)
*H01L 51/52* (2006.01)

(52) U.S. Cl.
CPC ........... *H01L 51/56* (2013.01); *H01L 51/003* (2013.01); *H01L 51/0024* (2013.01); *H01L 51/524* (2013.01)

(58) Field of Classification Search
CPC ... H01L 51/00; H01L 51/0024; H01L 51/003; H01L 51/52; H01L 51/56; H01L 51/524; H01L 51/5237; H01L 51/5246
USPC ........................................... 438/27
See application file for complete search history.

(56) References Cited

U.S. PATENT DOCUMENTS

| 5,821,138 A | 10/1998 | Yamazaki et al. |
| 5,854,123 A | 12/1998 | Sato et al. |
| 5,891,298 A | 4/1999 | Kuroda et al. |
| 6,072,239 A | 6/2000 | Yoneda et al. |
| 6,100,166 A | 8/2000 | Sakaguchi et al. |

(Continued)

FOREIGN PATENT DOCUMENTS

| CN | 101154562 A | 4/2008 |
| CN | 101740495 A | 6/2010 |

(Continued)

OTHER PUBLICATIONS

International Search Report re Application No. PCT/JP2014/070418, dated Nov. 11, 2014.

(Continued)

*Primary Examiner* — Chuong A Luu
(74) *Attorney, Agent, or Firm* — Husch Blackwell LLP

(57) ABSTRACT

To improve the yield in a peeling process and improve the yield in a manufacturing process of a flexible light-emitting device or the like, a peeling method includes a first step of forming a peeling layer over a first substrate, a second step of forming a layer to be peeled including a first layer in contact with the peeling layer over the peeling layer, a third step of curing a bonding layer in an overlapping manner with the peeling layer and the layer to be peeled, a fourth step of removing part of the first layer overlapping with the peeled layer and the bonding layer to form a peeling starting point, and a fifth step of separating the peeling layer and the layer to be peeled. The peeling starting point is preferably formed by laser light irradiation.

30 Claims, 34 Drawing Sheets

(56) References Cited

U.S. PATENT DOCUMENTS

| | | |
|---|---|---|
| 6,127,199 A | 10/2000 | Inoue et al. |
| 6,326,279 B1 | 12/2001 | Kakizaki et al. |
| 6,372,608 B1 | 4/2002 | Shimoda et al. |
| 6,391,220 B1 | 5/2002 | Zhang et al. |
| 6,452,091 B1 | 9/2002 | Nakagawa et al. |
| 6,544,430 B2 | 4/2003 | McCormack et al. |
| 6,592,739 B1 | 7/2003 | Sonoda et al. |
| 6,682,963 B2 | 1/2004 | Ishikawa |
| 6,846,696 B2 | 1/2005 | Adachi et al. |
| 6,849,877 B2 | 2/2005 | Yamazaki et al. |
| 6,946,361 B2 | 9/2005 | Takayama et al. |
| 6,953,735 B2 | 10/2005 | Yamazaki et al. |
| 6,982,181 B2 | 1/2006 | Hideo |
| 7,015,075 B2 | 3/2006 | Fay et al. |
| 7,029,950 B2 | 4/2006 | Yonehara et al. |
| 7,056,810 B2 | 6/2006 | Yamazaki et al. |
| 7,060,153 B2 | 6/2006 | Yamazaki et al. |
| 7,067,392 B2 | 6/2006 | Yamazaki et al. |
| 7,122,445 B2 | 10/2006 | Takayama et al. |
| 7,122,447 B2 | 10/2006 | Abe |
| 7,147,740 B2 | 12/2006 | Takayama et al. |
| 7,180,091 B2 | 2/2007 | Yamazaki et al. |
| 7,189,631 B2 | 3/2007 | Yamazaki et al. |
| 7,241,666 B2 | 7/2007 | Goto et al. |
| 7,245,331 B2 | 7/2007 | Yamazaki et al. |
| 7,262,088 B2 | 8/2007 | Kodaira et al. |
| 7,271,076 B2 | 9/2007 | Yamazaki et al. |
| 7,282,380 B2 | 10/2007 | Maruyama et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,436,050 B2 | 10/2008 | Yamazaki et al. |
| 7,465,674 B2 | 12/2008 | Tamura |
| 7,482,248 B2 | 1/2009 | Tamura |
| 7,521,383 B2 | 4/2009 | Morisue et al. |
| 7,536,780 B2 | 5/2009 | Shimizu et al. |
| 7,540,079 B2 | 6/2009 | Okuyama et al. |
| 7,566,633 B2 | 7/2009 | Koyama et al. |
| 7,566,640 B2 | 7/2009 | Yamazaki et al. |
| 7,591,863 B2 | 9/2009 | Watanabe et al. |
| 7,601,236 B2 | 10/2009 | Yamashita et al. |
| 7,608,520 B2 | 10/2009 | Sugita et al. |
| 7,723,209 B2 | 5/2010 | Maruyama et al. |
| 7,732,263 B2 | 6/2010 | Yamazaki et al. |
| 7,767,543 B2 | 8/2010 | Tateishi et al. |
| 7,820,526 B2 | 10/2010 | Yamada et al. |
| 7,867,907 B2 | 1/2011 | Shimomura et al. |
| 7,927,971 B2 | 4/2011 | Tamura et al. |
| 8,030,132 B2 | 10/2011 | Ogita et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,058,083 B2 | 11/2011 | Eguchi et al. |
| 8,058,146 B2 | 11/2011 | Kuwabara |
| 8,110,442 B2 | 2/2012 | Jinbo |
| 8,367,440 B2 | 2/2013 | Takayama et al. |
| 2003/0022403 A1 | 1/2003 | Shimoda et al. |
| 2003/0082889 A1* | 5/2003 | Maruyama .......... H01L 27/1214 438/455 |
| 2004/0209442 A1 | 10/2004 | Takakuwa et al. |
| 2005/0176180 A1 | 8/2005 | Fay et al. |
| 2005/0214984 A1* | 9/2005 | Maruyama et al. .......... 438/149 |
| 2005/0229370 A1 | 10/2005 | Kobayashi |
| 2006/0199382 A1 | 9/2006 | Sugiyama et al. |
| 2007/0045621 A1 | 3/2007 | Suzuki et al. |
| 2007/0262403 A1 | 11/2007 | Tsurume |
| 2008/0011420 A1 | 1/2008 | Yoshizawa et al. |
| 2008/0042168 A1 | 2/2008 | Watanabe et al. |
| 2008/0044940 A1 | 2/2008 | Watanabe et al. |
| 2008/0113486 A1 | 5/2008 | Eguchi et al. |
| 2008/0132033 A1* | 6/2008 | Eguchi et al. ................ 438/460 |
| 2008/0182385 A1* | 7/2008 | Kamine ................... H01L 24/97 438/458 |
| 2008/0259575 A1 | 10/2008 | Tanimura et al. |
| 2009/0023251 A1 | 1/2009 | Eguchi et al. |
| 2010/0096090 A1 | 4/2010 | Yoshioka et al. |
| 2010/0124795 A1 | 5/2010 | Eguchi et al. |
| 2012/0045861 A1 | 2/2012 | Eguchi et al. |
| 2015/0069358 A1 | 3/2015 | Chida et al. |

FOREIGN PATENT DOCUMENTS

| | | |
|---|---|---|
| EP | 0 858 110 B1 | 12/2006 |
| JP | 10-125931 A | 5/1998 |
| JP | 2003-174153 A | 6/2003 |
| JP | 2006-279031 A | 10/2006 |
| JP | 2008-109123 A | 5/2008 |
| JP | 2010-153804 A | 7/2010 |
| KR | 2008-0029887 A | 4/2008 |
| KR | 2010-0056983 A | 5/2010 |
| TW | 201036056 A | 10/2010 |
| TW | I413152 B | 10/2013 |

OTHER PUBLICATIONS

Written Opinion re Application No. PCT/JP2014/070418, dated Nov. 11, 2014.

* cited by examiner

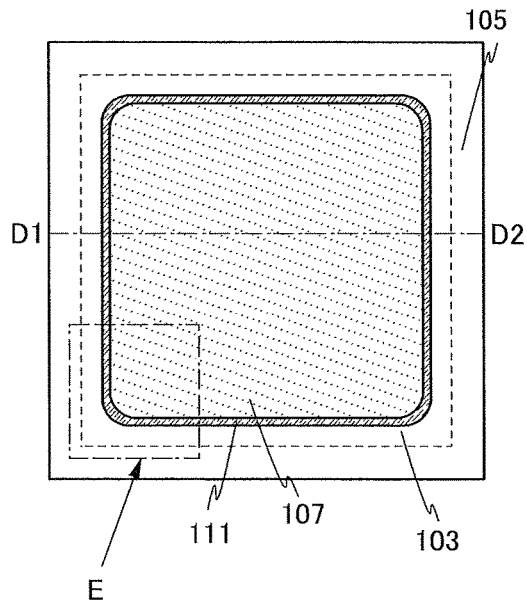
FIG. 3A
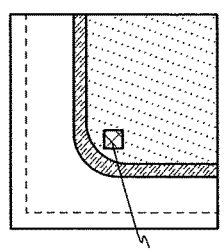
FIG. 3B1
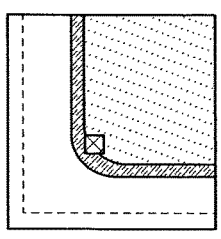
FIG. 3B2
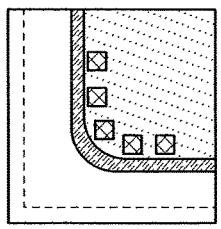
FIG. 3B3
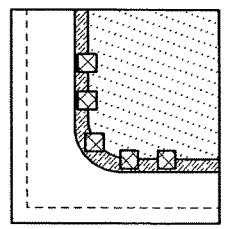
FIG. 3B4
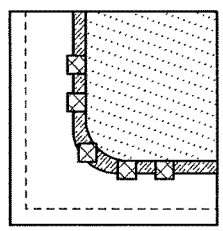
FIG. 3B5
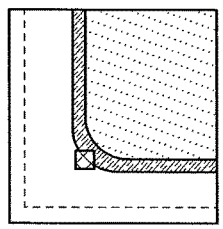
FIG. 3B6
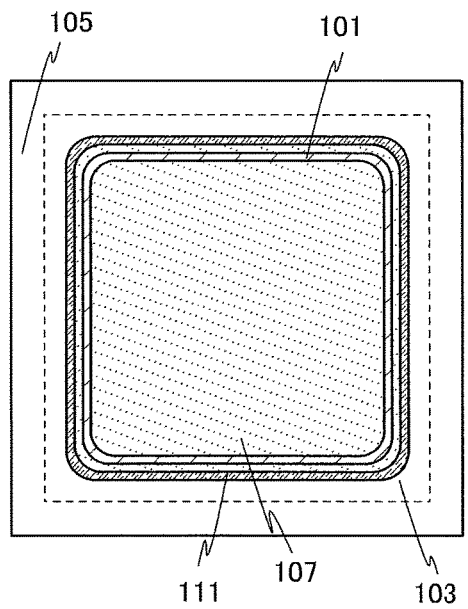
FIG. 3C
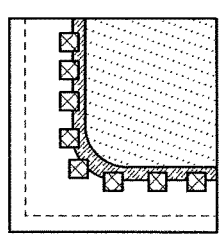
FIG. 3B7
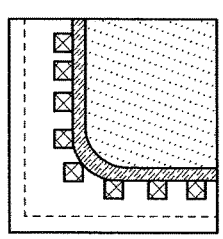
FIG. 3B8

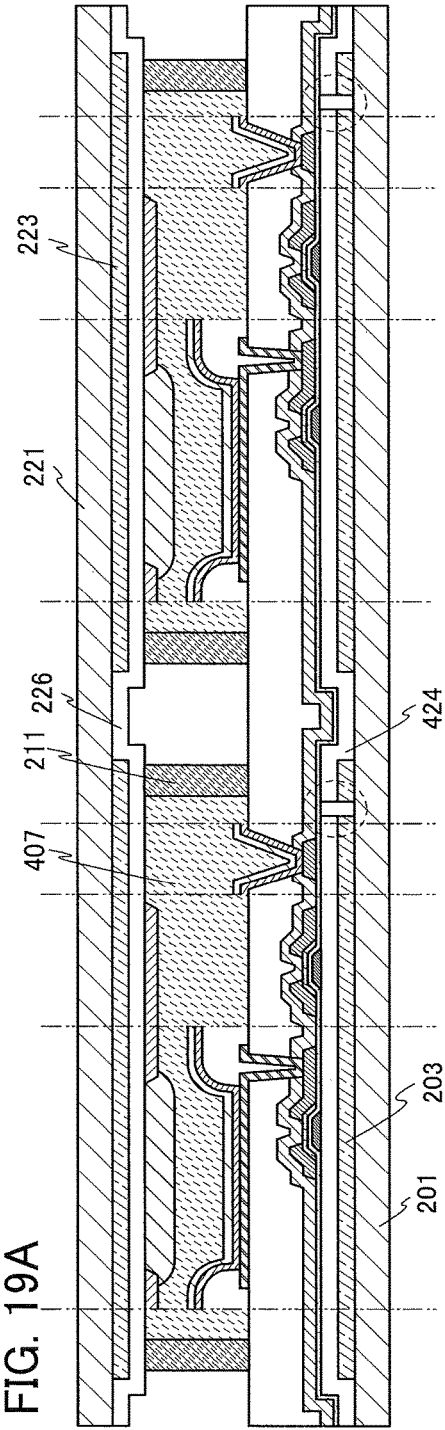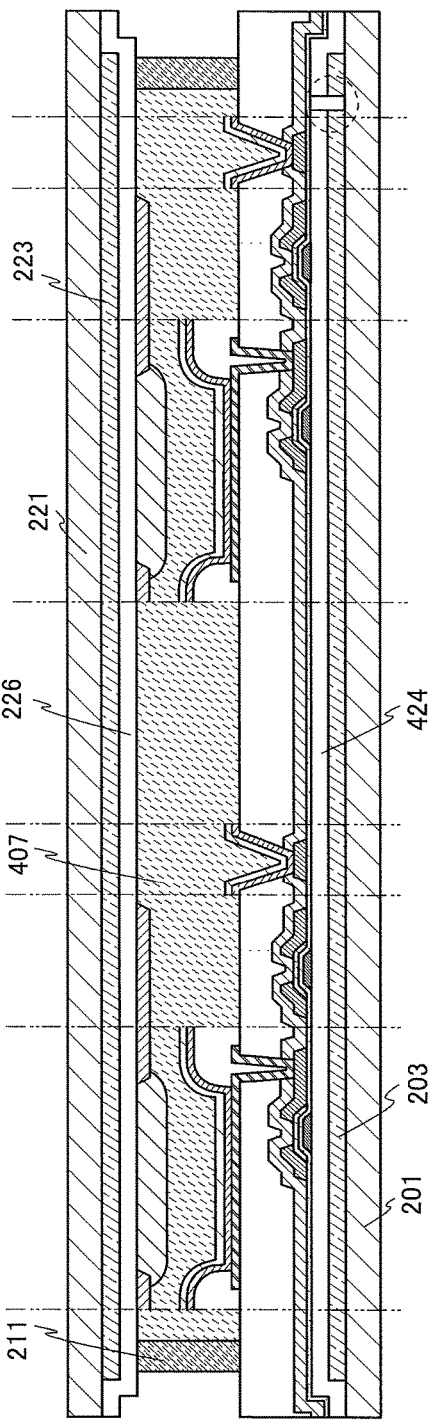
FIG. 19A
FIG. 19B

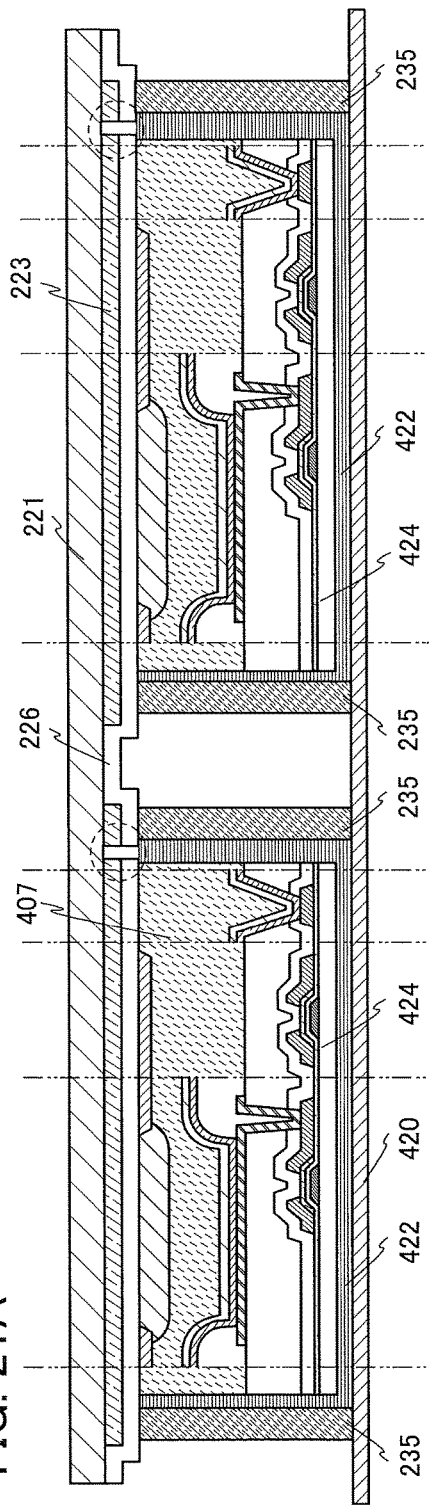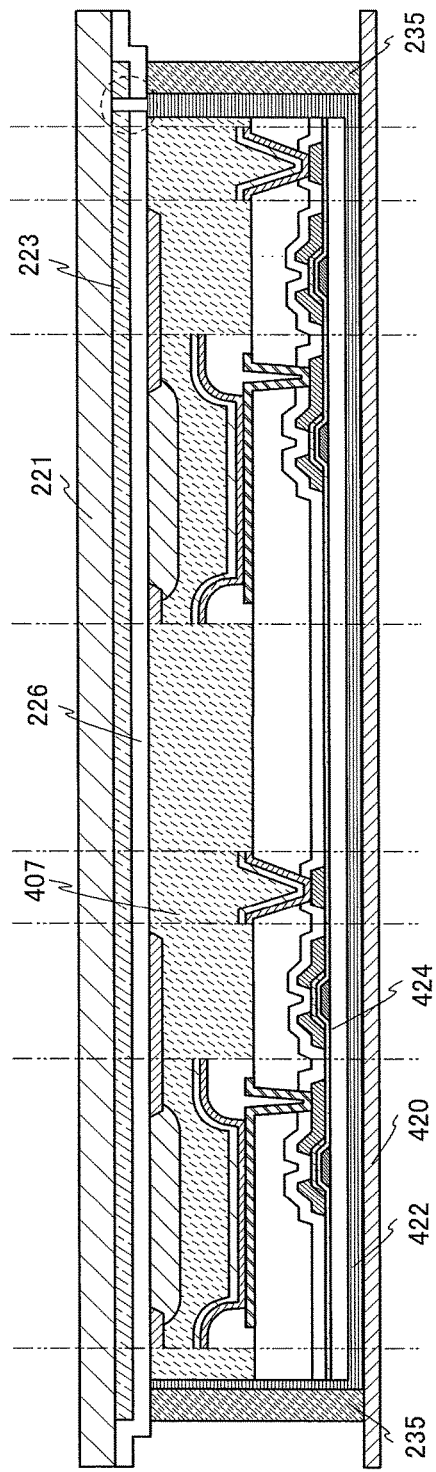
FIG. 21A
FIG. 21B

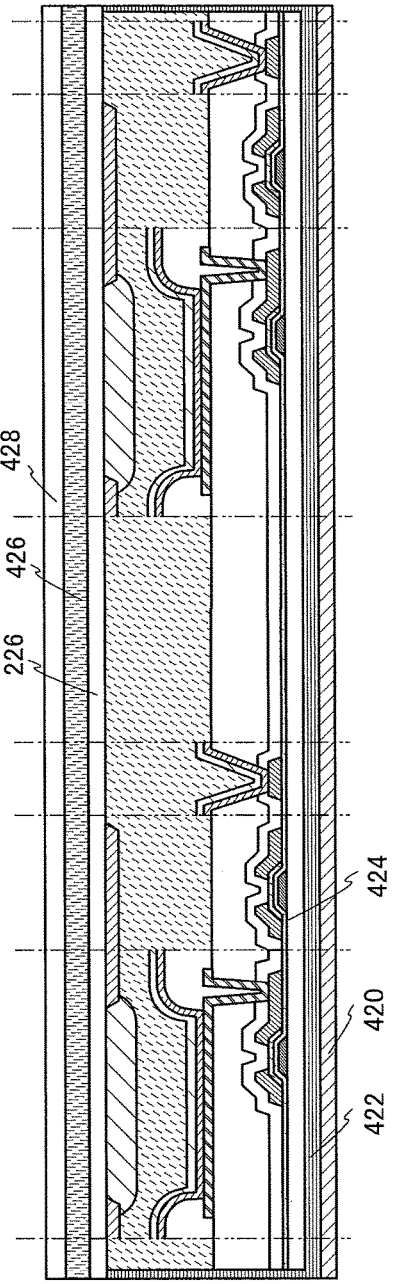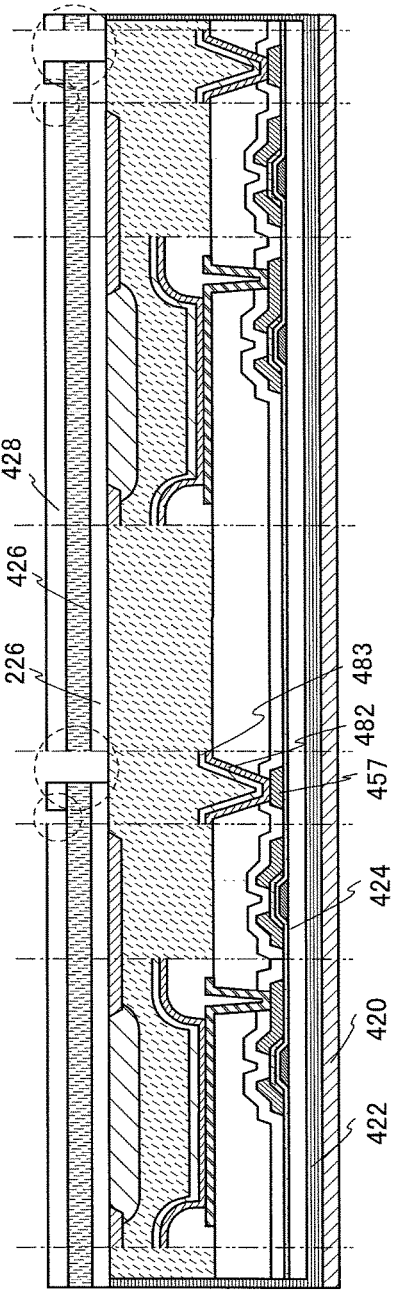

150 μm

150 μm

PEELING METHOD

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a light-emitting device, a display device, an electronic device, a lighting device, or a manufacturing method thereof. In particular, one embodiment of the present invention relates to a light-emitting device using an organic electroluminescence (hereinafter also referred to as EL) phenomenon, and a method for manufacturing the light-emitting device. In particular, one embodiment of the present invention relates to a peeling method and a method for manufacturing a device including a peeling process. Moreover, one embodiment of the present invention relates to a laser irradiation system that can be used for the method for manufacturing the device.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for manufacturing a device including a flexible substrate, a technique has been developed in which a functional element such as a thin film transistor or an organic EL element is formed over a formation substrate (e.g., a glass substrate or a quartz substrate), and then the functional element is transferred to a flexible substrate. This technique needs a step of peeling a layer including the functional element from the formation substrate (also referred to as a peeling step).

For example, Patent Document 1 discloses the following peeling technique using laser ablation: a separation layer formed of amorphous silicon or the like is formed over a substrate, a layer to be peeled which is formed of a thin film element is formed over the separation layer, and the layer to be peeled is bonded to a transfer body with the use of a bonding layer. The separation layer is ablated by laser light irradiation, so that peeling is generated in the separation layer.

In addition, Patent Document 2 discloses a technique in which peeling is conducted by physical force such as human hands. In addition, Patent Document 2 discloses the following peeling technique: a metal layer is formed between a substrate and an oxide layer and peeling is generated at an interface between the oxide layer and the metal layer by utilizing weak bonding at the interface between the oxide layer and the metal layer, so that a layer to be peeled and the substrate are separated from each other.

REFERENCE

Patent Document

[Patent Document 1] Japanese Published Patent Application No. H10-125931

[Patent Document 2] Japanese Published Patent Application No. 2003-174153

SUMMARY OF THE INVENTION

When a peeling interface deteriorates in peelability in a peeling step, high stress is applied to the functional element, breaking the functional element in some cases.

One object of one embodiment of the present invention is to improve yield in a peeling process.

It is another object of one embodiment of the present invention to improve yield in a manufacturing process of a device such as a semiconductor device, a light-emitting device, a display device, an electronic device, or a lighting device. In particular, another object of one embodiment of the present invention is to improve yield in a manufacturing process of a semiconductor device, a light-emitting device, a display device, an electronic device, or a lighting device which is lightweight, thin, or flexible.

Another object of one embodiment of the present invention is to reduce the amount of dust generated in a manufacturing process of the device. Another object of one embodiment of the present invention is to suppress entry of impurities in a manufacturing process of the device. Another object of one embodiment of the present invention is to improve alignment accuracy at the time of attachment of substrates in a manufacturing process of the device. Another object of one embodiment of the present invention is to provide a highly reliable light-emitting device. Another object of one embodiment of the present invention is to provide a novel peeling method or a novel method for manufacturing the device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a peeling method including a first step of forming a peeling layer over a first substrate, a second step of forming a layer to be peeled including a first layer in contact with the peeling layer over the peeling layer, a third step of curing a bonding layer in an overlapping manner with the peeling layer and the layer to be peeled, a fourth step of removing part of the first layer overlapping with the peeling layer and the bonding layer to form a peeling starting point, and a fifth step of separating the peeling layer and the layer to be peeled.

In the above peeling method, the peeling starting point is preferably formed by laser light irradiation.

In the above peeling method, the peeling layer and the bonding layer preferably overlap with each other so that an end portion of the bonding layer is positioned on an inner side than an end portion of the peeling layer.

In the above peeling method, a frame-shaped partition that surrounds the bonding layer is preferably formed in the third step.

In the above peeling method, an end portion of the frame-shaped partition is preferably positioned on an inner side than the end portion of the peeling layer.

In the above peeling method, the frame-shaped partition in an uncured state or a semi-cured state is preferably formed in the third step.

Another embodiment of the present invention is a peeling method including a first step of forming a peeling layer over a first substrate, a second step of forming a layer to be peeled including a first layer in contact with the peeling layer over the peeling layer, a third step of curing a frame-shaped partition and a bonding layer on an inner side than the frame-shaped partition in an overlapping manner with the peeling layer and the layer to be peeled, a fourth step of removing part of the first layer overlapping with the peeling layer and the frame-shaped partition to form a peeling starting point, and a fifth step of separating the peeling layer and the layer to be peeled.

Another embodiment of the present invention is a method for manufacturing a semiconductor device, a light-emitting device, a display device, an electronic device, or a lighting device using each of the above peeling methods.

Note that the light-emitting device in this specification includes, in its category, a display device using a light-emitting element. Furthermore, the category of the light-emitting device in this specification includes a module in which a light-emitting element is provided with a connector such as an anisotropic conductive film or a TCP (tape carrier package); a module having a TCP at the tip of which a printed wiring board is provided; and a module in which an IC (integrated circuit) is directly mounted on a light-emitting element by a COG (chip on glass) method. The light-emitting device also includes the one used in lighting equipment and the like.

According to one embodiment of the present invention, yield in a peeling process can be improved. Moreover, according to one embodiment of the present invention, yield in a manufacturing process of a semiconductor device, a light-emitting device, a display device, an electronic device, or a lighting device can be improved. In particular, yield in a manufacturing process of a semiconductor device, a light-emitting device, a display device, an electronic device, or a lighting device which is lightweight, thin, or flexible can be improved.

BRIEF DESCRIPTION OF THE DRAWINGS

In the accompanying drawings:
FIG. 3A, FIGS. 3B1 to 3B8, and FIG. 3C illustrate a peeling method;
FIGS. 19A and 19B illustrate a method for manufacturing a light-emitting device;
FIGS. 21A and 21B illustrate a method for manufacturing a light-emitting device;
FIGS. 24A and 24B illustrate a method for manufacturing a light-emitting device.

DETAILED DESCRIPTION OF THE INVENTION

Figure 1A:
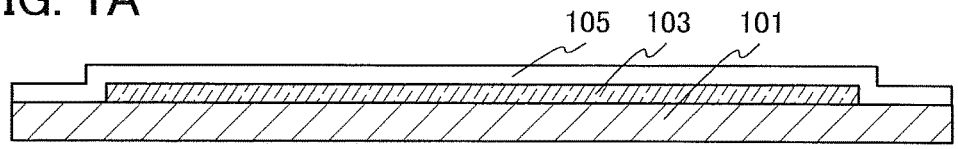
FIGS. 1A to 1E illustrate a peeling method.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

A layer to be peeled can be formed over a formation substrate, peeled off from the formation substrate, and then transferred to another substrate. With this method, for example, a layer to be peeled which is formed over a formation substrate having high heat resistance can be transferred to a substrate having low heat resistance, and the manufacturing temperature of the layer to be peeled is not limited by the substrate having low heat resistance. The layer to be peeled is transferred to a substrate or the like which is more lightweight, thin, or flexible than the formation substrate, whereby a variety of devices such as a semiconductor device, a light-emitting device, or a display device can be made lightweight, thin, and flexible.

A device that can be manufactured according to one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a sealed transistor and a light-emitting device including a sealed light-emitting element (here, a display device including a transistor and a light-emitting element which are sealed is also included) are examples of the device that can be manufactured according to one embodiment of the present invention.

For example, to protect an organic EL element that is likely to deteriorate due to moisture or the like, a protective film having low water permeability can be formed over a glass substrate at a high temperature and transferred to an organic resin substrate having flexibility. Even when heat resistance and a waterproof property of the organic resin substrate are low, a highly reliable flexible light-emitting device can be manufactured by forming an organic EL element over the protective film transferred to the organic resin substrate.

One embodiment of the present invention relates to a method for manufacturing a device in which peeling and transfer are performed in the above manner. In particular, one embodiment of the present invention relates to a peeling method. In Embodiment 1, a peeling method of one embodiment of the present invention will be described. In Embodiment 2, as a structural example of a device that can be manufactured according to one embodiment of the present invention, a flexible light-emitting device including an organic EL element will be described and an example of a method for manufacturing the light-emitting device will be described. In Embodiment 3, electronic devices and lighting devices each including the device that can be manufactured according to one embodiment of the present invention will be described. In Embodiment 4, a laser irradiation system that can be used for the peeling method of one embodiment of the present invention will be described. Lastly, Example of the peeling method of one embodiment of the present invention will be described.

Embodiment 1

In this embodiment, the peeling method of one embodiment of the present invention will be described with reference to FIGS. 1A to 1E, FIGS. 2A to 2C, FIG. 3A, FIGS. 3B1 to 3B8, FIG. 3C, FIGS. 4A to 4D, FIGS. 5A to 5D, FIGS. 6A to 6D, FIGS. 7A to 7D, FIGS. 8A to 8D, FIGS. 9A to 9C, and FIGS. 10A to 10I.

Specifically, one embodiment of the present invention is a peeling method including a first step of forming a peeling layer over a first substrate, a second step of forming a layer to be peeled including a first layer in contact with the peeling layer over the peeling layer, a third step of curing a bonding layer in an overlapping manner with the peeling layer and the layer to be peeled, a fourth step of removing part of the first layer overlapping with the peeling layer and the bonding layer to form a peeling starting point, and a fifth step of separating the peeling layer and the layer to be peeled.

According to one embodiment of the present invention, in a region where the peeling layer, the layer to be peeled, and the bonding layer in the cured state overlap with one another, part of the first layer (a layer which is included in the layer to be peeled and which is in contact with the peeling layer) is removed to form the peeling starting point. Yield of the peeling can be improved by forming the peeling starting point in the above region.

Moreover, according to one embodiment of the present invention, in a region which is in the vicinity of an end portion of the bonding layer in the cured state and in which the peeling layer and the layer to be peeled overlap with each other, part of the first layer may be removed to form a peeling starting point. In such a case where the peeling starting point is formed in a position not overlapping with the bonding layer, it is preferable that the position at which the peeling starting point is formed be in a short distance from the bonding layer, whereby the peeling layer and the layer to be peeled can be separated surely; specifically, it is preferable that the peeling starting point be formed in a distance from the end portion of the bonding layer within 1 mm.

In the above peeling method, the peeling starting point is preferably formed by laser light irradiation. With laser light, the first substrate does not need to be cut to form the peeling starting point and thus generation of dust can be suppressed, which is preferable.

In the above peeling method, the peeling layer and the bonding layer preferably overlap with each other so that an end portion of the bonding layer is positioned on an inner side than an end portion of the peeling layer. When there is a region where the bonding layer does not overlap with the peeling layer, failure of peeling is likely to occur depending on the area of the region and a degree of adhesion between the bonding layer and a layer in contact therewith. Therefore, it is preferable that the bonding layer be not positioned on an outer side than the peeling layer. Note that the end portion of the bonding layer and the end portion of the peeling layer may be aligned with each other.

In the above peeling method, a frame-shaped partition that surrounds the bonding layer is preferably formed in the third step. With the frame-shaped partition surrounding the bonding layer, the bonding layer can be blocked with the partition even when it spreads. Therefore, the frame-shaped partition is preferable because the bonding layer is prevented from being positioned on an outer side than the end portion of the peeling layer.

In the above peeling method, an end portion of the frame-shaped partition is preferably positioned on an inner side than the end portion of the peeling layer. Accordingly, the end portion of the bonding layer can also be positioned on an inner side than the end portion of the peeling layer. Note that the end portion of the partition and the end portion of the peeling layer may be aligned with each other.

In the above peeling method, the frame-shaped partition in an uncured state or a semi-cured state is preferably formed in the third step. When the partition is in a cured state in the case where the peeling starting point is formed in an overlapping manner with the bonding layer, failure of peeling is likely to occur depending on the area of the cured partition and a degree of adhesion between the partition and a layer in contact therewith. With the use of a material having high viscosity for the partition, an effect of suppressing entry of impurities such as moisture in the air into the layer to be peeled can be increased even when the partition is in a semi-cured state or an uncured state.

Another embodiment of the present invention is a peeling method including a first step of forming a peeling layer over a first substrate, a second step of forming a layer to be peeled including a first layer in contact with the peeling layer over the peeling layer, a third step of curing a frame-shaped partition and a bonding layer on an inner side than the frame-shaped partition in an overlapping manner with the peeling layer and the layer to be peeled, a fourth step of removing part of the first layer overlapping with the peeling layer and the frame-shaped partition to form a peeling starting point, and a fifth step of separating the peeling layer and the layer to be peeled.

In the case where the partition is cured, in a region where the peeling layer, the layer to be peeled, and the partition in the cured state overlap with one another, part of the first layer is preferably removed to form the peeling starting point. Yield of the peeling can be improved by forming the peeling starting point in the above region. Furthermore, the layer to be peeled can be sealed by both the bonding layer and the partition; thus, reliability of a device to be manufactured can be increased.

Four examples of the peeling method of one embodiment of the present invention are described below.

<Peeling Method 1>

First, a peeling layer 103 is formed over a formation substrate 101, and a layer 105 to be peeled (hereinafter referred to as a layer 105) is formed over the peeling layer 103 (FIG. 1A). Although an example in which the peeling layer is formed to have an island shape is described here, one embodiment of the present invention is not limited to such an example. Furthermore, the layer 105 may be formed to have an island shape. In this step, the material of the separation layer 103 can be selected such that peeling occurs at the interface between the formation substrate 101 and the peeling layer 103, the interface between the peeling layer 103 and the layer 105, or in the peeling layer 103 when the layer 105 is peeled from the formation substrate 101. Although an example in which peeling occurs at the interface between the layer 105 and the peeling layer 103 is described in this embodiment, one embodiment of the present invention is not limited to such an example depending on a material used for the peeling layer 103 or the layer 105. Note that in the case where the layer 105 has a stacked-layer structure, a layer in contact with the peeling layer 103 is particularly referred to as a first layer.

For example, in the case where the peeling layer 103 has a stacked-layer structure of a tungsten film and a tungsten oxide film, part of the peeling layer 103 (here, part of the tungsten oxide film) may remain on the layer 105 side when peeling occurs at the interface between the tungsten film and the tungsten oxide film (or the vicinity of the interface). Moreover, the peeling layer 103 remaining on the layer 105 side may be removed after peeling.

As the formation substrate 101, a substrate having at least heat resistance high enough to withstand process temperature in a manufacturing process is used. As the formation substrate 101, for example, a glass substrate, a quartz substrate, a sapphire substrate, a semiconductor substrate, a ceramic substrate, a metal substrate, a resin substrate, or a plastic substrate can be used.

Note that it is preferable to use a large-sized glass substrate as the formation substrate 101 in terms of productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

In the case where a glass substrate is used as the formation substrate 101, as a base film, an insulating film such as a silicon oxide film, a silicon oxynitride film, a silicon nitride film, or a silicon nitride oxide film is preferably formed between the formation substrate 101 and the separation layer 103, in which case contamination from the glass substrate can be prevented.

The peeling layer 103 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The peeling layer 103 is preferably formed using a high-melting point metal material such as tungsten, titanium, or molybdenum, in which case the degree of freedom of the process for forming the layer 105 can be increased.

The peeling layer 103 can be formed by, for example, a sputtering method, a plasma CVD method, a coating method (including a spin coating method, a droplet discharging method, a dispensing method, and the like), or a printing method. The thickness of the peeling layer 103 is, for example, greater than or equal to 10 nm and less than or equal to 200 nm, preferably greater than or equal to 20 nm and less than or equal to 100 nm.

In the case where the peeling layer 103 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the peeling layer 103 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the peeling layer 103 is changed by the plasma treatment or heat treatment, whereby adhesion between the peeling layer 103 and the insulating layer formed later can be controlled.

Note that the peeling layer is not necessary in the case where peeling at the interface between the formation substrate and the layer to be peeled is possible. For example, a glass substrate is used as the formation substrate, an organic resin such as polyimide, polyester, polyolefin, polyamide, polycarbonate, or acrylic is formed in contact with the glass substrate, and an insulating film, a transistor, and the like are formed over the organic resin. In this case, locally heating the organic resin by laser light or the like enables peeling at the interface between the formation substrate and the organic resin. Alternatively, peeling at the interface between a metal layer and the organic resin may be performed in the following manner: the metal layer is provided between the formation substrate and the organic resin and current is made to flow in the metal layer so that the metal layer is heated. At this time, the organic resin can be used as a substrate of a device such as a light-emitting device. Alternatively, the organic resin may be attached to another substrate with an adhesive.

There is no particular limitation on a layer formed as the layer 105. In this embodiment, an insulating layer in contact with the peeling layer 103 is formed over the peeling layer 103 as the layer 105. Furthermore, a functional element may be formed over the insulating layer. For specific examples of the layer formed as the layer 105, the description in Embodiment 2 can also be referred to.

The insulating layer over the peeling layer 103 preferably has a single-layer structure or a stacked-layer structure including any of a silicon nitride film, a silicon oxynitride film, a silicon oxide film, a silicon nitride oxide film, and the like.

The insulating layer can be formed by a sputtering method, a plasma CVD method, a coating method, a printing method, or the like. For example, the insulating layer is formed at a temperature higher than or equal to 250° C. and lower than or equal to 400° C. by a plasma CVD method, whereby the insulating layer can be a dense film with very low water permeability. Note that the thickness of the insulating layer is preferably greater than or equal to 10 nm and less than or equal to 3000 nm, further preferably greater than or equal to 200 nm and less than or equal to 1500 nm.

Figure 1B:
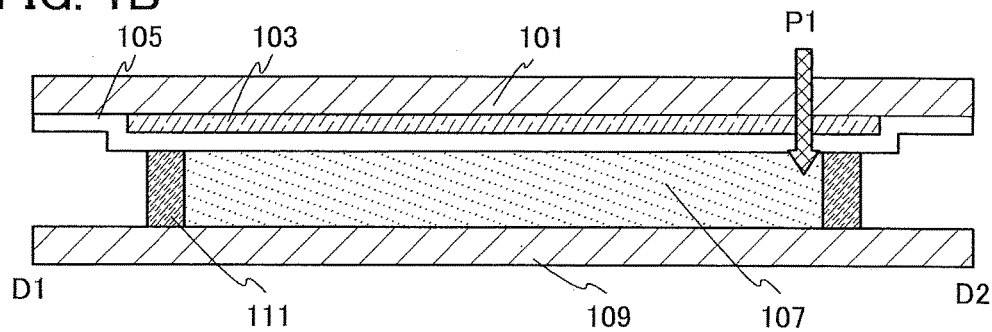

Next, the layer 105 is attached to a substrate 109 with a bonding layer 107, and the bonding layer 107 is cured (FIG. 1B). Here, FIG. 1B corresponds to a cross-sectional view taken along dashed-dotted line D1-D2 in FIG. 3A. Note that FIG. 3A is a plan view viewed from the substrate 109 side (the substrate 109 is not illustrated in the plan view).

Here, the bonding layer 107 is provided so that it overlaps with the peeling layer 103 and the layer 105. As illustrated in FIG. 3A, it is preferable that an end portion of the bonding layer 107 be not positioned on an outer side than an end portion of the peeling layer 103. When there is a region where the bonding layer 107 does not overlap with the peeling layer 103, failure of peeling is likely to occur depending on the area of the region and a degree of adhesion between the bonding layer 107 and a layer in contact therewith. Therefore, it is preferable that the bonding layer 107 be positioned on an inner side than the peeling layer 103 or the end portion of the bonding layer 107 and the end portion of the peeling layer 103 be aligned with each other.

Figure 2A:
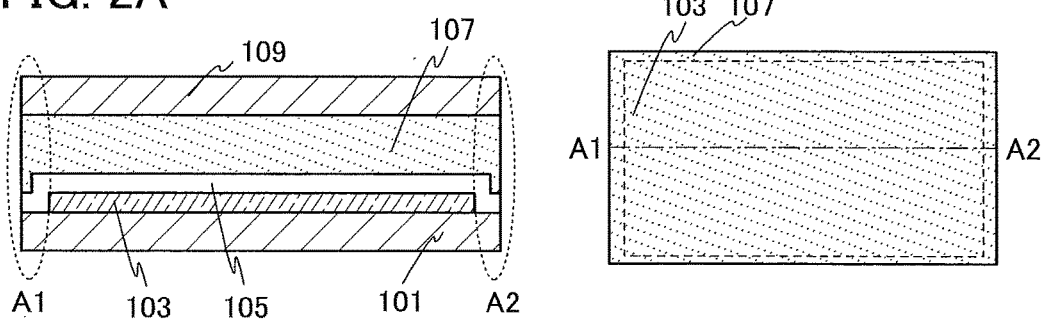
FIGS. 2A to 2C illustrate a peeling method.

FIG. 2A illustrate another structural example. FIG. 2A illustrates a plan view from the substrate 109 side and a cross-sectional view taken along dashed-dotted line A1-A2 in the plan view (the substrate 109 is not illustrated in the plan view). When there is a region in which the formation substrate 101 and the substrate 109 are attached to each other using the bonding layer 107 without overlapping with the peeling layer 103 as in a region surrounded by a dotted line in the cross-sectional view of FIG. 2A, yield of a subsequent peeling process might be decreased depending on a degree of adhesion between the formation substrate 101 and the substrate 109 (or adhesion between a layer over the formation substrate 101 and a layer over the substrate 109, which are in contact with the bonding layer 107).

Therefore, as illustrated in FIG. 1B, it is preferable to provide a frame-shaped partition 111 over the layer 105 or the peeling layer 103 to fill the inside surrounded by the partition 111 with the bonding layer 107. Accordingly, expansion of the bonding layer 107 to the outside of the peeling layer 103 and a further decrease in yield of the peeling process can be suppressed. Thus, the yield of the peeling process can be improved.

In particular, an end portion of the frame-shaped partition 111 is preferably positioned on an inner side than the end portion of the peeling layer 103. Accordingly, the end portion of the bonding layer 107 can also be positioned on an inner side than the end portion of the peeling layer 103. Note that the end portion of the partition 111 and the end portion of the peeling layer 103 may be aligned with each other.

The formation order of the partition 111 and the bonding layer 107 is not limited. For example, the partition 111 may be formed by a coating method or the like after the bonding layer 107 is formed by a screen printing method or the like. Alternatively, after the partition 111 is formed by a coating method or the like, the bonding layer 107 may be formed using a device or the like employing a one drop fill (ODF) method.

Figure 2B:
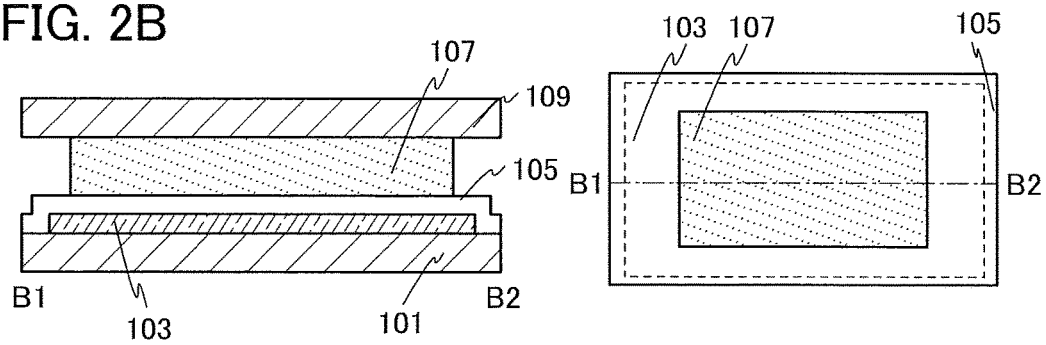

Note that the partition 111 is not necessarily provided. FIG. 2B illustrates a plan view from the substrate 109 side and a cross-sectional view taken along dashed-dotted line B1-B2 in the plan view (the substrate 109 is not illustrated in the plan view). As illustrated in FIG. 2B, the partition 111 is not necessarily provided in the case where the bonding layer 107 does not spread outside the peeling layer 103 because of, for example, low fluidity of the bonding layer 107.

Figure 2C:
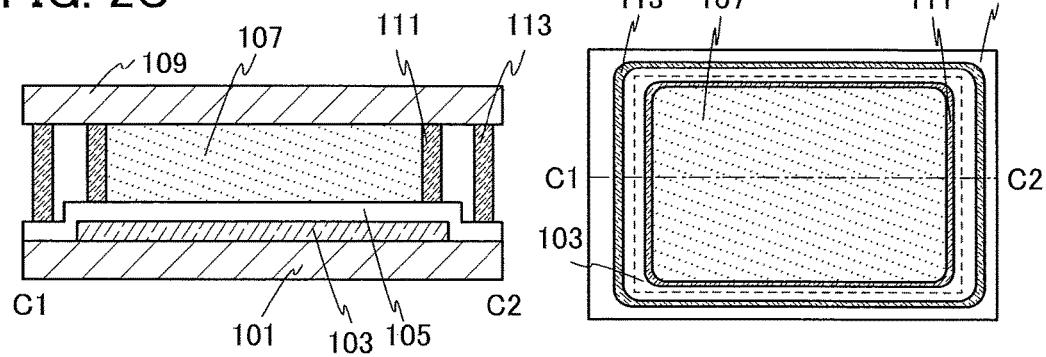

As illustrated in FIG. 2C, a resin layer 113 may be provided outside the partition 111 or the bonding layer 107. FIG. 2C illustrates a plan view from the substrate 109 side and a cross-sectional view taken along dashed-dotted line C1-C2 in the plan view (the substrate 109 is not illustrated in the plan view). With the resin layer 113, entry of impurities such as moisture into the layer 105 can be suppressed even when the layer 105 is exposed to an air atmosphere during the manufacturing process.

Note that the layer 105 and the substrate 109 are preferably attached to each other in a reduced-pressure atmosphere.

Figure 33A:
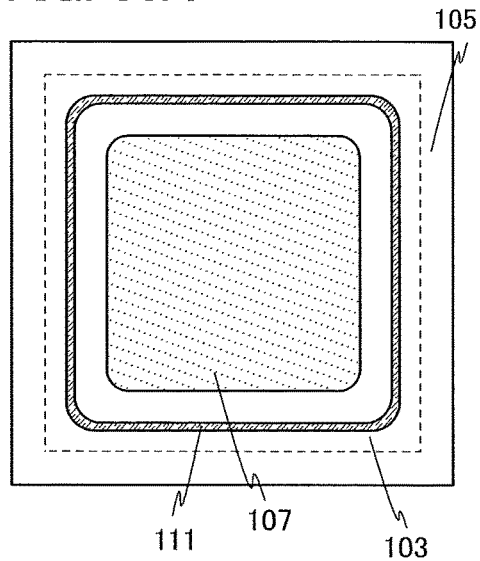
FIGS. 33A to 33D illustrate a peeling method.

Here, as illustrated in FIG. 33A, the bonding layer 107 and the partition 111 which are formed over the layer 105 are not necessarily in contact with each other. At the time of attachment of the layer 105 and the substrate 109, one or both of the bonding layer 107 and the partition 111 are pressed and spread, whereby one or both of the bonding layer 107 and the partition 111 may be changed to the state in FIG. 3A.

Figure 33B:
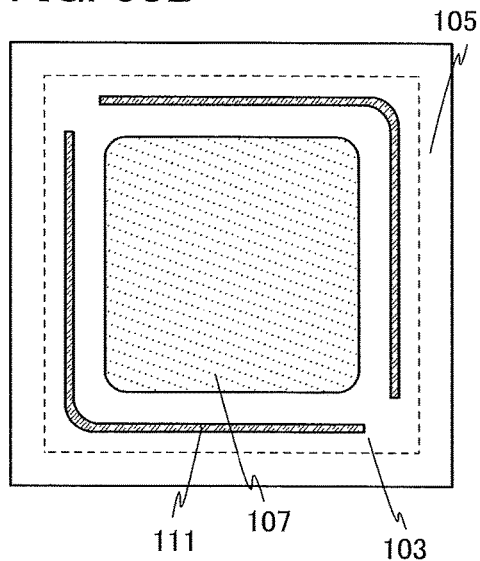
Figure 33C:
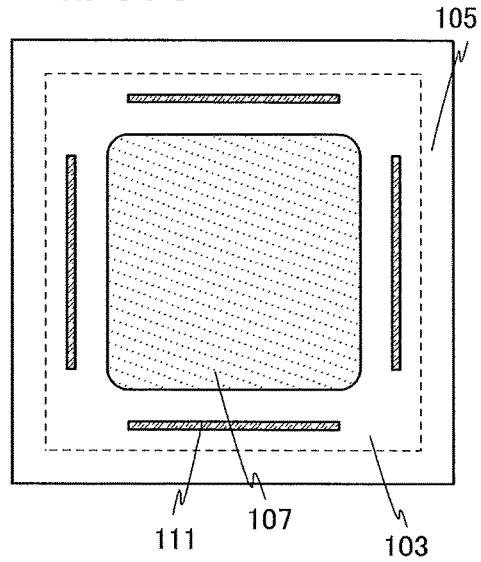
Figure 33D:
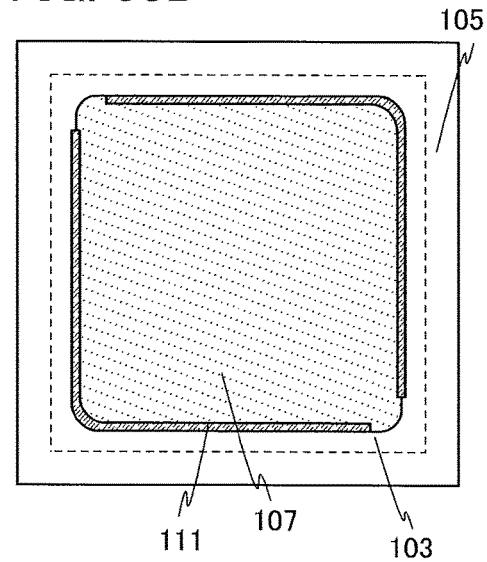

Furthermore, at the time of attachment of the layer 105 and the substrate 109, a bubble remains in some cases between the bonding layer 107 and the partition 111. In a portion that has a bubble, the mechanical strength is low and a crack is likely to occur. Therefore, as illustrated in FIGS. 33B and 33C, bubbles may be made to come out of the partition 111 by providing a portion that does not have the partition 111 in the vicinity of the corner portion of the substrate. Note that the shapes of the bonding layer 107 and the partition 111 after the layer 105 and the substrate 109 are attached to each other are not limited to those in FIG. 3A, and the partition 111 is not necessarily joined as one as illustrated in FIG. 33D.

As the bonding layer 107, various curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. Alternatively, a two-component-mixture-type resin may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the device.

In addition, a filler with a high refractive index or a light scattering member is mixed into the resin, in which case the efficiency of light extraction from the light-emitting element can be improved. For example, titanium oxide, barium oxide, zeolite, or zirconium can be used.

Alternatively, an adhesive with which the substrate 109 and the layer 105 can be chemically or physically separated when necessary, such as an adhesive that is soluble in water or a solvent or an adhesive which is capable of being plasticized upon irradiation of UV light, can be used for the bonding layer 107. For example, a water-soluble resin may be used.

As the substrate 109, various substrates that can be used as the formation substrate 101 can be used. Alternatively, a film-like flexible substrate may be used.

As each of the partition 111 and the resin layer 113, materials that can be used as the bonding layer 107 can be used.

The partition 111 may be in any of a cured state, a semi-cured state, and an uncured state as long as the bonding layer 107 can be prevented from spreading outside of the peeling layer 103. When the partition 111 is in a cured state, it can be used, together with the bonding layer 107, as a layer for sealing the layer 105 after peeling; thus, deterioration of the functional element due to entry of moisture in the air can be suppressed. Note that when the partition 111 is cured, it is preferable that the end portion of the partition 111 be not positioned on an outer side than the end portion of the peeling layer 103 so that a decrease in yield of the peeling process can be prevented.

Moreover, when the resin layer 113 is in a cured state, yield of a subsequent peeling process might be decreased owing to a degree of adhesion between the formation substrate 101 and the substrate 109. Therefore, at least part of the resin layer 113 is preferably in a semi-cured state or an uncured state. With the use of a material having high viscosity for the resin layer 113, an effect of suppressing entry of impurities such as moisture in the air into the layer 105 can be increased even when the resin layer 113 is in a semi-cured state or an uncured state.

For example, part of the resin layer 113 may be cured in such a manner that a light curable resin is used for the resin layer 113 and is partly irradiated with light. Moreover, part of the resin layer 113 is preferably cured, so that a space between the formation substrate 101 and the substrate 109 and positions thereof can be kept constant even in the case where a device under manufacture is moved from a reduced-pressure atmosphere to an atmospheric pressure atmosphere in a subsequent manufacturing process.

Figure 1C:
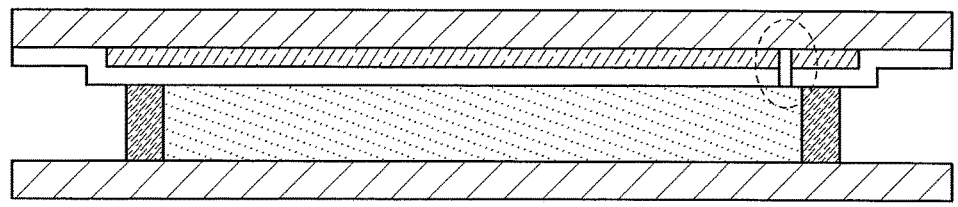

Next, a peeling starting point is formed by laser light irradiation (FIGS. 1B and 1C).

A region where the bonding layer 107 in a cured state or the partition 111 in a cured state, the layer 105, and the peeling layer 103 overlap with one another is irradiated with laser light. In the case where the partition 111 is in a cured state, a region where the partition 111, the layer 105, and the peeling layer 103 overlap with one another is preferably irradiated with laser light.

Here is the case, for example, where the bonding layer 107 is in a cured state and the partition 111 is not in a cured state, and the bonding layer 107 in a cured state is irradiated with laser light (see an arrow P1 in FIG. 1B). Although laser light irradiation may be performed from either substrate side, it is preferable to perform laser light irradiation from the formation substrate 101 side in which the peeling layer 103 is provided so that irradiation of the functional element or the like with scattered light can be suppressed. Note that a material that transmits the laser light is used for the substrate on the side where laser light irradiation is performed.

Part of the first layer can be removed and the peeling starting point can be formed by cracking (causing break or crack) at least the first layer (a layer which is included in the layer 105 and which is in contact with the peeling layer 103) (see a region surrounded by a dashed line in FIG. 1C). At this time, not only the first layer but also the peeling layer 103, the bonding layer 107, or another layer included in the layer 105 may be partly removed. Laser light irradiation enables part of the films to be dissolved, evaporated, or thermally broken.

Enlarged views of a region E surrounded by a dashed-dotted line in FIG. 3A are illustrated in FIGS. 3B1 to 3B8. In each enlarged view, a laser light irradiation region 115 is illustrated as an example.

Examples of the laser light irradiation region 115 in which the bonding layer 107 is in a cured state and the partition 111 is not in a cured state are illustrated in FIGS. 3B1 to 3B5. These are all examples in which a region where the bonding layer 107 in a cured state and the peeling layer 103 overlap with each other is irradiated with laser light. Note that laser light irradiation can be performed at a similar position even in the case where the partition 111 is not provided.

Examples of the laser light irradiation region 115 in which the bonding layer 107 and the partition 111 are in cured states are illustrated in FIGS. 3B6 to 3B8. These are all examples in which a region where the partition 111 in a cured state and the peeling layer 103 overlap with each other is irradiated with laser light.

It is preferable that at a peeling process, force of separating the layer 105 and the peeling layer 103 be concentrated at the peeling starting point; therefore, it is preferable to form the peeling starting point not at the center portion of the bonding layer 107 in a cured state or the partition 111 but in the vicinity of the end portion. It is particularly preferable to form the peeling starting point in the vicinity of the corner portion compared to the vicinity of the side portion among the vicinities of the end portion. For example, as illustrated in FIGS. 3B1 and 3B3, the laser light irradiation region 115 may be positioned only in a region where the bonding layer 107 in a cured state and the peeling layer 103 overlap with each other. Alternatively, as illustrated in FIGS. 3B2, 3B4, and 3B5, the laser light irradiation region 115 may be positioned not only in the region where the bonding layer 107 in a cured state and the peeling layer 103 overlap with each other but also in a region where the partition 111 not in a cured state and the peeling layer 103 overlap with each other. Alternatively, as illustrated in FIGS. 3B6 to 3B8, the laser light irradiation region 115 may be positioned only in a region where the partition 111 in a cured state and the peeling layer 103 overlap with each other. Note that as illustrated in FIGS. 3B5 and 3B8, laser light irradiation in a state in contact with the side of the bonding layer 107 or the side of the partition 111 is also one mode of laser light irradiation of a region where the bonding layer 107 in a cured state or the partition 111 overlaps with the peeling layer 103.

As illustrated in FIGS. 3B3, 3B4, 3B5, 3B7, and 3B8, a peeling starting point is preferably formed in a form of a dashed line by performing laser light irradiation discontinuously in the vicinity of the end portion of the bonding layer 107 or the partition 111 because peeling is easily performed.

A peeling starting point in a form of a solid line or a dashed line may be formed in a frame by performing laser light irradiation continuously or discontinuously in a region where the bonding layer 107 in a cured state and the peeling layer 103 overlap with each other. FIG. 3C illustrates an example in which a peeling starting point in a form of a solid line is formed. Specifically, in FIG. 3C, a frame-shaped portion where the peeling layer 103, the layer 105, and the bonding layer 107 are removed to expose the formation substrate 101 is a peeling starting point.

There is no particular limitation on a laser used to form a peeling starting point. For example, a continuous wave laser or a pulsed oscillation laser can be used. Note that a condition for laser light irradiation such as frequency, power density, energy density, or beam profile is controlled as appropriate in consideration of thicknesses, materials, or the like of the formation substrate 101 and the peeling layer 103.

Figure 1D:
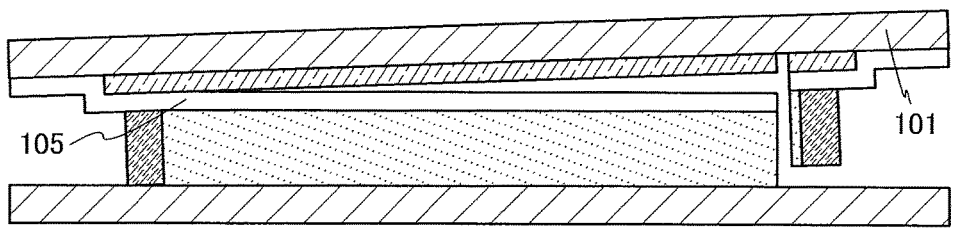
Figure 1E:
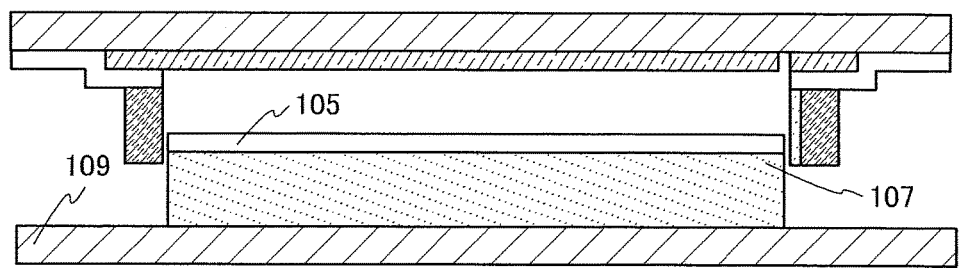

Then, the layer 105 and the formation substrate 101 are separated from each other from the Ruined peeling starting point (FIGS. 1D and 1E). Accordingly, the layer 105 can be transferred from the formation substrate 101 to the substrate 109. At this time, one of the substrates is preferably fixed to a suction stage or the like. For example, the formation substrate 101 may be fixed to the suction stage to peel the layer 105 from the formation substrate 101. Alternatively, the substrate 109 may be fixed to the suction stage to peel the formation substrate 101 from the substrate 109.

For example, the layer 105 and the formation substrate 101 may be separated by mechanical force (a peeling process with a human hand or a gripper, a separation process by rotation of a roller, or the like) by utilizing the peeling starting point.

The formation substrate 101 and the layer 105 may be separated by filling the interface between the peeling layer 103 and the layer 105 with a liquid such as water. A portion between the peeling layer 103 and the layer 105 absorbs a liquid through capillarity action, so that the peeling layer 103 can be separated easily. Furthermore, an adverse effect on the functional element included in the layer 105 due to static electricity caused at peeling (e.g., a phenomenon in which a semiconductor element is damaged by static electricity) can be suppressed.

Note that after the peeling, the bonding layer 107, the partition 111, the resin layer 113, or the like which does not contribute to attachment between the layer 105 and the substrate 109 and which remains over the substrate 109 may be removed. By such removal, an adverse effect on the functional element in a subsequent step (e.g., entry of impurities) can be preferably suppressed. For example, an unnecessary resin can be removed by wiping or cleaning.

In the peeling method of one embodiment of the present invention described above, peeling is performed in such a manner that a peeling starting point is formed by laser light irradiation and then the interface between the peeling layer 103 and the layer 105 is made in a peelable state. Accordingly, the yield of the peeling process can be improved.

<Peeling Method 2>

First, in a manner similar to that of Peeling Method 1, the peeling layer 103 is formed over the formation substrate 101, and the layer 105 is formed over the peeling layer 103 (FIG. 1A). Next, the layer 105 is attached to the substrate 109 with the bonding layer 107, and the bonding layer 107 is cured (FIG. 4A).

Figure 4A:
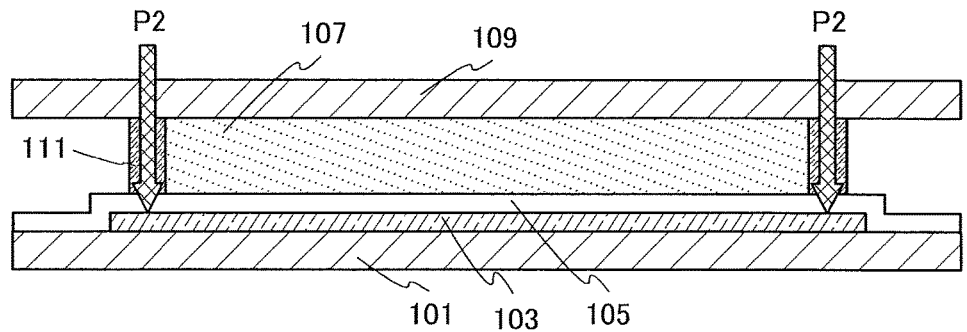
FIGS. 4A to 4D illustrate a peeling method.
Figure 4B:
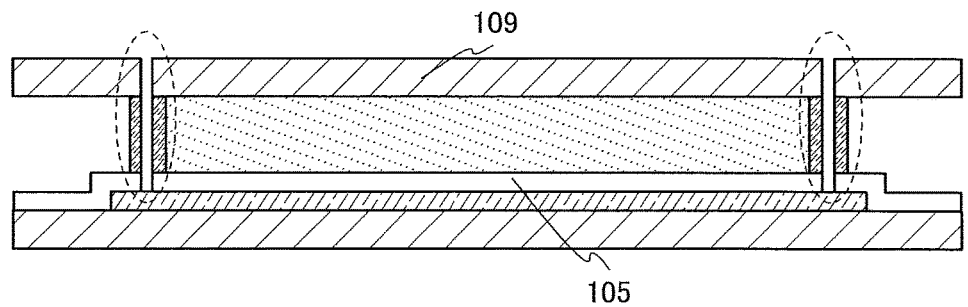

Next, a peeling starting point may be formed by a sharp knife such as a cutter (FIGS. 4A and 4B).

In the case where the substrate 109 on the side where the peeling layer 103 is not provided can be cut by a knife or the like, a cut may be made in the substrate 109, the bonding layer 107 or the partition 111, and the layer 105 (see arrows P2 in FIG. 4A). Accordingly, part of the first layer can be removed; thus, the peeling starting point can be formed (see a region surrounded by a dashed line in FIG. 4B). Here, an example in which the peeling starting point in a form of a solid line by making a cut in a frame shape in a region where the partition 111 in a cured state and the peeling layer 103 overlap with each other; however, one embodiment of the present invention is not limited to such an example. Note that a cut may be made in the peeling layer 103.

Figure 4C:
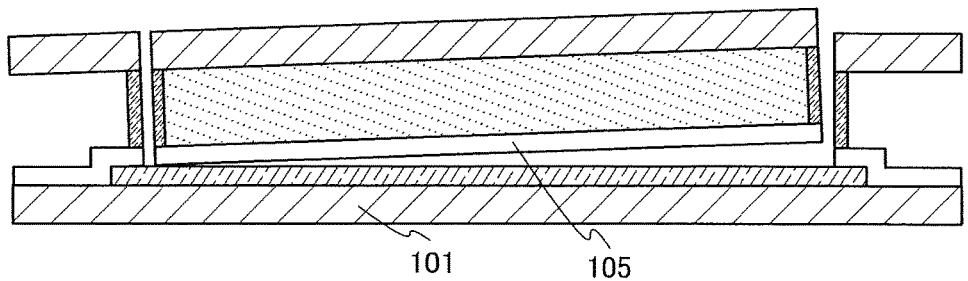
Figure 4D:
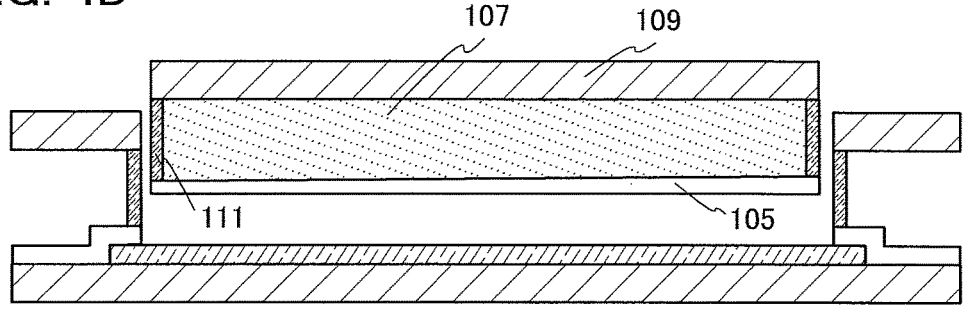

Then, the layer 105 and the formation substrate 101 are separated from each other from the formed peeling starting point (FIGS. 4C and 4D). Accordingly, the layer 105 can be transferred from the formation substrate 101 to the substrate 109.

In the peeling method of one embodiment of the present invention described above, peeling is performed in such a manner that a peeling starting point is formed by a sharp knife or the like and then the interface between the peeling layer 103 and the layer 105 is made in a peelable state. Accordingly, the yield of the peeling process can be improved. Moreover, the layer 105 can be sealed doubly with the bonding layer 107 and the partition 111 by starting the peeling in the region where the partition 111 in a cured state and the peeling layer 103 overlap with each other. Therefore, even when an organic EL element or the like that is likely to deteriorate due to moisture or the like is formed in the layer 105, a highly reliable light-emitting device can be manufactured.

<Peeling Method 3>

Figure 5A:
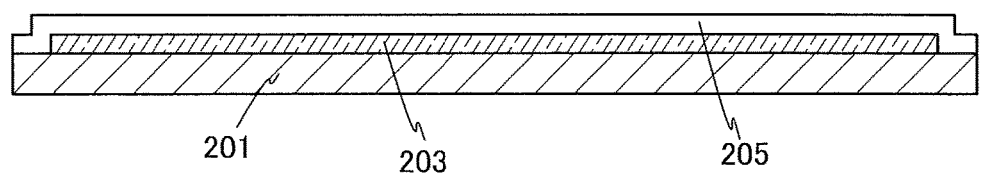
FIGS. 5A to 5D illustrate a peeling method.
Figure 5B:
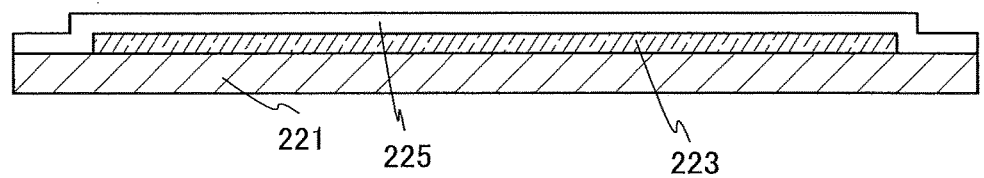

First, a peeling layer 203 is formed over a formation substrate 201, and a layer 205 to be peeled (hereinafter referred to as a layer 205) is formed over the peeling layer 203 (FIG. 5A). In addition, a peeling layer 223 is formed over a formation substrate 221, and a layer 225 to be peeled (hereinafter referred to as a layer 225) is formed over the peeling layer 223 (FIG. 5B).

Figure 5C:
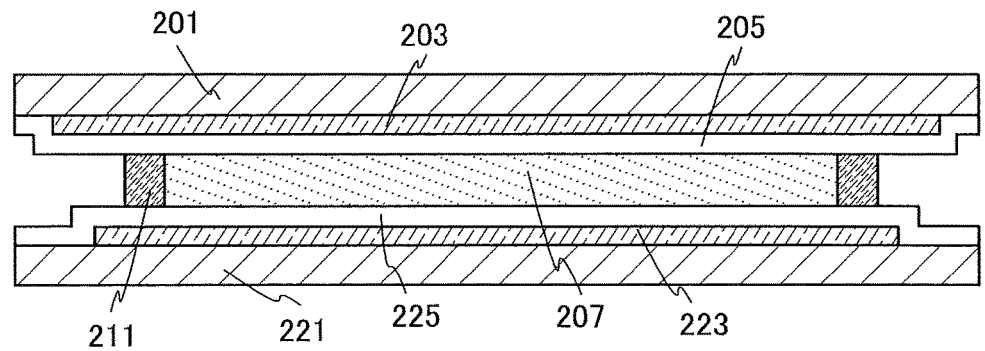

Next, the formation substrate 201 and the formation substrate 221 are attached to each other with the bonding layer 207 so that the surfaces on which the layers to be peeled are formed face each other, and the bonding layer 207 is cured (FIG. 5C). Here, a frame-shaped partition 211 and the bonding layer 207 on the inner side than the partition 211 are provided over the layer 225 and then the formation substrate 201 and the formation substrate 221 face each other to be attached to each other.

Note that the formation substrate 201 and the formation substrate 221 are preferably attached to each other in a reduced-pressure atmosphere.

Figure 34A:
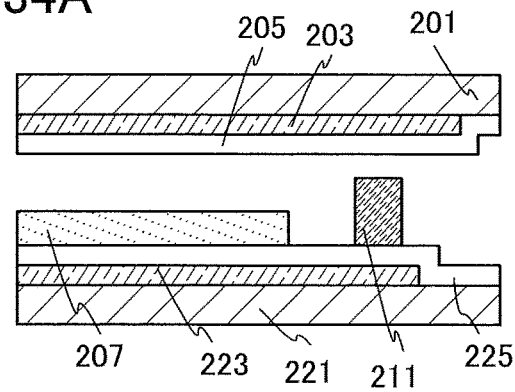
FIGS. 34A to 34D illustrate a peeling method.
Figure 34B:
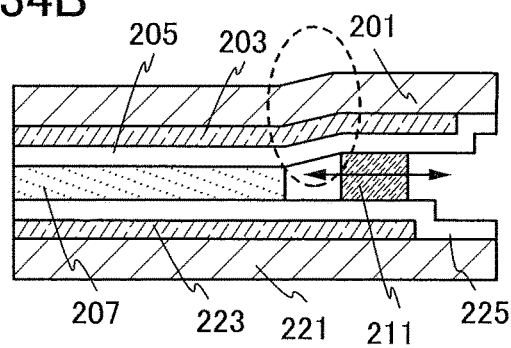

For example, as illustrated in FIG. 34A, the bonding layer 207 and the partition 211 are formed over a layer to be peeled (here, the layer 225), and the formation substrate 201 and the formation substrate 221 are attached to each other in a reduced-pressure atmosphere. Thus, as illustrated in FIG. 34B, the partition 211 is pressed and spreads in a horizontal direction. When expansion in a horizontal direction is small and the bonding layer 207 and the partition 211 are different in thickness (in a vertical direction), a stepped portion might be caused in, for example, a portion surrounded by a dashed line in FIG. 34B.

Figure 34C:
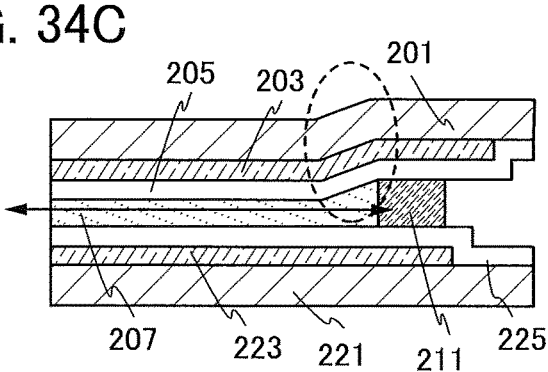

Furthermore, as illustrated in FIG. 34B, when there is a hollow region where the pressure has been reduced between the bonding layer 207 and the partition 211, a device under manufacture in which the substrates attached to each other in a reduced-pressure atmosphere are exposed to an atmospheric pressure, so that either or both the bonding layer 207 and the partition 211 spread to the hollow region. For example, as illustrated in FIG. 34C, when the bonding layer 207 spreads to the hollow region and the thickness of the bonding layer 207 is reduced, a difference in thickness between the bonding layer 207 and the partition 211 is further increased, which might cause a large stepped portion.

Figure 34D:
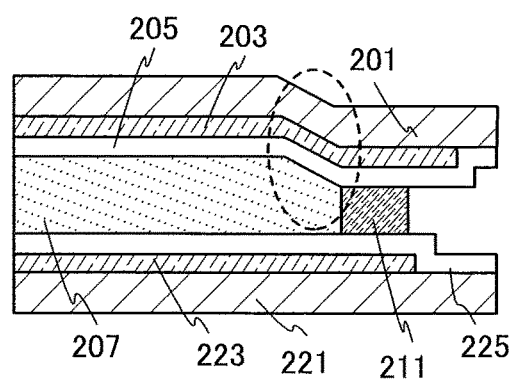

Therefore, a device of one embodiment of the present invention has a feature that a thickness of the vicinity of an end portion differs from a thickness of a center portion on an inner side than the end portion. For example, the thickness of the vicinity of the end portion of the device may be larger as illustrated in FIG. 34C or smaller as illustrated in FIG. 34D than the thickness of the center portion.

In a portion of a device during or after manufacture which has a difference in thickness (a stepped portion), a film of layers included in a layer to be peeled is likely to be peeled, which results in a decrease of the peeling yield and the reliability of the device in some cases. Moreover, when a display region of the device has a difference in thickness, display quality might deteriorate with generation of an interference fringe.

Therefore, in the device of one embodiment of the present invention, it is preferable that a thickness of the vicinity of an end portion of a display portion be substantially equal to the thickness of the center portion on an inner side than the end portion. At this time, the thickness of the vicinity of the end portion of the display portion may be different from the thickness of the vicinity of the end portion of the device on an outer side than the end portion of the display portion. Moreover, in the device of one embodiment of the present invention, it is preferable that a distance from an interference fringe to the end portion of the device be short. For example, the distance may be within 30 mm, 20 mm, or 10 mm. The distance from the interference fringe to the end portion of the device is preferably reduced, so that a region that can be used for the display region of the device can be expanded.

Furthermore, in the device of one embodiment of the present invention, it is preferable that a thickness of the vicinity of an end portion be substantially equal to the thickness of the center portion on an inner side than the end portion (e.g., a thickness of a center portion of the display portion or a thickness of the vicinity of the end portion of the display portion).

Specifically, thicknesses, materials, the application quantities, and the like of the bonding layer 207 and the partition 211 are determined as appropriate, whereby a difference in thickness of the device in the vicinity of an interface between the bonding layer 207 and the partition 211 can be suppressed.

Figure 5D:
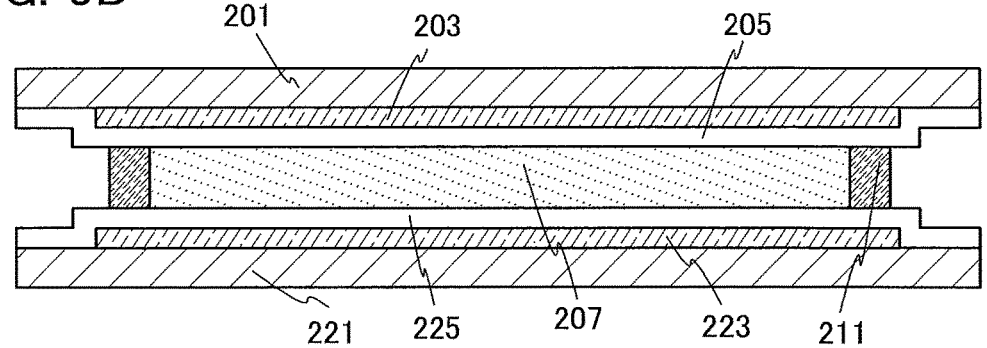

Note that although FIG. 5C illustrates the case where the peeling layer 203 and the peeling layer 223 are different in size, peeling layers of the same size as illustrated in FIG. 5D may be used.

The bonding layer 207 is provided to overlap with the peeling layer 203, the layer 205, the layer 225, and the peeling layer 223. Then, an end portion of the bonding layer 207 is preferably positioned on an inner side than at least an end portion of either the peeling layer 203 or the peeling layer 223 (the peeling layer which is desirably peeled first). Accordingly, strong adhesion between the formation substrate 201 and the formation substrate 221 can be suppressed; thus, a decrease in yield of a subsequent peeling process can be suppressed.

In addition, it is preferable that the end portion of the bonding layer 207 be positioned on an inner side than the end portion of either the peeling layer 203 or the peeling layer 223 and on an outer side than an end portion of the other thereof. For example, in FIG. 9A, the end portion of the bonding layer 207 is positioned on an inner side than the end portion of the peeling layer 203 and on an outer side than the end portion of the peeling layer 223. Furthermore, the partition 211 overlaps with the peeling layer 203 and does not overlap with the peeling layer 223. Accordingly, a photocurable adhesive can be used for the partition 211 because the partition 211 can be irradiated with light even when, for example, both the peeling layer 203 and the peeling layer 223 are light-blocking films. Note that in the case where the bonding layer 207 and/or the partition 211 can be irradiated with light through the peeling layer 203 or the peeling layer 223, a photocurable adhesive can be used for the bonding layer 207 and/or the partition 211 without being limited to the above-described structure.

Figure 6A:
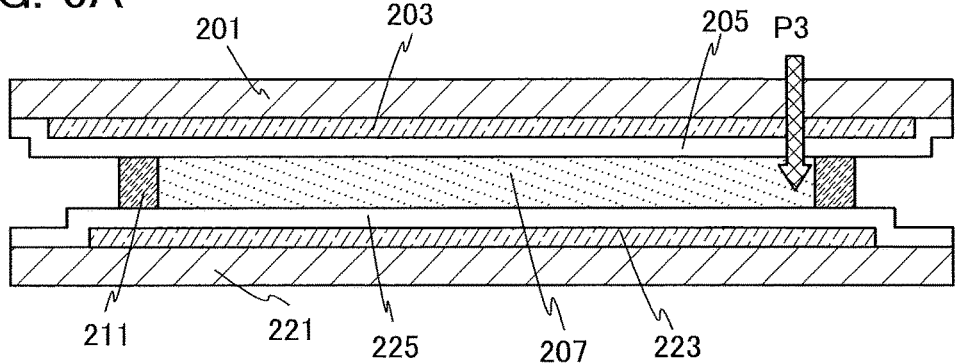
FIGS. 6A to 6D illustrate a peeling method.
Figure 6B:
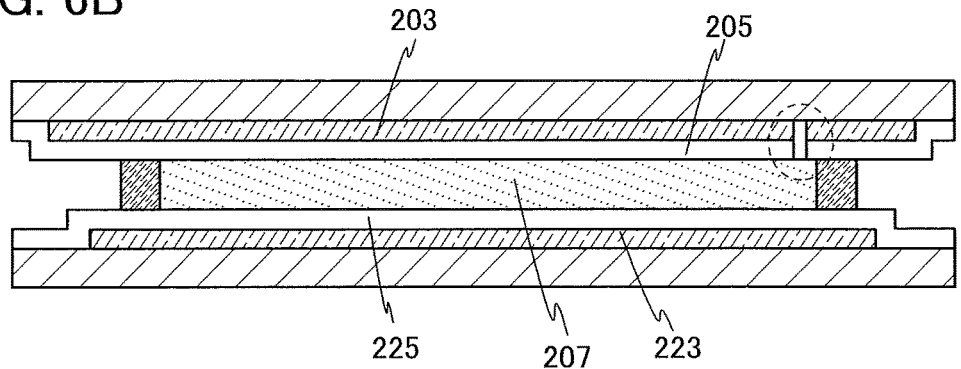

Next, a peeling starting point is formed by laser light irradiation (FIGS. 6A and 6B).

Either the formation substrate 201 or the formation substrate 221 may be peeled first. In the case where the peeling layers differ in size, a substrate over which a larger peeling layer is formed may be peeled first or a substrate over which a smaller peeling layer is formed may be peeled first. In the case where an element such as a semiconductor element, a light-emitting element, or a display element is formed only over one of the substrates, the substrate on the side where the element is formed may be peeled first or the other substrate may be peeled first. Here, an example in which the formation substrate 201 is peeled first is described.

A region where the bonding layer 207 in a cured state or the partition 211 in a cured state, the layer 205, and the peeling layer 203 overlap with one another is irradiated with laser light. Here is the case, for example, where the bonding layer 207 is in a cured state and the partition 211 is not in a cured state, and the bonding layer 207 in a cured state is irradiated with laser light (see an arrow P3 in FIG. 6A).

Part of the first layer is removed; thus, the peeling starting point can be formed (see a region surrounded by a dashed line in FIG. 6B). At this time, not only the first layer but also the peeling layer 203, the bonding layer 207, or another layer included in the layer 205 may be partly removed.

It is preferable that laser light irradiation be performed from the substrate side provided with the peeling layer which is desirably peeled. In the case where a region where the peeling layer 203 and the peeling layer 223 overlap with each other is irradiated with laser light, the formation substrate 201 and the peeling layer 203 can be selectively peeled by cracking only the layer 205 between the layer 205 and the layer 225 (see a region surrounded by a dotted line in FIG. 6B).

When a peeling starting point is formed in both the layer 205 on the peeling layer 203 side and the layer 225 on the peeling layer 223 side in the case where the region where the peeling layer 203 and the peeling layer 223 overlap with each other is irradiated with laser light, it might be difficult to selectively peel one of the formation substrates. Therefore, laser light irradiation conditions might be restricted so that only one of the layers to be peeled is cracked.

Figure 9A:
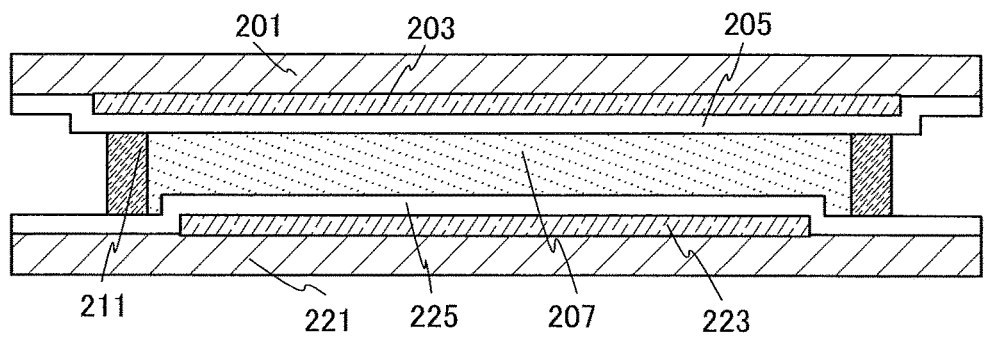
FIGS. 9A to 9C illustrate a peeling method.
Figure 9B:
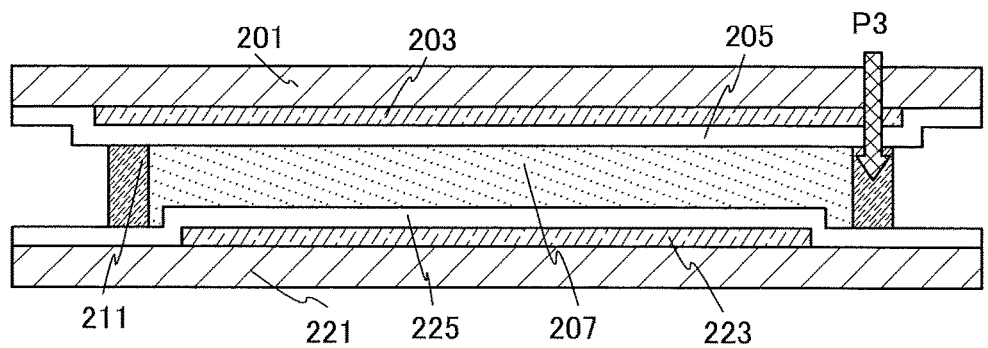
Figure 9C:
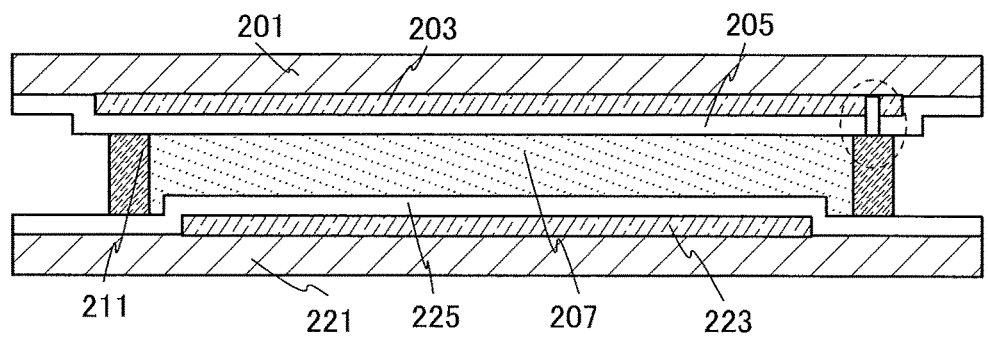

At this time, with a structure illustrated in FIG. 9A, a peeling starting point can be prevented from being formed in both the peeling layer 203 and the peeling layer 223 by irradiating only the peeling layer 203 between the peeling layer 203 and the peeling layer 223 with laser light (FIGS. 9B and 9C). Therefore, there is preferably a small restrict on the laser light irradiation conditions. Although laser light irradiation may be performed from either substrate side at this time, it is preferable to perform laser light irradiation from the formation substrate 201 side in which the peeling layer 203 is provided so that irradiation of the functional element or the like with scattered light can be suppressed.

Figure 6C:
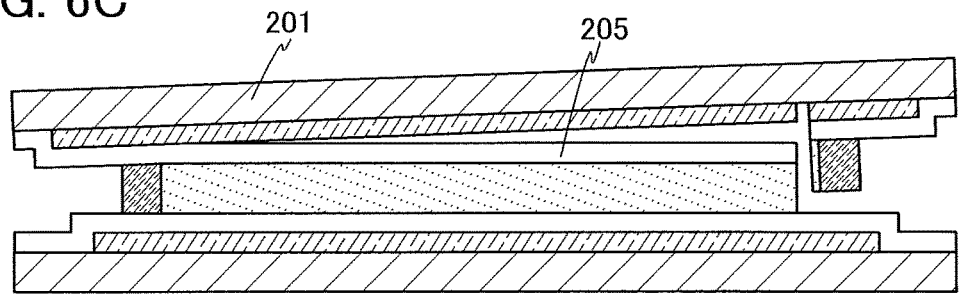
Figure 6D:
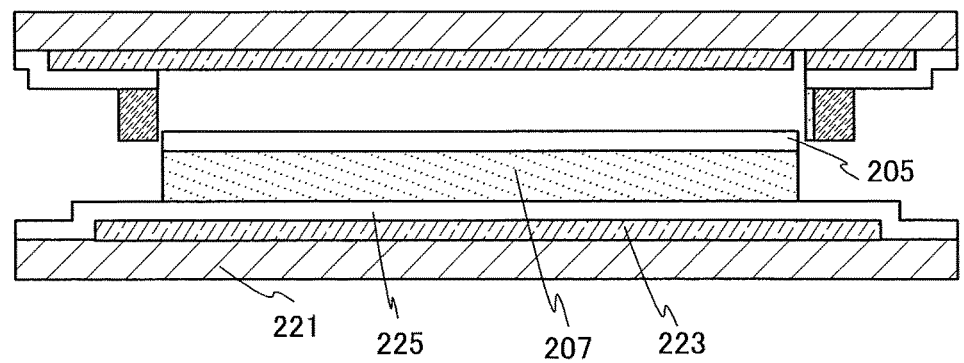

Then, the layer 205 and the formation substrate 201 are separated from each other from the formed peeling starting point (FIGS. 6C and 6D). Accordingly, the layer 205 can be transferred from the formation substrate 201 to the formation substrate 221.

Figure 7A:
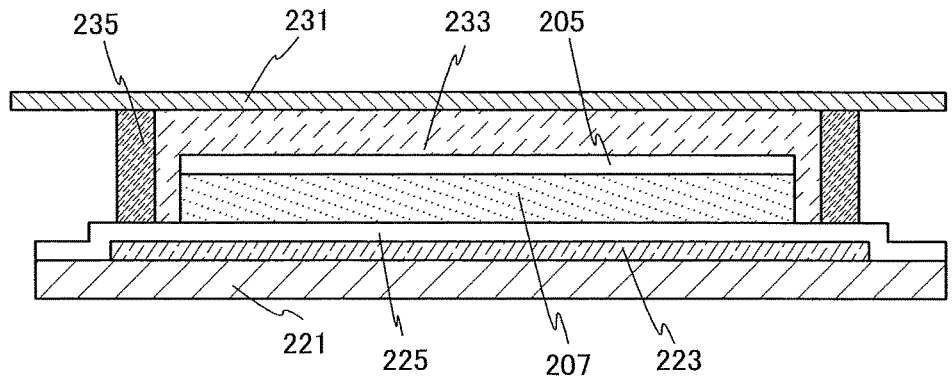
FIGS. 7A to 7D illustrate a peeling method.

Next, the exposed layer 205 is attached to a substrate 231 with a bonding layer 233, and the bonding layer 233 is cured (FIG. 7A). Here, a frame-shaped partition 235 and the bonding layer 233 on the inner side than the partition 235 are provided over the layer 225 and then the layer 225 and the substrate 231 are attached to each other.

Note that the layer 205 and the substrate 231 are preferably attached to each other in a reduced-pressure atmosphere.

Figure 7B:
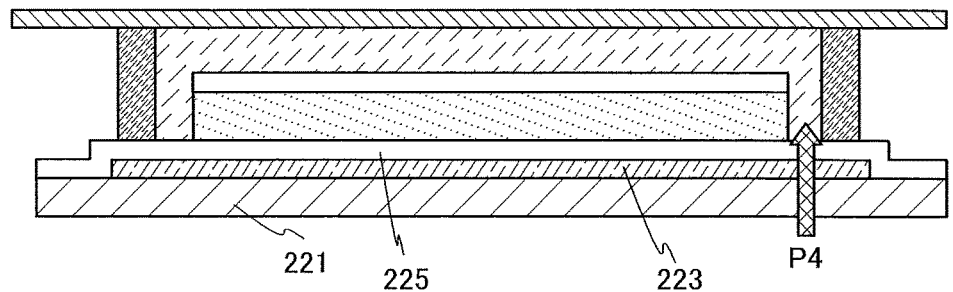
Figure 7C:
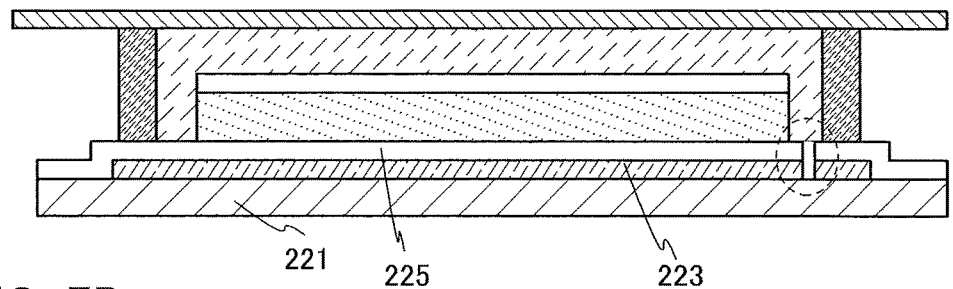

Next, a peeling starting point is formed by laser light irradiation (FIGS. 7B and 7C).

A region where the bonding layer 233 in a cured state or the partition 235 in a cured state, the layer 225, and the peeling layer 223 overlap with one another is irradiated with laser light. Here is the case, for example, where the bonding layer 233 is in a cured state and the partition 235 is not in a cured state, and the bonding layer 233 in a cured state is irradiated with laser light (see an arrow P4 in FIG. 7B). Part of the first layer is removed; thus, the peeling starting point can be formed (see a region surrounded by a dashed line in FIG. 7C). At this time, not only the first layer but also the peeling layer 223, the bonding layer 233, or another layer included in the layer 225 may be partly removed.

It is preferable that laser light irradiation be performed from the formation substrate 221 side in which the peeling layer 223 is provided.

Figure 7D:
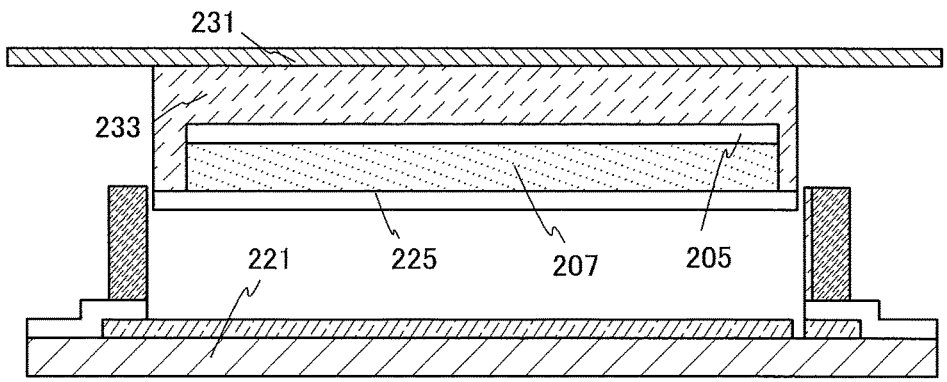

Then, the layer 225 and the formation substrate 221 are separated from each other from the formed peeling starting point (FIG. 7D). Accordingly, the layer 205 and the layer 225 can be transferred to the substrate 231.

In the peeling method of one embodiment of the present invention described above, peeling is performed in such a manner that a peeling starting point is formed by laser light irradiation after a pair of formation substrates each provided with a peeling layer and a layer to be peeled are attached to each other and then the peeling layers and layers to be peeled are made in a peelable state. Accordingly, the yield of the peeling process can be improved.

Peeling is performed after the pair of formation substrates each provided with the layer to be peeled are attached to each other in advance, then the layer to be peeled can be transferred to the substrates of the device which is desirably manufactured. Therefore, formation substrates having low flexibility can be attached to each other when the layers to be peeled are attached to each other, whereby alignment accuracy at the time of attachment can be improved as compared to the case where flexible substrates are attached to each other.

<Peeling Method 4>

In Peeling Method 4, steps up to a first peeling step are performed in a manner similar to that in Peeling Method 3. Steps after a step in FIG. 6D are described below in detail.

Figure 8A:
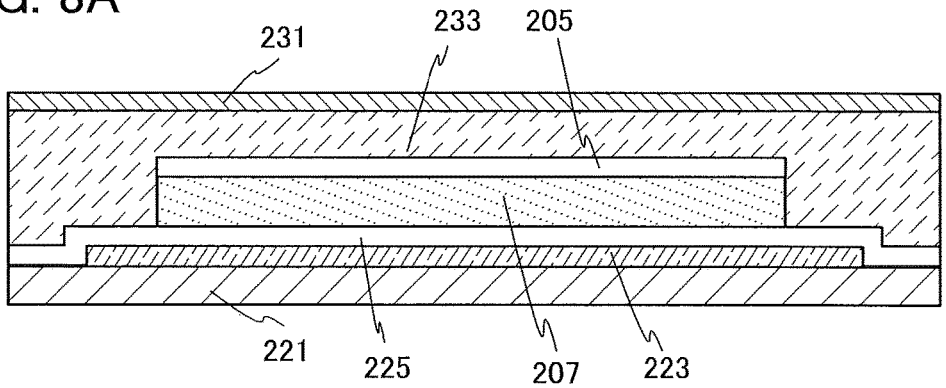
FIGS. 8A to 8D illustrate a peeling method.

The layer 205 which is peeled from the formation substrate 201 in the step in FIG. 6D is attached to the substrate 231 with the bonding layer 233, and the bonding layer 233 is cured (FIG. 8A).

Figure 8B:
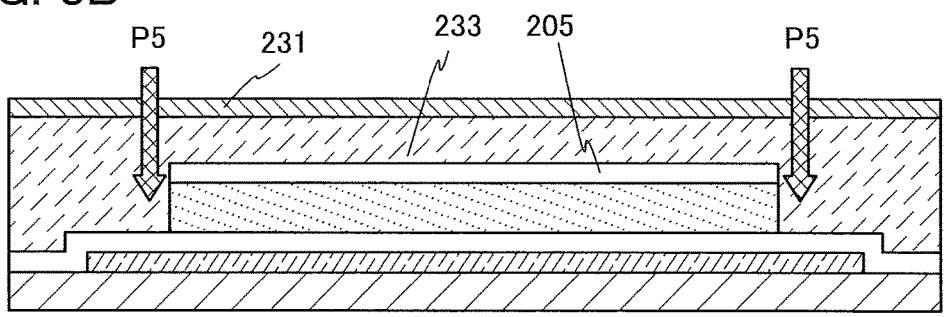
Figure 8C:
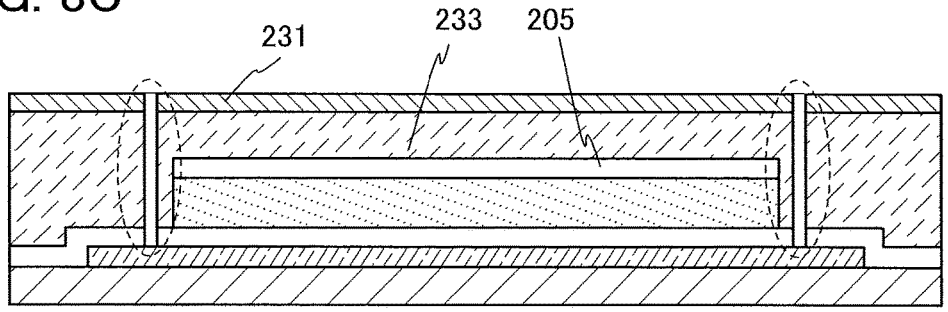

Next, a peeling starting point is formed by a sharp knife such as a cutter (FIGS. 8B and 8C).

In the case where the substrate 231 on the side where the peeling layer 223 is not provided can be cut by a knife or the like, a cut may be made in the substrate 231, the bonding layer 233, and the layer 225 (see arrows P5 in FIG. 8B). Accordingly, part of the first layer can be removed; thus, the peeling starting point can be formed (see a region surrounded by a dashed line in FIG. 8C).

As illustrated in FIGS. 8B and 8C, in the case where there is a region in which the formation substrate 221 and the substrate 231 are attached to each other using the bonding layer 233 without overlapping with the peeling layer 223, yield of a subsequent peeling process might be decreased depending on a degree of adhesion between the formation substrate 221 and the substrate 231. Therefore, it is preferable to make a cut in a frame shape in a region where the bonding layer 233 in a cured state and the peeling layer 223 overlap with each other to form a peeling starting point in a form of a solid line. Accordingly, the yield of the peeling process can be improved.

Figure 8D:
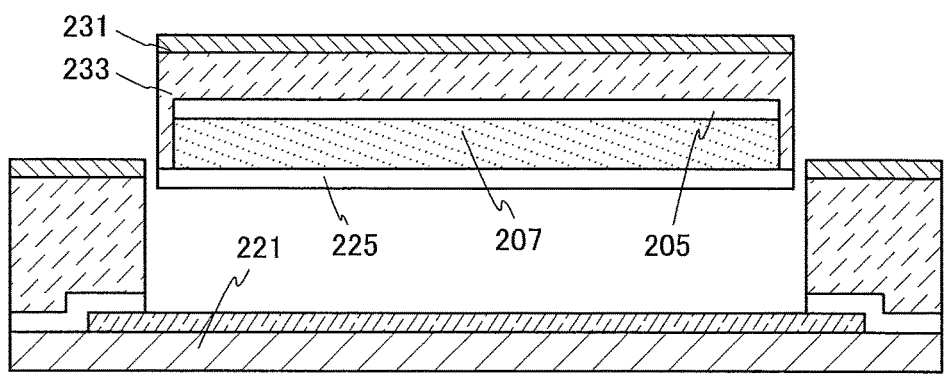

Then, the layer 225 and the formation substrate 221 are separated from each other from the formed peeling starting point (FIG. 8D). Accordingly, the layer 225 can be transferred from the formation substrate 221 to the substrate 231.

In the peeling method of one embodiment of the present invention described above, peeling is performed in such a manner that a peeling starting point is formed by a sharp knife or the like and then the interface between the peeling layer and the layer to be peeled is made in a peelable state. Accordingly, the yield of the peeling process can be improved.

Peeling is performed after the pair of formation substrates each provided with the layer to be peeled are attached to each other in advance, then the layer to be peeled can be transferred to the substrates of the device which is desirably manufactured. Therefore, formation substrates having low flexibility can be attached to each other when the layers to be peeled are attached to each other, whereby alignment accuracy at the time of attachment can be improved as compared to the case where flexible substrates are attached to each other.

<Planar Shapes of Peeling Layer>

The planar shape of the peeling layer used in one embodiment of the present invention is not particularly limited. FIGS. 10A to 10F each illustrate an example of the planar shape of the peeling layer. A peeling starting portion 117 is illustrated in each of FIGS. 10A to 10F. It is preferable that at a peeling process, force of separating the layer to be peeled and the peeling layer be concentrated at the peeling starting point; therefore, it is preferable to form the peeling starting point in the vicinity of the corner portion compared to the center portion or the side portion of the peeling layer.

Note that peeling may be started at a portion other than the peeling starting portion 117 in each of FIGS. 10A to 10F.

Figure 10A:
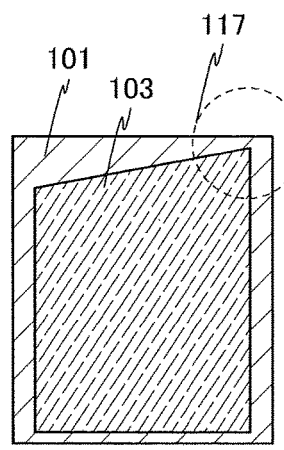
FIGS. 10A to 10I illustrate planar shapes of a peeling layer.
Figure 10B:
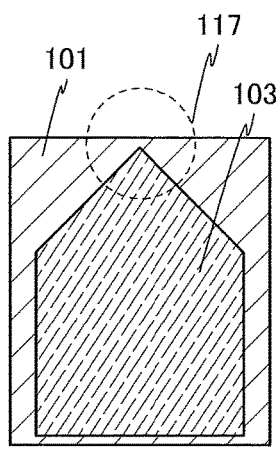
Figure 10C:
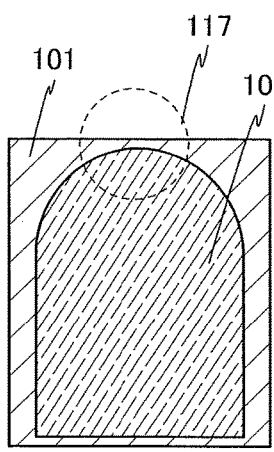
Figure 10D:
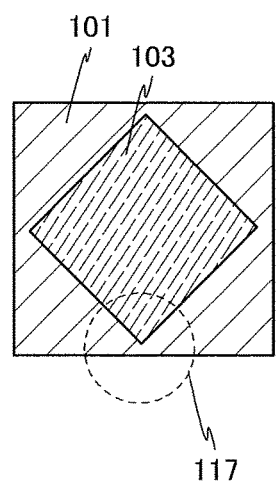
Figure 10E:
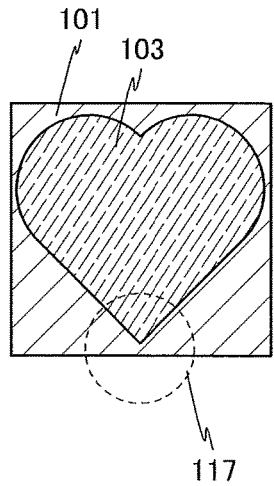
Figure 10F:
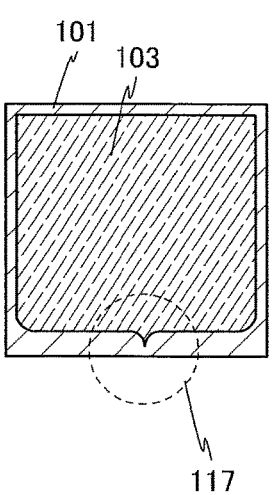

As illustrated in FIG. 10A, the corner portion of the peeling layer 103 may be positioned at the corner portion of the formation substrate 101 in the planar shape in the case where peeling is desirably started from the corner portion of the formation substrate 101. As illustrated in FIGS. 10B, 10D, 10E, and 10F, the corner portion of the peeling layer 103 may be positioned at the side portion of the formation substrate 101 in the planar shape in the case where peeling is desirably started from the side portion of the formation substrate 101. As illustrated in FIG. 10C, the corner portion of the peeling layer 103 may be rounded.

Figure 10G:
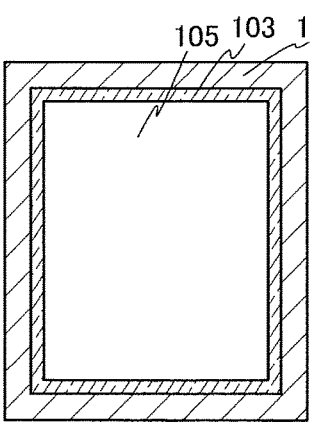
Figure 10H:
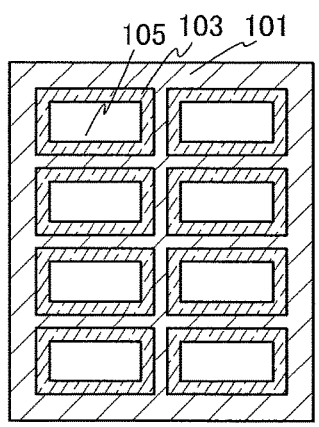
Figure 10I:
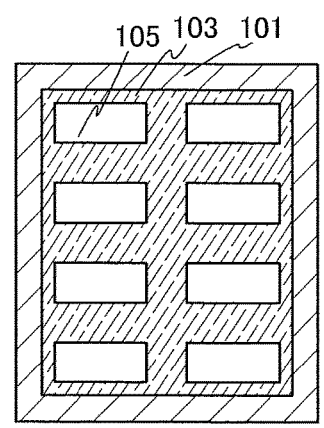

As described above, an end portion of a region that can be peeled and transferred is on an inner side than the end portion of the peeling layer 103. As illustrated in FIG. 10G an end portion of the layer 105 to be peeled is positioned on an inner side than the end portion of the peeling layer 103. In the case where there are a plurality of layers 105 to be peeled, the peeling layer 103 may be provided in each layer 105 as illustrated in FIG. 10H or a plurality of layers 105 may be provided over one peeling layer 103 as illustrated in FIG. 10I.

This embodiment can be combined as appropriate with any of the other embodiments.

Embodiment 2

In this embodiment, a flexible light-emitting device that can be manufactured according to one embodiment of the present invention and a method for manufacturing the light-emitting device will be described with reference to FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A and 19B, FIGS. 20A and 20B, FIGS. 21A and 21B, FIGS. 22A and 22B, FIGS. 23A to 23C, FIGS. 24A and 24B, and FIG. 25.

FIGS. 11A to 11C, FIGS. 12A to 12C, FIGS. 13A to 13C, and FIGS. 14A to 14C illustrate examples of a flexible light-emitting device including an organic EL element as a light-emitting element.

Structural Example 1

Figure 11A:
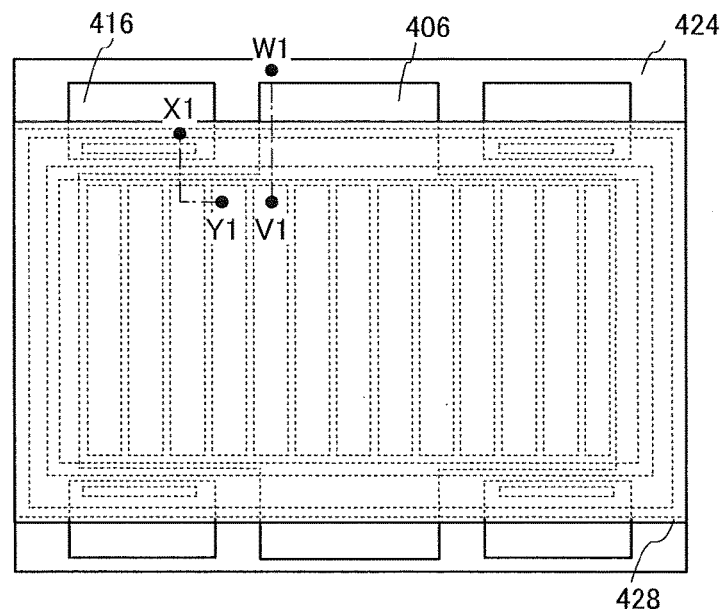
FIGS. 11A to 11C illustrate examples of a light-emitting device.
Figure 11B:
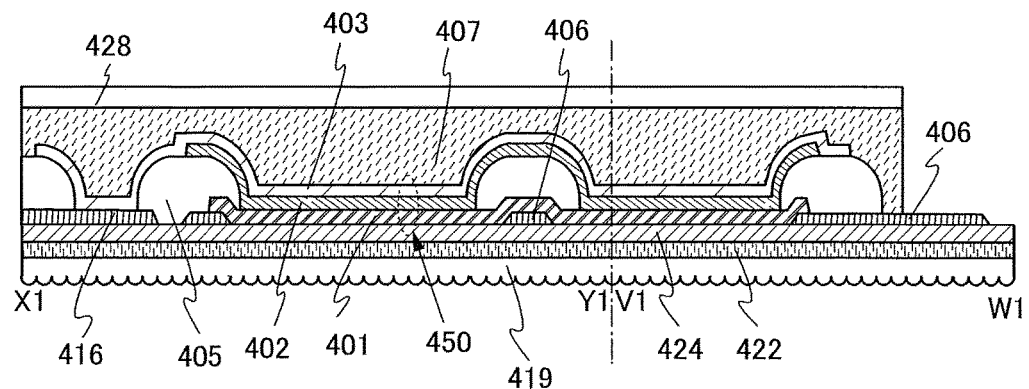

FIG. 11A is a plan view of the light-emitting device, and FIG. 11B is a cross-sectional view taken along dashed-dotted lines X1-Y1 and V1-W1 in FIG. 11A. The light-emitting device illustrated in FIGS. 11A and 11B is a bottom-emission light-emitting device.

The light-emitting device in FIG. 11B includes a flexible substrate 419, a bonding layer 422, an insulating layer 424, a conductive layer 406, a conductive layer 416, an insulating layer 405, an organic EL element 450 (a first electrode 401, an EL layer 402, and a second electrode 403), a bonding layer 407, and a flexible substrate 428. The first electrode 401, the insulating layer 424, the bonding layer 422, and the flexible substrate 419 transmit visible light.

The organic EL element 450 is provided over the flexible substrate 419 with the bonding layer 422 and the insulating layer 424 provided therebetween. The organic EL element 450 is sealed with the flexible substrate 419, the bonding layer 407, and the flexible substrate 428. The organic EL element 450 includes the first electrode 401, the EL layer 402 over the first electrode 401, and the second electrode 403 over the EL layer 402. It is preferable that the second electrode 403 reflect visible light.

The end portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 provided therebetween functions as an auxiliary wiring and is electrically connected to the first electrode 401. It is preferable that the auxiliary wiring be electrically connected to the electrode of the organic EL element, in which case a voltage drop due to electrical resistance of the electrode can be inhibited. Note that the conductive layer 406 may be provided over the first electrode 401. Furthermore, an auxiliary wiring which is electrically connected to the second electrode 403 may be provided, for example, over the insulating layer 405.

Figure 11C:
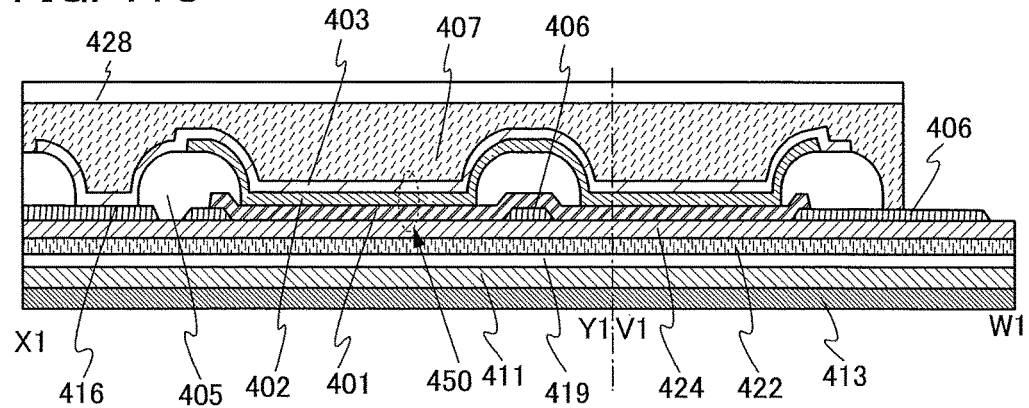

To increase the light extraction efficiency of the light-emitting device, a light extraction structure is preferably provided on a side from which light from the light-emitting element is extracted. FIG. 11B illustrates an example in which the flexible substrate 419 from which the light from the light-emitting element is extracted also serves as the light extraction structure. Note that a touch sensor or the light extraction structure such as a sheet having a function of diffusing light may be provided in an overlapping manner with the flexible substrate 419. Moreover, a polarizing plate or a retardation plate may be provided. FIG. 11C illustrates the case where a diffusion plate 411 and a touch sensor 413 are provided in an overlapping manner with the flexible substrate 419.

Structural Example 2

Figure 12A:
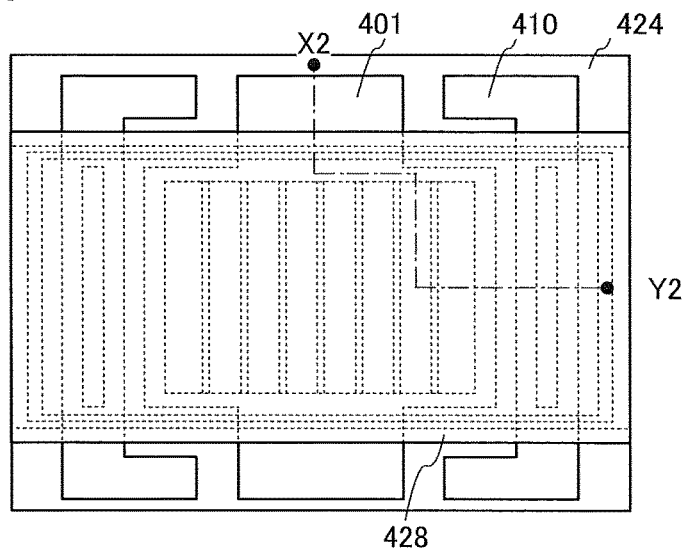
FIGS. 12A to 12C illustrate examples of a light-emitting device.
Figure 12B:
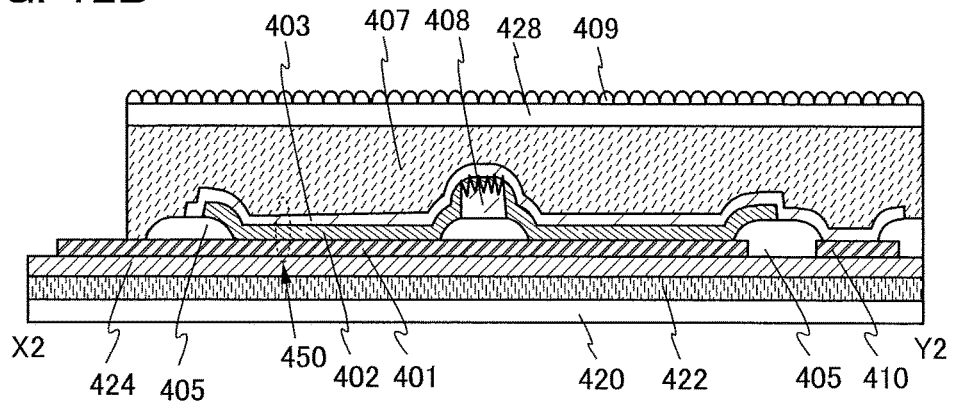

FIG. 12A is a plan view of the light-emitting device, and FIG. 12B is a cross-sectional view taken along dashed-dotted line X2-Y2 in FIG. 12A. The light-emitting device illustrated in FIGS. 12A and 12B is a top-emission light-emitting device.

The light-emitting device in FIG. 12B includes a flexible substrate 420, the bonding layer 422, the insulating layer 424, a conductive layer 408, the insulating layer 405, the organic EL element 450 (the first electrode 401, the EL layer 402, and the second electrode 403), a conductive layer 410, the bonding layer 407, the flexible substrate 428, and a light extraction structure 409. The second electrode 403, the bonding layer 407, the flexible substrate 428, and the light extraction structure 409 transmit visible light.

Figure 12C:
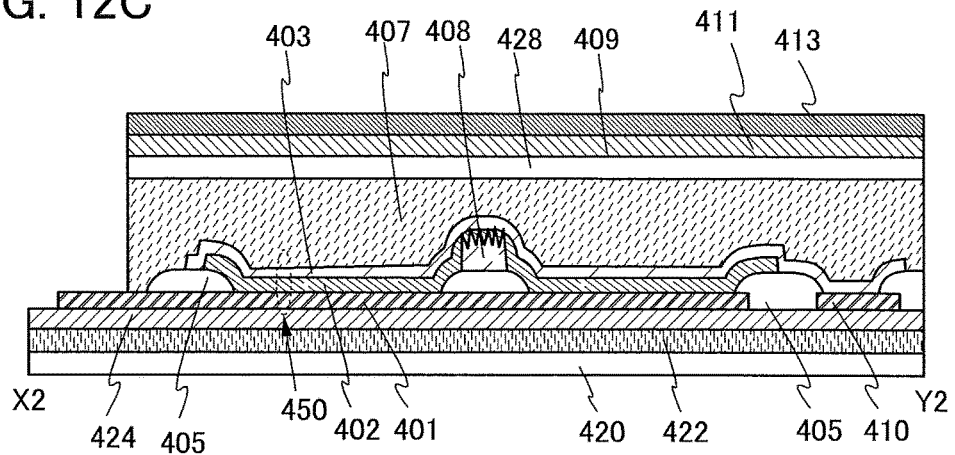

The organic EL element 450 is provided over the flexible substrate 420 with the bonding layer 422 and the insulating layer 424 provided therebetween. The organic EL element 450 is sealed with the flexible substrate 420, the bonding layer 407, and the flexible substrate 428. The organic EL element 450 includes the first electrode 401, the EL layer 402 over the first electrode 401, and the second electrode 403 over the EL layer 402. It is preferable that the first electrode 401 reflect visible light. The light extraction structure 409 is attached to the surface of the flexible substrate 428. Note that a touch sensor or the light extraction structure such as a sheet having a function of diffusing light may be provided in an overlapping manner with the flexible substrate 428. Moreover, a polarizing plate or a retardation plate may be provided. FIG. 12C illustrates the case where the diffusion plate 411 which is one embodiment of the light extraction structure and the touch sensor 413 are provided in an overlapping manner with the flexible substrate 428.

The end portions of the first electrode 401 and the conductive layer 410 are covered with the insulating layer 405. The conductive layer 410 can be formed using the same process and material as those of the first electrode 401 and is electrically connected to the second electrode 403.

The conductive layer 408 over the insulating layer 405 functions as an auxiliary wiring and is electrically connected to the second electrode 403. Note that the conductive layer 408 may be provided over the second electrode 403. Furthermore, in a manner similar to Structural Example 1, an auxiliary wiring which is electrically connected to the first electrode 401 may be provided.

Structural Example 3

Figure 13A:
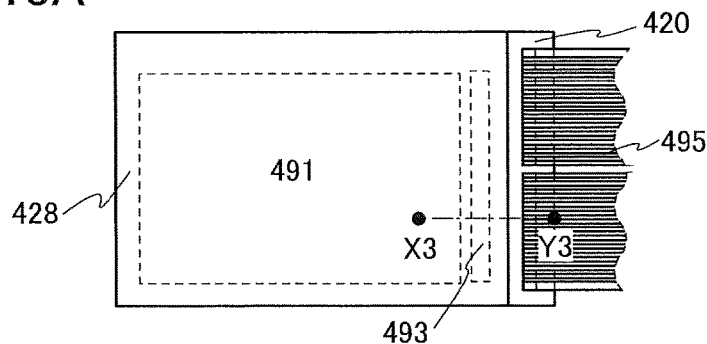
FIGS. 13A to 13C illustrate examples of a light-emitting device.
Figure 13B:
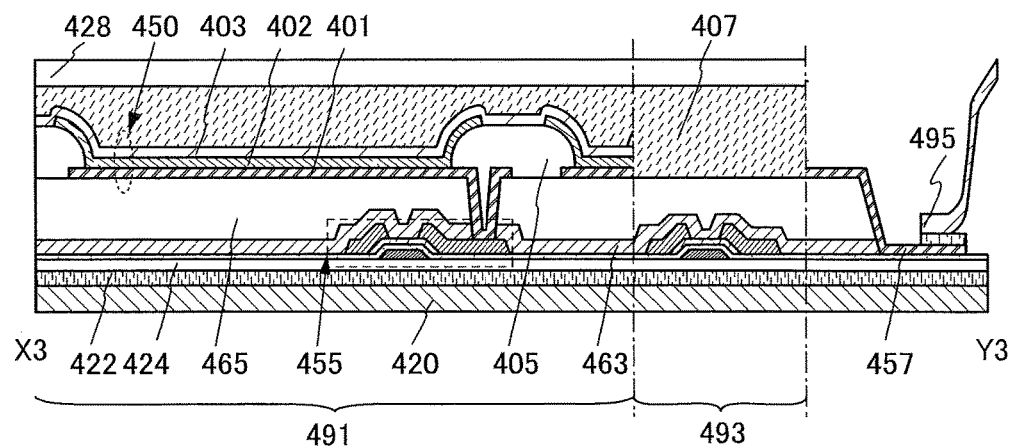

FIG. 13A is a plan view of the light-emitting device, and FIG. 13B is a cross-sectional view taken along dashed-dotted line X3-Y3 in FIG. 13A. The light-emitting device illustrated in FIG. 13B is a top-emission light-emitting device using a separated coloring method.

The light-emitting device illustrated in FIG. 13A includes a light-emitting portion 491, a driver circuit portion 493, and a flexible printed circuit (FPC) 495. An organic EL element and transistors included in the light-emitting portion 491 and the driver circuit portion 493 are sealed with the flexible substrate 420, the flexible substrate 428, and the bonding layer 407.

The light-emitting device in FIG. 13B includes the flexible substrate 420, the bonding layer 422, the insulating layer 424, a transistor 455, an insulating layer 463, an insulating layer 465, the insulating layer 405, the organic EL element 450 (the first electrode 401, the EL layer 402, and the second electrode 403), the bonding layer 407, the flexible substrate 428, and a conductive layer 457. The flexible substrate 428, the bonding layer 407, and the second electrode 403 transmit visible light.

In the light-emitting portion 491 of the light-emitting device in FIG. 13B, the transistor 455 and the organic EL element 450 are provided over the flexible substrate 420 with the bonding layer 422 and the insulating layer 424 provided therebetween. The organic EL element 450 includes the first electrode 401 over the insulating layer 465, the EL layer 402 over the first electrode 401, and the second electrode 403 over the EL layer 402. The first electrode 401 is electrically connected to a source electrode or a drain electrode of the transistor 455. It is preferable that the first electrode 401 reflect visible light. The end portion of the first electrode 401 is covered with the insulating layer 405.

The driver circuit portion 493 includes a plurality of transistors. FIG. 13B illustrates one of the transistors in the driver circuit portion 493.

The conductive layer 457 is electrically connected to an external input terminal through which a signal (e.g., a video signal, a clock signal, a start signal, and a reset signal) or a potential from the outside is transmitted to the driver circuit portion 493. Here, an example in which the FPC 495 is provided as the external input terminal is described.

To prevent an increase in the number of manufacturing steps, the conductive layer 457 is preferably formed using the same material and the same step(s) as those of the electrode or the wiring in the light-emitting portion or the driver circuit portion. Here, an example in which the conductive layer 457 is formed using the same material and the same step(s) as those of the first electrode 403 is described.

The insulating layer 463 has an effect of suppressing diffusion of impurities into a semiconductor included in the transistor. As the insulating layer 465, an insulating film having a planarization function is preferably selected in order to reduce surface unevenness due to the transistor.

Figure 30A:
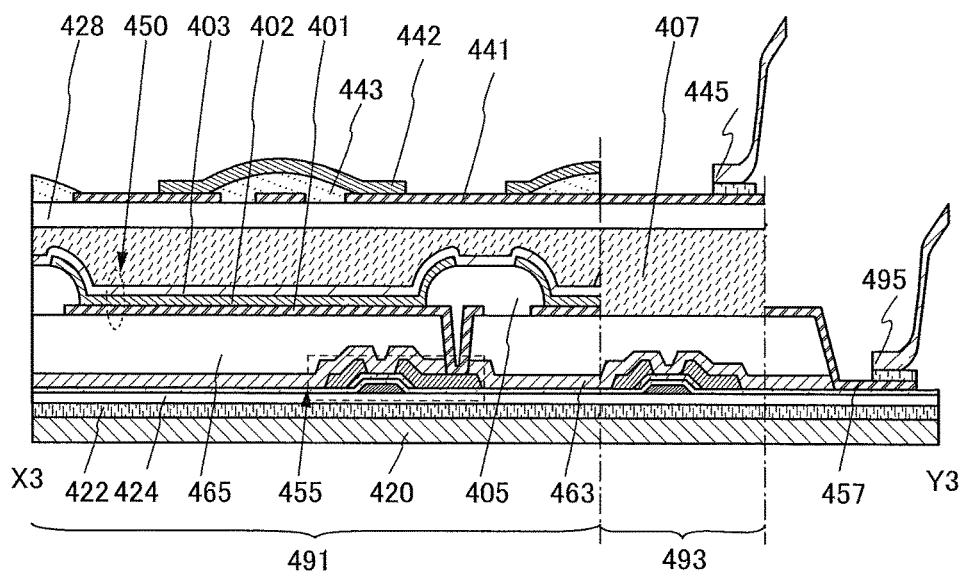
FIGS. 30A and 30B illustrate examples of a light-emitting device.

Note that a touch sensor may be provided over the flexible substrate 428 as illustrated in FIG. 30A. The touch sensor includes a conductive layer 441, a conductive layer 442, and an insulating layer 443. Note that the conductive layer 441 and the conductive layer 442 preferably transmit visible light. Therefore, the conductive layers can be formed using, for example, indium oxide, indium tin oxide (ITO), indium zinc oxide, zinc oxide, or zinc oxide to which gallium is added. Note that at least part of the conductive layer 441 and the conductive layer 442 may be formed using a material that does not transmit visible light. For example, a metal material such as aluminum, gold, platinum, silver, nickel, tungsten, chromium, molybdenum, iron, cobalt, copper, or palladium or an alloy containing any of these metal materials can be used. The conductive layer 441 is connected to an FPC 445 through an anisotropic conductive film.

Figure 30B:
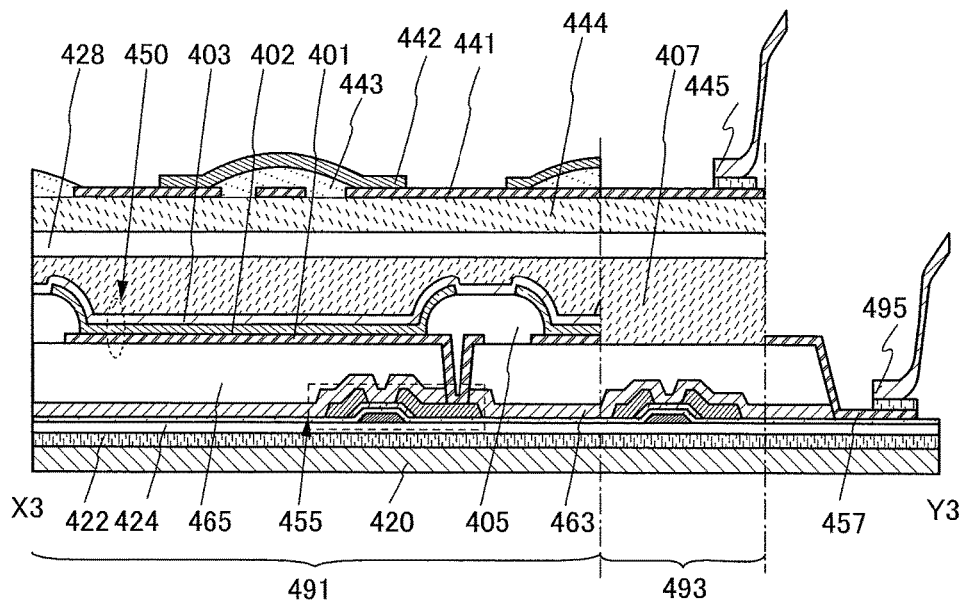

Note that although the touch sensor is provided over the flexible substrate 428 in FIG. 30A, one embodiment of the present invention is not limited to such a structure. As illustrated in FIG. 30B, a flexible substrate 444 may be provided over the flexible substrate 428 and a touch sensor may be provided over the flexible substrate 444. Note that the touch sensor may be provided between the flexible substrate 428 and the flexible substrate 444.

Structural Example 4

Figure 13C:
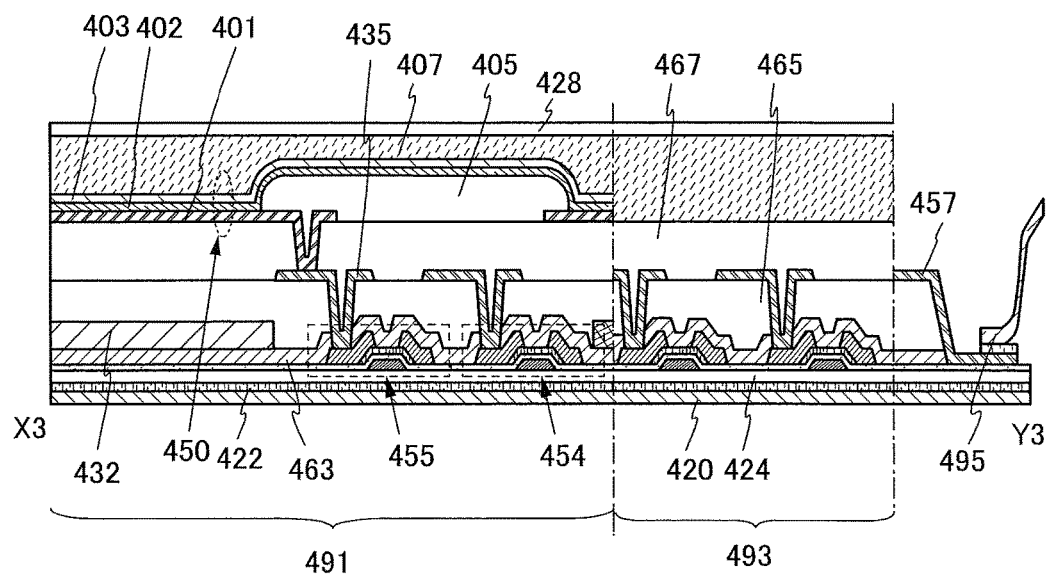

FIG. 13A is a plan view of the light-emitting device, and FIG. 13C is a cross-sectional view taken along dashed-dotted line X3-Y3 in FIG. 13A. The light-emitting device illustrated in FIG. 13C is a bottom-emission light-emitting device using a color filter method.

The light-emitting device in FIG. 13C includes the flexible substrate 420, the bonding layer 422, the insulating layer 424, a transistor 454, the transistor 455, the insulating layer 463, a coloring layer 432, the insulating layer 465, a conductive layer 435, an insulating layer 467, the insulating layer 405, the organic EL element 450 (the first electrode 401, the EL layer 402, and the second electrode 403), the bonding layer 407, the flexible substrate 428, and the conductive layer 457. The flexible substrate 420, the bonding layer 422, the insulating layer 424, the insulating layer 463, the insulating layer 465, the insulating layer 467, and the first electrode 401 transmit visible light.

In the light-emitting portion 491 of the light-emitting device in FIG. 13C, the switching transistor 454, the current control transistor 455, and the organic EL element 450 are provided over the flexible substrate 420 with the bonding layer 422 and the insulating layer 424 provided therebetween. The organic EL element 450 includes the first electrode 401 over the insulating layer 467, the EL layer 402 over the first electrode 401, and the second electrode 403 over the EL layer 402. The first electrode 401 is electrically connected to the source electrode or the drain electrode of the transistor 455 through the conductive layer 435. The end portion of the first electrode 401 is covered with the insulating layer 405. It is preferable that the second electrode 403 reflect visible light. Moreover, the light-emitting device includes the coloring layer 432 over the insulating layer 463, with which the organic EL element 450 is overlapped.

The driver circuit portion 493 includes a plurality of transistors. FIG. 13C illustrates two of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and the same step(s) as those of the conductive layer 435 is described.

The insulating layer 463 has an effect of suppressing diffusion of impurities into a semiconductor included in the transistors. As the insulating layer 465 and the insulating layer 467, an insulating film having a planarization function is preferably selected in order to reduce surface unevenness due to the transistors and the wirings.

Figure 31A:
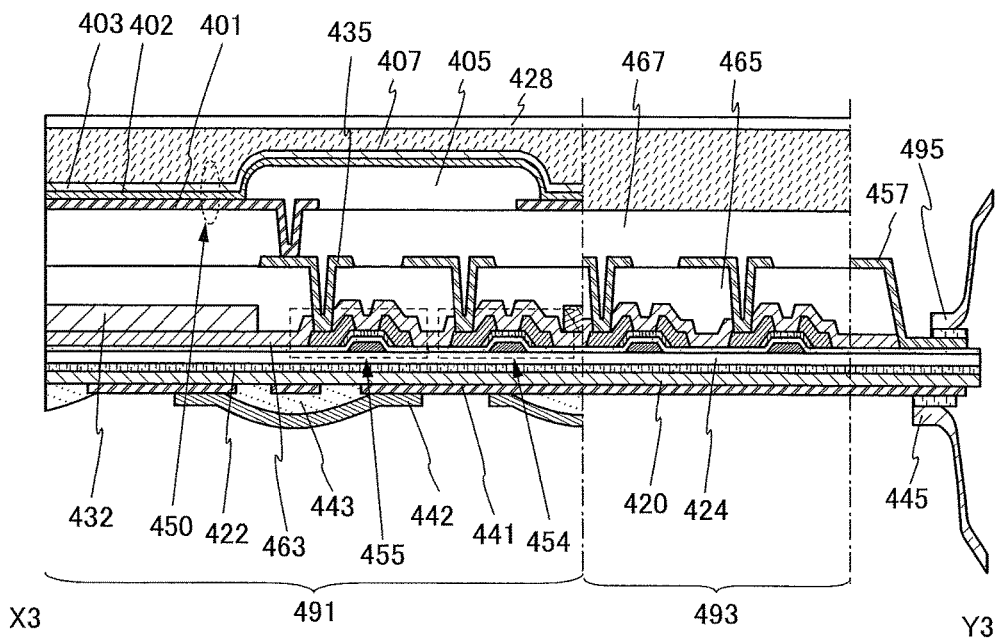
FIGS. 31A and 31B illustrate examples of a light-emitting device.
Figure 31B:
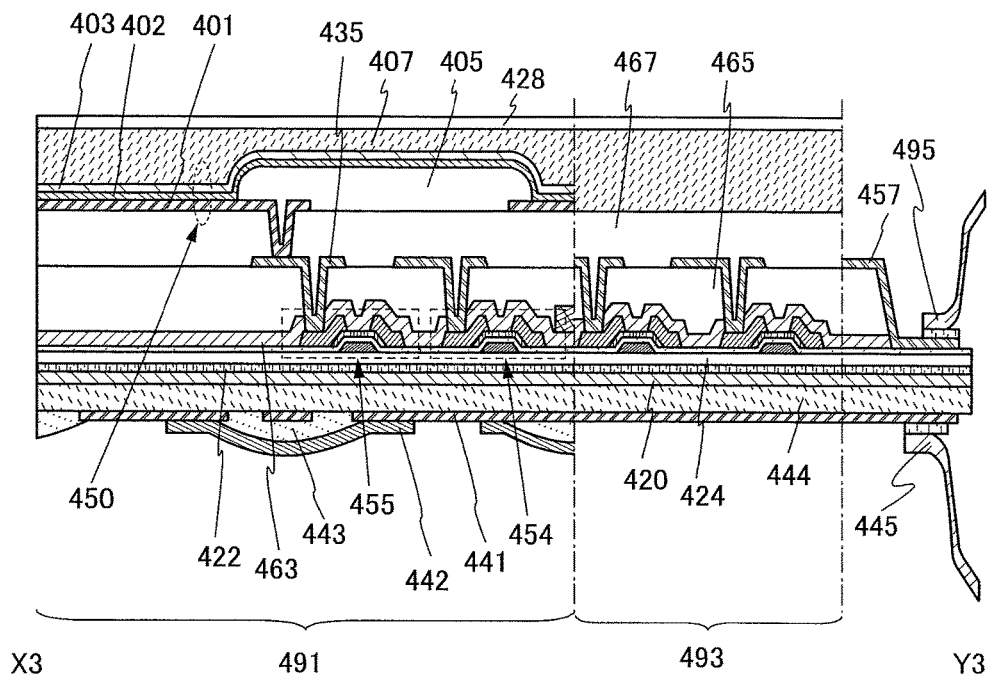

Note that a touch sensor may be provided in an overlapping manner with the flexible substrate 420 as illustrated in FIG. 31A. The touch sensor includes the conductive layer 441, the conductive layer 442, and the insulating layer 443. As illustrated in FIG. 31B, the flexible substrate 444 may be provided between the flexible substrate 420 and the touch sensor. Note that the touch sensor may be provided between the flexible substrate 420 and the flexible substrate 444.

Structural Example 5

Figure 14A:
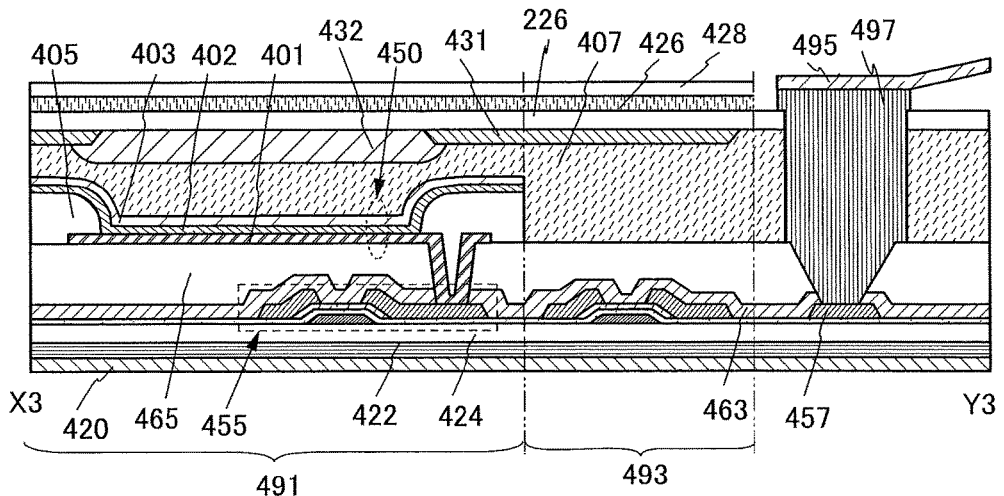
FIGS. 14A to 14C illustrate examples of a light-emitting device.

FIG. 13A is a plan view of the light-emitting device, and FIG. 14A is a cross-sectional view taken along dashed-dotted line X3-Y3 in FIG. 13A. The light-emitting device illustrated in FIG. 14A is a top-emission light-emitting device using a color filter method.

The light-emitting device in FIG. 14A includes the flexible substrate 420, the bonding layer 422, the insulating layer 424, the transistor 455, the insulating layer 463, the insulating layer 465, the insulating layer 405, the organic EL element 450 (the first electrode 401, the EL layer 402, and the second electrode 403), the bonding layer 407, a light-blocking layer 431, the coloring layer 432, an insulating layer 226, a bonding layer 426, the flexible substrate 428, and the conductive layer 457. The flexible substrate 428, the bonding layer 426, the insulating layer 226, the bonding layer 407, and the second electrode 403 transmit visible light.

In the light-emitting portion 491 of the light-emitting device in FIG. 14A, the transistor 455 and the organic EL element 450 are provided over the flexible substrate 420 with the bonding layer 422 and the insulating layer 424 provided therebetween. The organic EL element 450 includes the first electrode 401 over the insulating layer 465, the EL layer 402 over the first electrode 401, and the second electrode 403 over the EL layer 402. The first electrode 401 is electrically connected to the source electrode or the drain electrode of the transistor 455. The end portion of the first electrode 401 is covered with the insulating layer 405. It is preferable that the first electrode 401 reflect visible light. Moreover, the light-emitting device includes the coloring layer 432 overlapping with the organic EL element 450 with the bonding layer 407 provided therebetween, and the light-blocking layer 431 overlapping with the insulating layer 405 with the bonding layer 407 provided therebetween.

The driver circuit portion 493 includes a plurality of transistors. FIG. 14A illustrates one of the transistors in the driver circuit portion 493.

The conductive layer 457 is electrically connected to an external input terminal through which a signal or a potential from the outside is transmitted to the driver circuit portion 493. Here, an example in which the FPC 495 is provided as the external input terminal is described. Moreover, here, an example in which the conductive layer 457 is formed using the same material and the same step(s) as those of the source electrode and the drain electrode of the transistor 455 is described. A connector 497 over the insulating layer 226 is connected to the conductive layer 457 through an opening provided in the insulating layer 226, the bonding layer 407, the insulating layer 465, and the insulating layer 463. Moreover, the connector 497 is connected to the FPC 495. The FPC 495 and the conductive layer 457 are electrically connected to each other with the connector 497 provided therebetween.

Note that in FIG. 14A, a touch sensor may be further provided in a manner similar to those of FIGS. 30A and 30B.

Structural Example 6

Figure 14B:
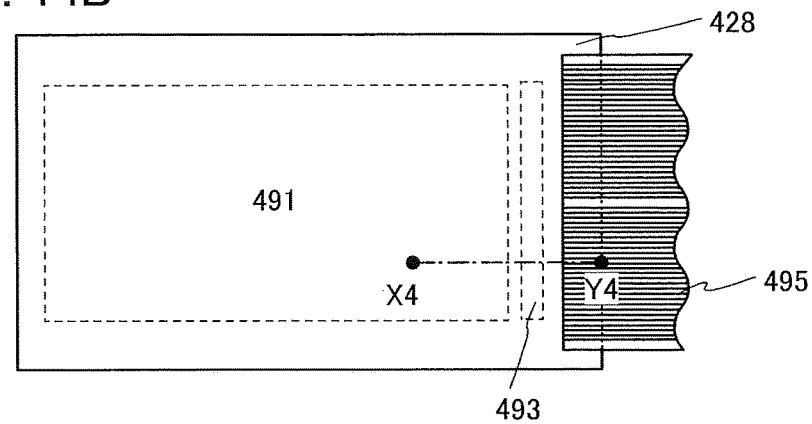
Figure 14C:
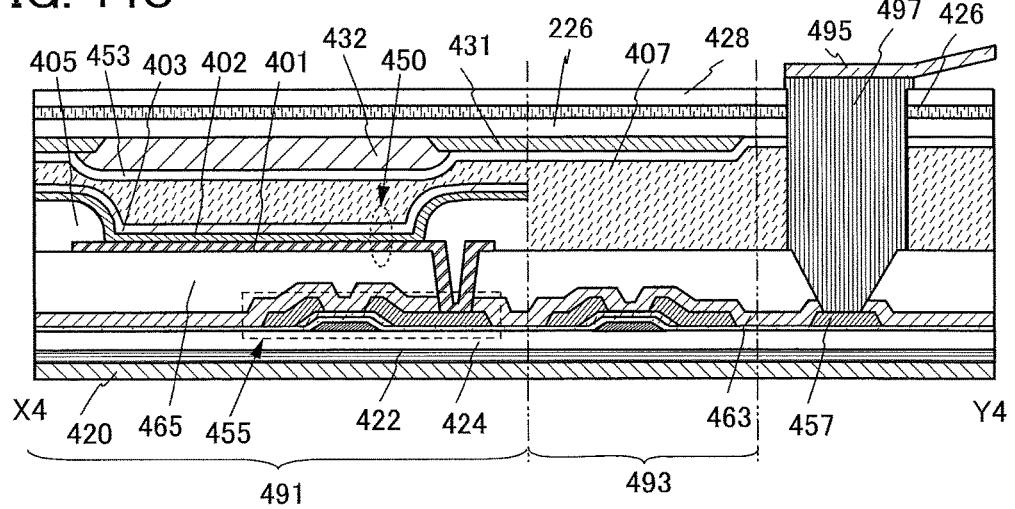

FIG. 14B is a plan view of the light-emitting device, and FIG. 14C is a cross-sectional view taken along dashed-dotted line X4-Y4 in FIG. 14B. The light-emitting device illustrated in FIG. 14C is a top-emission light-emitting device using a color filter method.

The light-emitting device illustrated in FIGS. 14B and 14C differs from that in Structural Example 5 in that the FPC 495 overlaps with the flexible substrate 428. In the case where the conductive layer 457 and the flexible substrate 428 overlap with each other, the conductive layer 457, the connector 497, and the FPC 495 are electrically connected to one another by forming an opening in the flexible substrate 428 (or using a flexible substrate having an opening).

Furthermore, the light-emitting device illustrated in FIG. 14C differs from that in Structural Example 5 in that an overcoat 453 is included. For the structure of the other components, the description of Structural Example 5 can be referred to.

Note that in FIGS. 14B and 14C, a touch sensor may be further provided in a manner similar to those of FIGS. 30A and 30B.

<Material of Device>

Next, examples of materials that can be used for the light-emitting device are described.

[Flexible Substrate]

A flexible material is used for the flexible substrate. For example, an organic resin, a glass material that is thin enough to have flexibility, or the like can be used. Furthermore, a material which transmits visible light is used for the substrate of the light-emitting device from which light is extracted. A metal substrate or the like may be used in the case where the flexible substrate does not necessarily transmit visible light.

An organic resin, which has a specific gravity smaller than that of glass, is preferably used for the flexible substrate, in which case the light-emitting device can be more light-weight as compared to the case where glass is used.

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose coefficient of thermal expansion is low is preferable, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

In the case where a fibrous body is contained in the material having flexibility and a light-transmitting property, a high-strength fiber of an organic compound or an inorganic compound is used as the fibrous body. A high-strength fiber is specifically a fiber with a high tensile modulus of elasticity or a fiber with a high Young's modulus. Typical examples of a high-strength fiber include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure in which this fibrous body is impregnated with a resin and the resin is cured may be used as the flexible substrate. The structure including the fibrous body and the resin is preferably used as the flexible substrate, in which case the reliability against bending or breaking due to local pressure can be increased.

To improve the light extraction efficiency, the refractive index of the material having flexibility and a light-transmitting property is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferable, in which case such a filler can maintain optical transparency.

To obtain flexibility and bendability, the thickness of a metal substrate is preferably greater than or equal to 10 μm and less than or equal to 200 μm, further preferably greater than or equal to 20 μm and less than or equal to 50 μm. Since a metal substrate has high thermal conductivity, heat generated due to light emission of the light-emitting element can be efficiently released.

Although there is no particular limitation on a material of the metal substrate, it is preferable to use, for example, aluminum, copper, nickel, a metal alloy such as an aluminum alloy or stainless steel.

The flexible substrate may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the functional element (in particular, the organic EL element) due to moisture and the like, an insulating film with low water permeability described later may be included.

The flexible substrate may be formed by stacking a plurality of layers. When a glass layer is used, a barrier property against water and oxygen can be improved and thus a highly reliable light-emitting device can be provided.

For example, a flexible substrate in which a glass layer, a bonding layer, and an organic resin layer are stacked from the side closer to an organic EL element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and high flexibility. The thickness of the organic resin layer is greater than or equal to 10 μm and less than or equal to 200 μm, preferably greater than or equal to 20 μm and less than or equal to 50 μm. Providing such an organic resin layer outside the glass layer, occurrence of a crack or a break in the glass layer can be suppressed and mechanical strength can be improved. With the substrate that includes such a composite material of a glass material and an organic resin, a highly reliable flexible light-emitting device can be provided.

[Bonding Layer]

As the bonding layer, various curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress entry of impurities such as moisture into the functional element and can improve the reliability of the light-emitting device.

In addition, a filler with a high refractive index or a light scattering member is mixed into the resin, in which case the efficiency of light extraction from the light-emitting element can be improved. For example, titanium oxide, barium oxide, zeolite, or zirconium can be used.

[Insulating Layer]

An insulating film having low water permeability (or low moisture permeability) is preferably used as the insulating layer 424 and the insulating layer 226. In addition, an insulating film having low water permeability may be formed between the bonding layer 407 and the second electrode 403.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like can be used.

For example, the water vapor transmittance of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

As the insulating layer 463, for example, an inorganic insulating film such as a silicon oxide film, a silicon oxynitride film, or an aluminum oxide film can be used. For example, as the insulating layer 465 and the insulating layer 467, an organic material such as polyimide, acrylic, polyamide, polyimide amide, or a benzocyclobutene-based resin can be used. Alternatively, a low-dielectric constant material (a low-k material) or the like can be used. Furthermore, the insulating layer 465 and the insulating layer 467 may be formed by stacking a plurality of insulating films.

For the insulating layer 405, an organic insulating material or an inorganic insulating material is used. As the resin, for example, a polyimide resin, a polyamide resin, an acrylic resin, a siloxane resin, an epoxy resin, or a phenol resin can be used. It is particularly preferable that the insulating layer 405 be formed using a photosensitive resin material to have an opening over the first electrode 401 so that a sidewall of the opening is formed as an inclined surface with continuous curvature.

There is no particular limitation on the method for forming the insulating layer 405; a photolithography method, a sputtering method, an evaporation method, a droplet discharging method (e.g., an ink-jet method), a printing method (e.g., a screen printing method or an off-set printing method), or the like may be used.

[Transistor]

There is no particular limitation on the structure of the transistor used in the light-emitting device of one embodiment of the present invention. For example, a forward staggered transistor or an inverted staggered transistor may be used. Furthermore, a top-gate transistor or a bottom-gate transistor may be used. In addition, there is no particular limitation on a material used for the transistor. For example, a transistor in which silicon, germanium, or an oxide semiconductor is used in a channel formation region can be employed. There is no particular limitation on the crystallinity of a semiconductor, and any of an amorphous semiconductor or a semiconductor having crystallinity (a microcrystalline semiconductor, a polycrystalline semiconductor, and a semiconductor partly including crystal regions) may be used. A semiconductor having crystallinity is preferably used, in which case deterioration of transistor characteristics can be reduced. As silicon, amorphous silicon, single crystal silicon, polycrystalline silicon, or the like can be used. As an oxide semiconductor, an In—Ga—Zn—O-based metal oxide or the like can be used.

For stable characteristics of the transistor, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed by a sputtering method, a plasma CVD method, a coating method, a printing method, or the like. Note that the base film is not necessarily provided if not necessary. In each of the above structural examples, the insulating layer 424 can serve as a base film of the transistor.

[Organic EL Element]

There is no particular limitation on the structure of the organic EL element used for the light-emitting device of one embodiment of the present invention. The organic EL element may have a top emission structure, a bottom emission structure, or a dual emission structure.

When a voltage higher than the threshold voltage of the organic EL element is applied between a pair of electrodes, holes are injected to the EL layer 402 from the anode side and electrons are injected to the EL layer 402 from the cathode side. The injected electrons and holes are recombined in the EL layer 402 and a light-emitting substance contained in the EL layer 402 emits light.

A conductive film that transmits visible light is used as the electrode through which light is extracted in the organic EL element. A conductive film that reflects visible light is preferably used as the electrode through which light is not extracted.

The conductive film that transmits visible light can be formed using, for example, indium oxide, ITO, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Further alternatively, a stacked film of any of the above materials can be used as the conductive film. For example, a stacked film of ITO and an alloy of silver and magnesium is preferably used, in which case conductivity can be increased. Still further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on and in contact with an aluminum alloy film, whereby oxidation of the aluminum alloy film can be suppressed. Examples of a material for the metal film or the metal oxide film are titanium and titanium oxide. Alternatively, the above conductive film that transmits visible light and a film containing a metal material may be stacked. For example, a stacked film of silver and ITO or a stacked film of ITO and an alloy of silver and magnesium can be used.

Each of the electrodes can be formed by an evaporation method or a sputtering method. Alternatively, a discharging method such as an ink-jet method, a printing method such as a screen printing method, or a plating method may be used.

The EL layer 402 includes at least a light-emitting layer. In addition to the light-emitting layer, the EL layer 402 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 402, either a low molecular compound or a high molecular compound can be used, and an inorganic compound may also be used. Each of the layers included in the EL layer 402 can be formed by any of the following methods: an evaporation method (including a vacuum evaporation method), a transfer method, a printing method, an ink-jet method, a coating method, and the like.

[Coloring Layer, Light-Blocking Layer, and Overcoat]

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer is provided between the adjacent coloring layers. The light-blocking layer blocks light emitted from an adjacent organic EL element to prevent color mixture between adjacent organic EL elements. Here, the coloring layer is provided such that its end portion overlaps with the light-blocking layer, whereby light leakage can be reduced. As the light-blocking layer, a material that can block light from the organic EL element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. The overcoat can prevent an impurity and the like contained in the coloring layer from being diffused into the organic EL element. The overcoat is formed with a material that transmits light emitted from the organic EL element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer 432 and the light-blocking layer 431 are coated with a material of the bonding layer 407, a material which has high wettability with respect to the material of the bonding layer 407 is preferably used as the material of the overcoat. For example, an oxide conductive film such as an ITO film or a metal film such as an Ag film which is thin enough to transmit light is preferably used as the overcoat 453 (see FIG. 14C).

[Conductive Layer]

For example, the conductive layer functioning as an electrode or a wiring of the transistor, an auxiliary wiring of the organic EL element, or the like can be formed to have a single-layer structure or a stacked-layer structure using any of metal materials such as molybdenum, titanium, chromium, tantalum, tungsten, aluminum, copper, neodymium, and scandium, and an alloy material containing any of these elements. The conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The thickness of the auxiliary wiring can be, for example, greater than or equal to 0.1 μm and less than or equal to 3 μm, preferably greater than or equal to 0.1 μm and less than or equal to 0.5 μm.

When a paste (e.g., silver paste) is used as the material of the auxiliary wiring, a metal framing the auxiliary wiring aggregates in the form of particles, and as a result, the surface of the auxiliary wiring becomes rough and has many gaps. For example, when the conductive layer 408 functioning as an auxiliary wiring is formed over the insulating layer 405 as illustrated in FIGS. 12B and 12C, it is difficult for the EL layer 402 to cover the conductive layer 408 completely; accordingly, the upper electrode (second electrode 403) and the auxiliary wiring (conductive layer 408) are preferably connected electrically to each other with ease.

[Light Extraction Structure]

For the light extraction structure, a hemispherical lens, a micro lens array, a film provided with an uneven surface structure, a light diffusing film, or the like can be used. For example, a light extraction structure can be formed by attaching the lens or film to the substrate with an adhesive or the like which has substantially the same refractive index as the substrate, or the lens or film.

[Connector]

For the connector 497, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

<Method for Manufacturing Device: 1>

An example in which a bottom-emission light-emitting device using a color filter method in FIGS. 13A and 13C (Structural Example 4) is manufactured by the peeling method of one embodiment of the present invention is described below. In steps after FIG. 15A, the driver circuit portion 493 in Structural Example 4 is omitted.

Note that the light-emitting devices in Structural Examples 1 to 3 can be manufactured in a similar manner by changing the structure of the layer to be peeled.

Figure 15A:
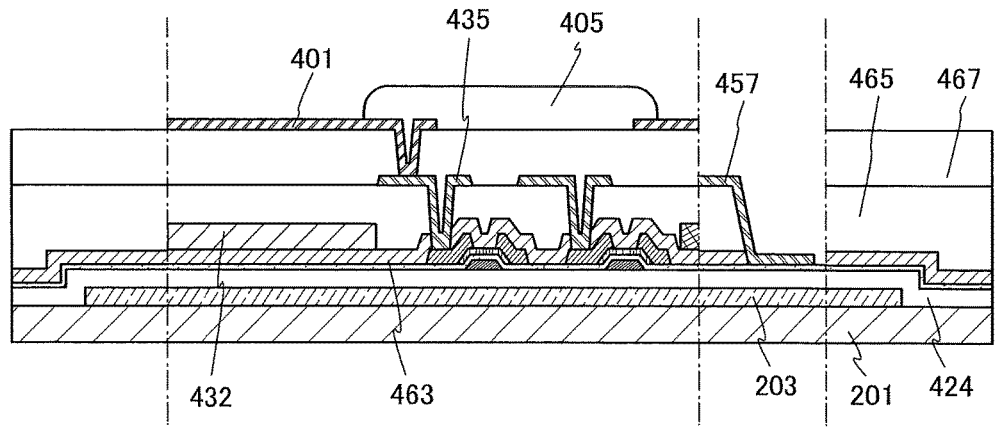
FIGS. 15A to 15C illustrate a method for manufacturing a light-emitting device.

First, as illustrated in FIG. 15A, the peeling layer 203, the insulating layer 424, the transistor, the insulating layer 463, the insulating layer 465, the coloring layer 432, the conductive layer 435, and the insulating layer 467 are formed over the formation substrate 201 in this order. Here, the conductive layer 457 is formed using the same material and the same step(s) as those of the conductive layer 435. Next, the first electrode 401 which is electrically connected to the source electrode or the drain electrode of the transistor is formed. Then, the insulating layer 405 covering an end portion of the first electrode 401 is formed. Here, layers from the insulating layer 424 to the insulating layer 405 correspond to a layer to be peeled.

Figure 15B:
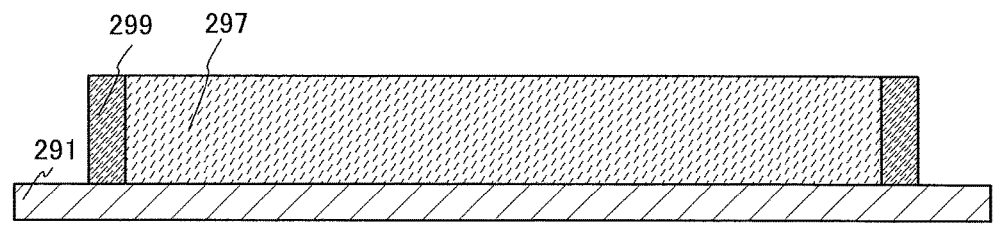

In addition, as illustrated in FIG. 15B, a frame-shaped partition 299 and a peeling adhesive 297 on an inner side than the partition 299 are formed over a temporary support substrate 291. At this time, adhesive with which the temporary supporting substrate 291 and the layer to be peeled can be chemically or physically separated is used as the peeling adhesive 297. Note that the frame-shaped partition 299 and the peeling adhesive 297 on an inner side than the partition 299 may be formed over the layer to be peeled.

Figure 15C:
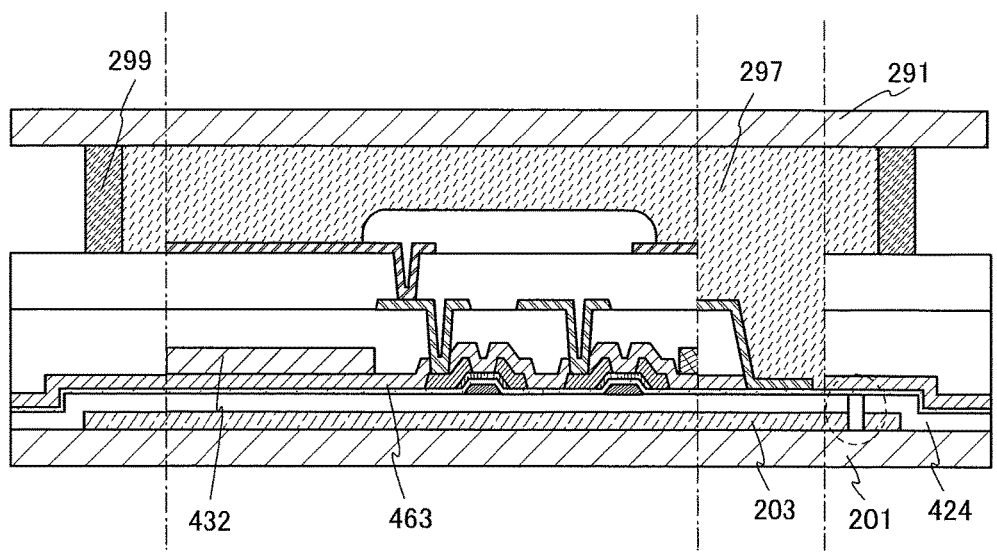

Next, the temporary supporting substrate 291 and the formation substrate 201 are attached to each other with the peeling adhesive 297, and the peeling adhesive 297 is cured. Then, a peeling starting point is formed by laser light irradiation (FIG. 15C). At least part of the insulating layer 424 is removed; thus, the peeling starting point can be formed. Here, an example in which the insulating layer 424 and the peeling layer 203 are partly removed is described. Note that in each of the figures illustrating the steps of forming the peeling starting point, a region where the peeling starting point is formed is surrounded by a dashed line. For the details of formation of the peeling starting point, the description in Embodiment 1 can be referred to.

Figure 16A:
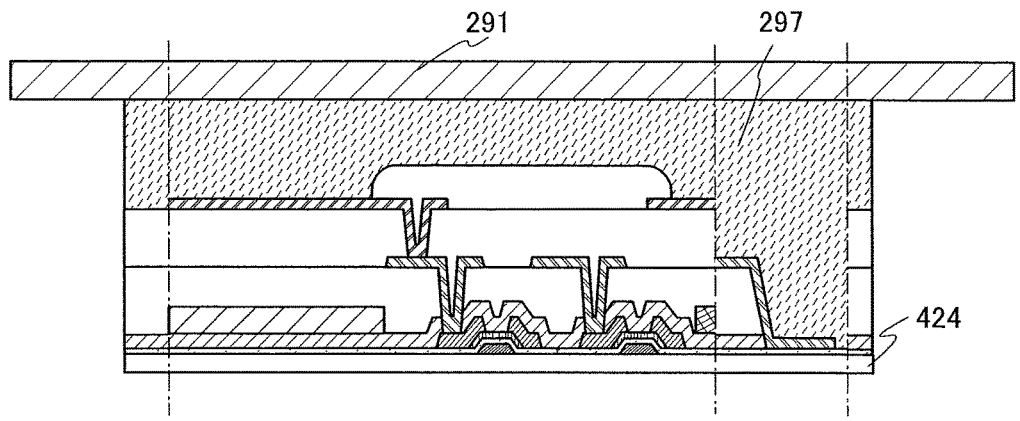
FIGS. 16A to 16C illustrate a method for manufacturing a light-emitting device.

The layer to be peeled and the formation substrate 201 are separated from each other from the formed peeling starting point (FIG. 16A).

Figure 16B:
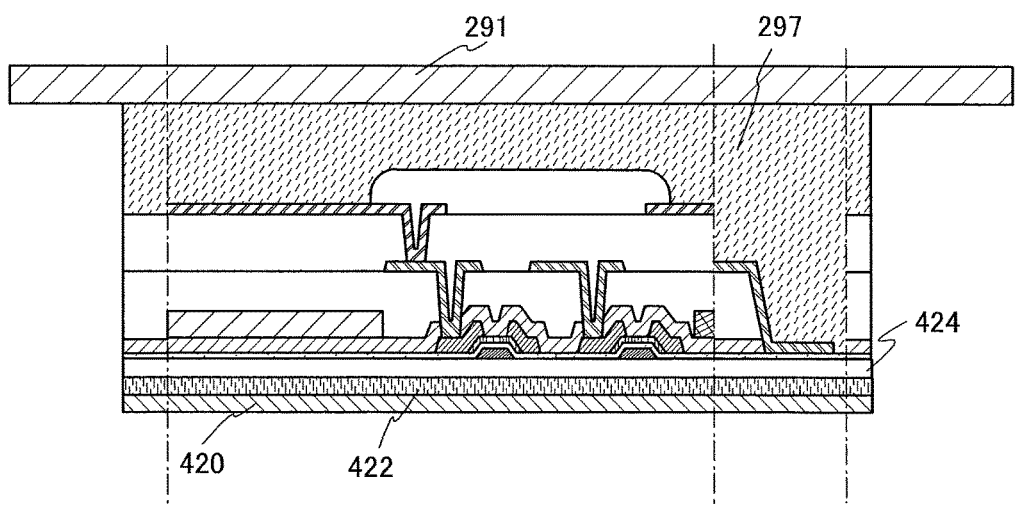

Next, the insulating layer 424 peeled from the formation substrate 201 and exposed is attached to the flexible substrate 420 with the bonding layer 422 (FIG. 16B).

Figure 16C:
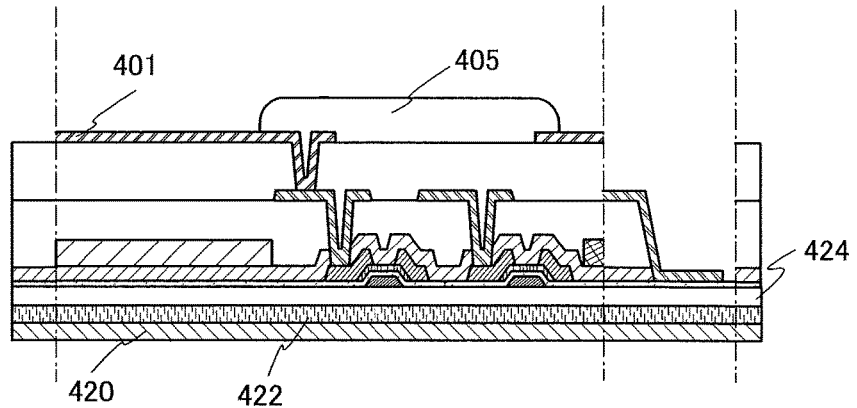

After that, the temporary supporting substrate 291 is removed by dissolving or plasticizing the peeling adhesive 297. Then, the peeling adhesive 297 is removed by water, a solvent, or the like to expose the layer to be peeled (e.g., the insulating layer 405) (FIG. 16C).

In the above manner, the layer to be peeled can be transferred from the formation substrate 201 to the flexible substrate 420.

After that, the EL layer 402 and the second electrode 403 are formed over the first electrode 401 and the insulating layer 405 which are exposed, and the organic EL element 450 and the flexible substrate 428 are attached to each other with the bonding layer 407. Finally, the FPC 495 is attached to each electrode of an input-output terminal portion with the use of an anisotropic conductive member. An IC chip or the like may be mounted if necessary. Note that when the flexible substrate warps easily, the attachment accuracy might deteriorate at the time of attachment of the FPC or a TCP. Therefore, the manufactured device may be supported by glass, silicone rubber, or the like at the time of attachment of the FPC or the TCP. Thus, the electrical connection of the FPC or the TCP to the functional element can be performed surely.

In the above manner, the light-emitting device in FIG. 13C can be manufactured.

<Method for Manufacturing Device: 2>

An example in which a top-emission light-emitting device using a color filter method in FIGS. 13A and 14A (Structural Example 5) is manufactured by the peeling method of one embodiment of the present invention is described below.

Not only an example of the manufacturing method in which one light-emitting device is manufactured over one substrate but also an example in which a plurality of light-emitting devices are manufactured over one substrate is described. Specifically, two cases are described: one is an example in which a peeling layer is provided in each light-emitting device (the layer 105 and the peeling layer 103 in FIG. 10H can be referred); and the other is an example in which a plurality of light-emitting devices are provided over one peeling layer (the layer 105 and the peeling layer 103 in FIG. 10I can be referred).

Figure 17A:
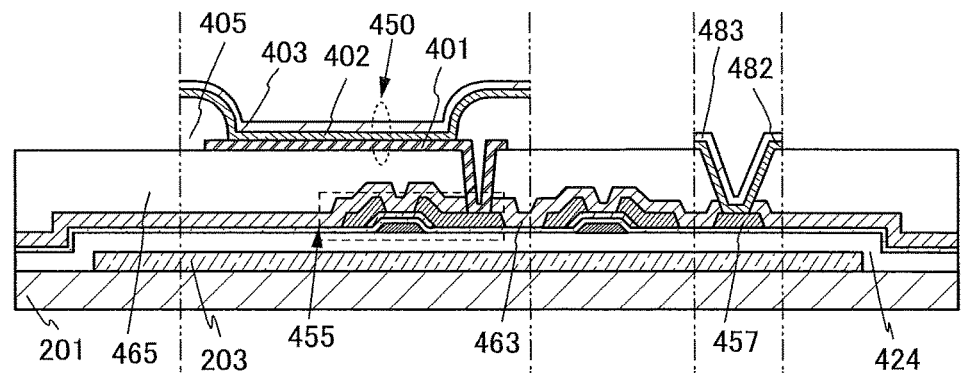
FIGS. 17A to 17C illustrate a method for manufacturing a light-emitting device.

First, as illustrated in FIG. 17A, the peeling layer 203, the insulating layer 424, the transistor 455, the insulating layer 463, and the insulating layer 465 are formed over the formation substrate 201 in this order. Next, an opening is formed in part of the insulating layer 463 and the insulating layer 465, and the first electrode 401 which is electrically connected to the source electrode or the drain electrode of the transistor is formed. Note that the conductive layer 457 is formed using the same material and the same step(s) as those of the source electrode and the drain electrode of the transistor.

Then, the insulating layer 405 covering the end portion of the first electrode 401 is formed. Next, the EL layer 402 is formed over the first electrode 401 and the insulating layer 405, and the second electrode 403 is formed over the EL layer 402. Note that an opening is formed in a region of the insulating layer 463 and the insulating layer 465 which overlaps with the conductive layer 457, and an EL layer 482 and a conductive layer 483 are formed in the opening using the same material and the same step(s) as those of the EL layer 402 and those of the second electrode 403, respectively. Note that the EL layer 482 and the conductive layer 483 are not necessarily provided. Here, layers from the insulating layer 424 to the second electrode 403 (or the conductive layer 483) correspond to a layer to be peeled.

Figure 17B:
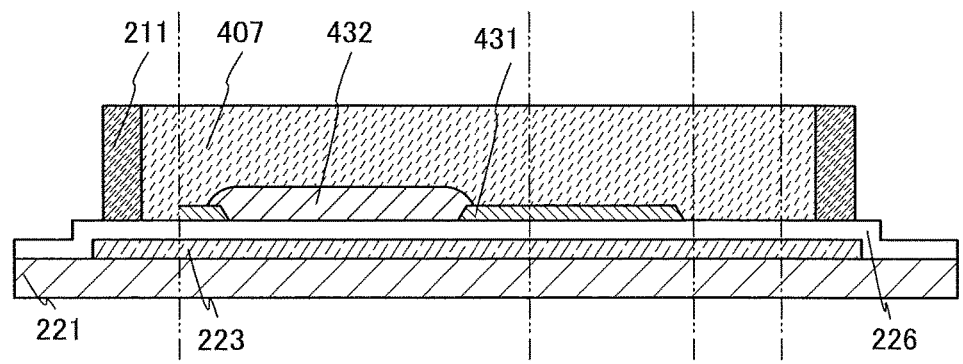

In addition, as illustrated in FIG. 17B, the peeling layer 223 and the insulating layer 226 are Ruined over the formation substrate 221 in this order. Then, the light-blocking layer 431 and the coloring layer 432 are formed over the insulating layer 226. After that, the frame-shaped partition 211 and the bonding layer 407 on an inner side than the partition 211 are formed over the insulating layer 226.

Figure 17C:
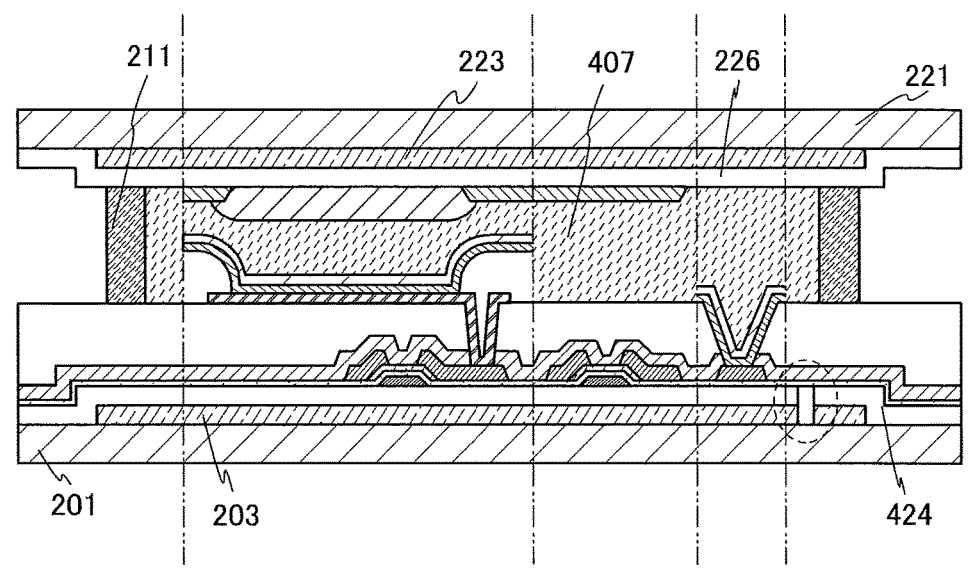

Next, the formation substrate 201 and the formation substrate 221 are attached to each other with the bonding layer 407, and the bonding layer 407 is cured. Then, a peeling starting point is formed by laser light irradiation (FIG. 17C). Here, an example in which the insulating layer 424 and the peeling layer 203 are partly removed is described. For the details of formation of the peeling starting point, the description in Embodiment 1 can be referred to.

Note that at least one peeling starting point is formed in each peeling layer. Therefore, in the case where a peeling layer is provided for every light-emitting device, the number of peeling starting points is greater than that of the peeling layers 203 provided over the formation substrate 201 (i.e., greater than that of light-emitting devices). FIG. 19A illustrates an example in which the number of peeling starting points is equal to that of the manufactured light-emitting devices. On the other hand, in the case where a plurality of light-emitting devices are provided over one peeling layer in FIG. 10I, at least one peeling starting point may be provided as illustrated in FIG. 19B.

Figure 18A:
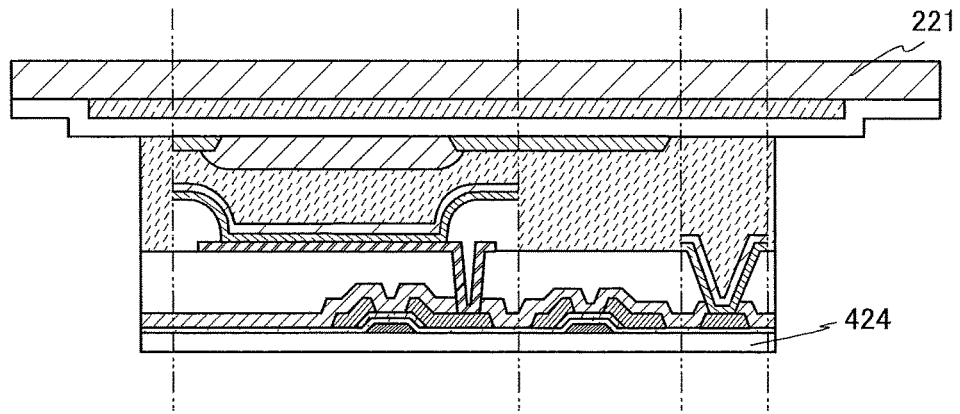
FIGS. 18A to 18C illustrate a method for manufacturing a light-emitting device.

Next, the layer to be peeled and the formation substrate 201 are separated from each other from the formed peeling starting point. Accordingly, the layer to be peeled can be transferred from the formation substrate 201 to the formation substrate 221 (FIG. 18A). An example in which a plurality of light-emitting devices are manufactured over one substrate is described with reference to FIGS. 20A and 20B.

Figure 18B:
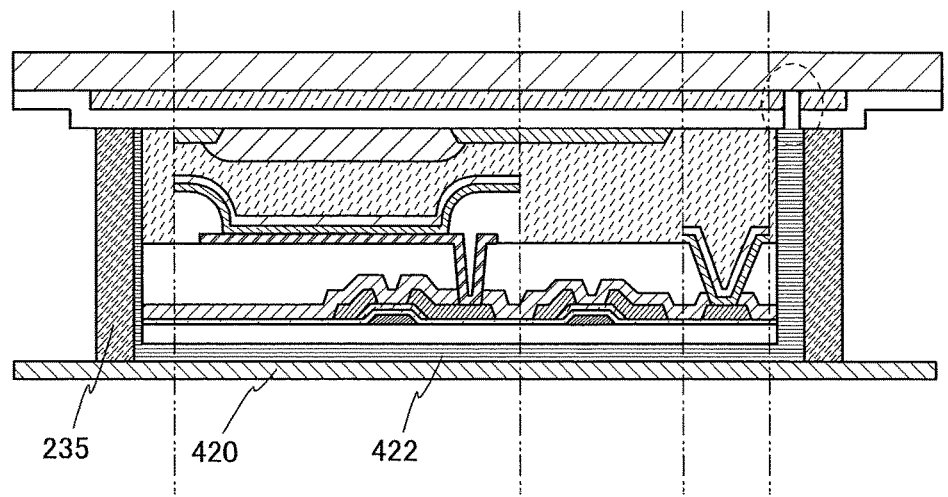

Next, the insulating layer 424 peeled from the formation substrate 201 and exposed is attached to the flexible substrate 420 with the bonding layer 422. Then, a peeling starting point is formed by laser light irradiation (FIG. 18B).

Here, the frame-shaped partition 235 and the bonding layer 233 on an inner side than the partition 235 are formed over the flexible substrate 420. An example in which a plurality of light-emitting devices are manufactured over one substrate is described with reference to FIGS. 21A and 21B.

In this manufacturing method, peeling is performed after a pair of formation substrates each provided with the layer to be peeled are attached to each other in advance, then the layer to be peeled can be transferred to the flexible substrates. Therefore, formation substrates having low flexibility can be attached to each other when the layers to be peeled are attached to each other, whereby alignment accuracy at the time of attachment can be improved as compared to the case where flexible substrates are attached to each other. Therefore, it can be said that this manufacturing method has high alignment accuracy at the time of attachment of an organic EL element and a color filter.

Figure 18C:
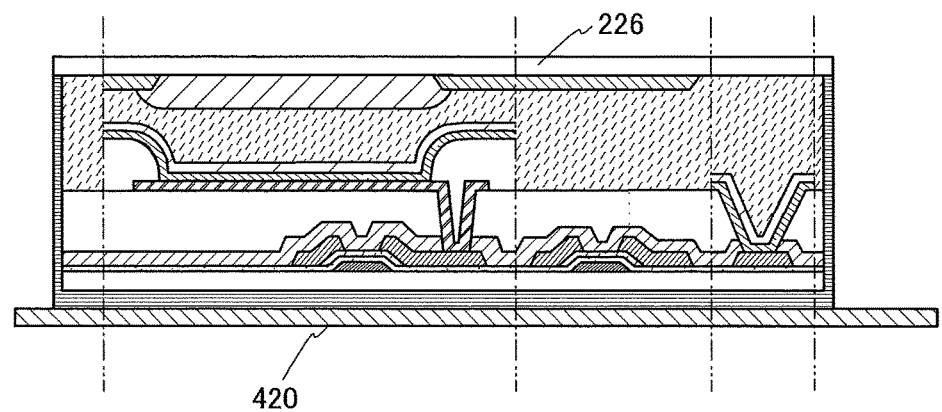
Figure 20A:
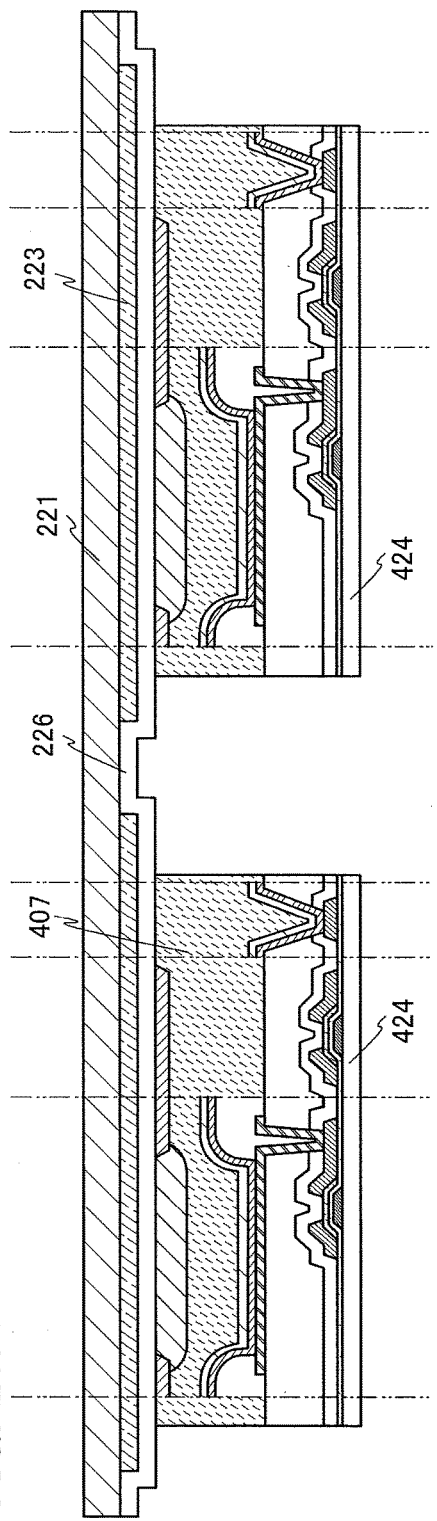
FIGS. 20A and 20B illustrate a method for manufacturing a light-emitting device.
Figure 20B:
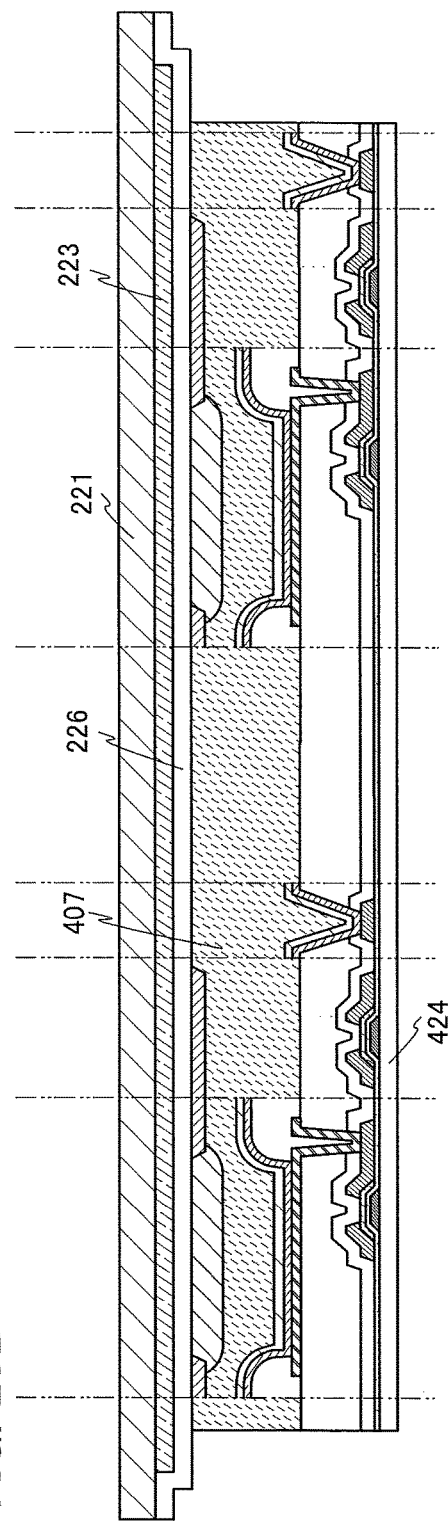
Figure 22A:
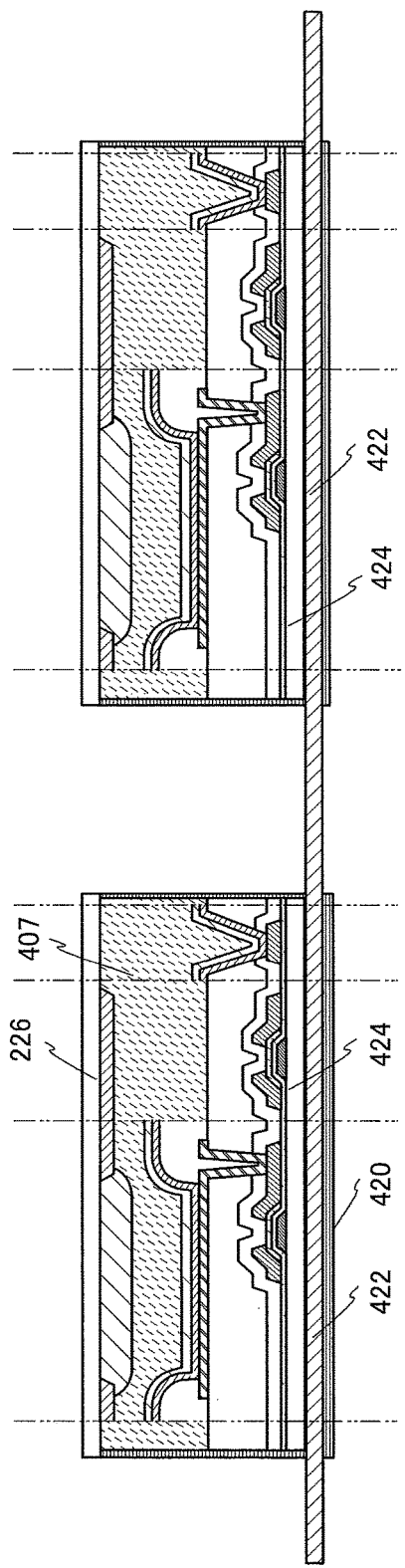
FIGS. 22A and 22B illustrate a method for manufacturing a light-emitting device.
Figure 22B:
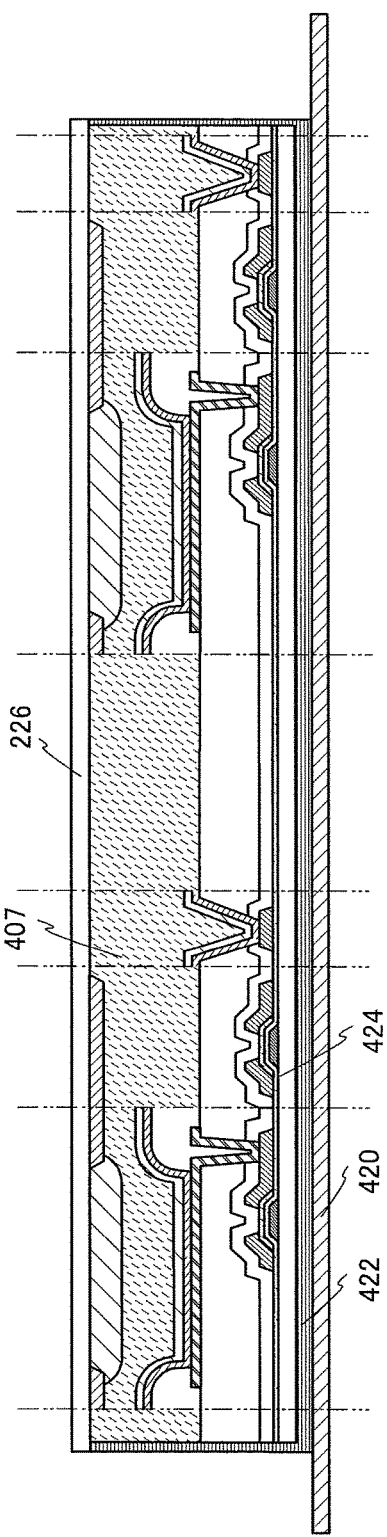

Then, the insulating layer 226 and the formation substrate 221 are separated from each other from the formed peeling starting point (FIG. 18C). An example in which a plurality of light-emitting devices are manufactured over one substrate is described with reference to FIGS. 22A and 22B.

In the above manner, the layer to be peeled can be transferred from the formation substrate 201 and the formation substrate 221 to the flexible substrate 420.

After that, a step of exposing the conductive layer 457 and a step of attaching the insulating layer 226 and the flexible substrate 428 with the bonding layer 426 are performed. Either step may be performed first.

Figure 23B:
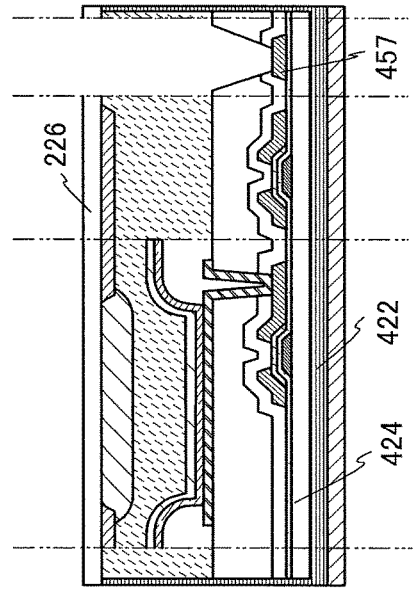
FIGS. 23A to 23C illustrate a method for manufacturing a light-emitting device.
Figure 23A:
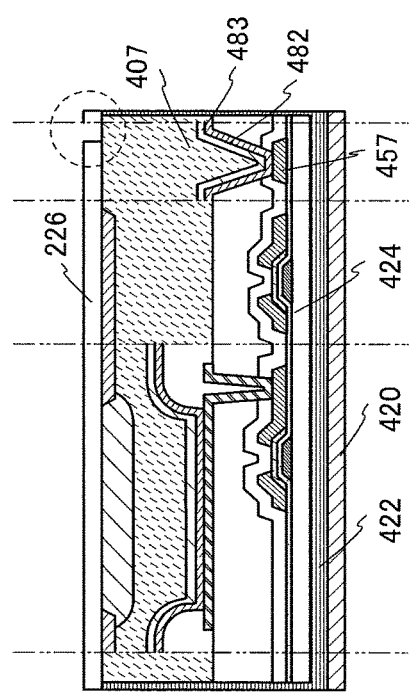

For example, part of the insulating layer 226 is removed as illustrated by a region surrounded by a dashed line in FIG. 23A. The part of the insulating layer 226 may be damaged by a needle, a cutter, or the like or may be irradiated with laser light. Not only the insulating layer 226 but also the bonding layer 407, the conductive layer 483, or the EL layer 482 may be partly removed.

Next, the removed region of the insulating layer 226 leads to removal of the insulating layer 226, the bonding layer 407, the EL layer 482, and the conductive layer 483 each overlapping with the conductive layer 457 (FIG. 23B). For example, an adhesive roller is pressed to the insulating layer 226 and the roller is rolled and moved relatively. Alternatively, an adhesive tape may be attached to the insulating layer 226 and then peeled. Adhesion between the EL layer 482 and the conductive layer 483 and adhesion between layers included in the EL layer 482 are low; therefore, separation occurs at an interface between the EL layer 482 and the conductive layer 483 or in the EL layer 482. Accordingly, a region where the insulating layer 226, the bonding layer 407, the EL layer 482, or the conductive layer 483 overlaps with the conductive layer 457 can be removed selectively. Note that in the case where the EL layer 482 or the like remains over the conductive layer 457, it may be removed with an organic solvent or the like.

Note that there is no limitation on a method for removing the layer overlapping with the conductive layer 457 as long as the conductive layer 457 can be exposed and can be electrically connected to the FPC 495 in subsequent steps. The EL layer 482 or the conductive layer 483 does not necessarily overlap with the conductive layer 457. For example, the conductive layer 483 is not necessarily provided in the case where separation occurs in the EL layer 482. Moreover, when the EL layer 482 and the bonding layer 407 are in contact with each other, for example, materials of the two layers might be mixed or an interface between the layers might become unclear depending on the materials to be used. In such a case, the conductive layer 483 is preferably provided between the EL layer 482 and the bonding layer 407 so as to suppress a reduction of the reliability of the light-emitting device.

Figure 23C:
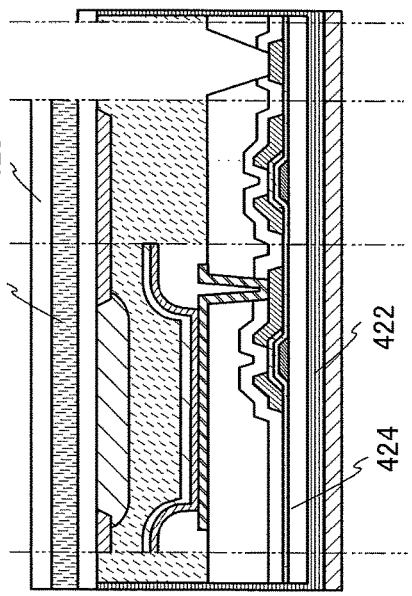

Then, the insulating layer 226 and the flexible substrate 428 are attached to each other with the bonding layer 426 (FIG. 23C).

After that, the FPC 495 is electrically connected to the exposed conductive layer 457 with the connector 497 provided therebetween.

In the above manner, the light-emitting device in FIG. 14A can be manufactured.

Note that the light-emitting device in FIG. 14C can be manufactured by employing a method described below.

First, as illustrated in FIG. 24A, the insulating layer 226 and the flexible substrate 428 are attached to each other with the bonding layer 426. Next, the flexible substrate 428, the bonding layer 426, and the insulating layer 226 are partly removed as illustrated by a region surrounded by a dashed line in FIG. 24B. The bonding layer 407, the conductive layer 483, or the EL layer 482 may be partly removed. Moreover, it is preferable to make a dot or linear cut in a frame shape in the flexible substrate 428 (see regions surrounded by dashed line in FIG. 24B). The depth of the cut is preferably half or more the thickness of the flexible substrate 428. The cut may be made not only in the flexible substrate 428 but also in the bonding layer 426, the insulating layer 226, or the like.

Figure 25:
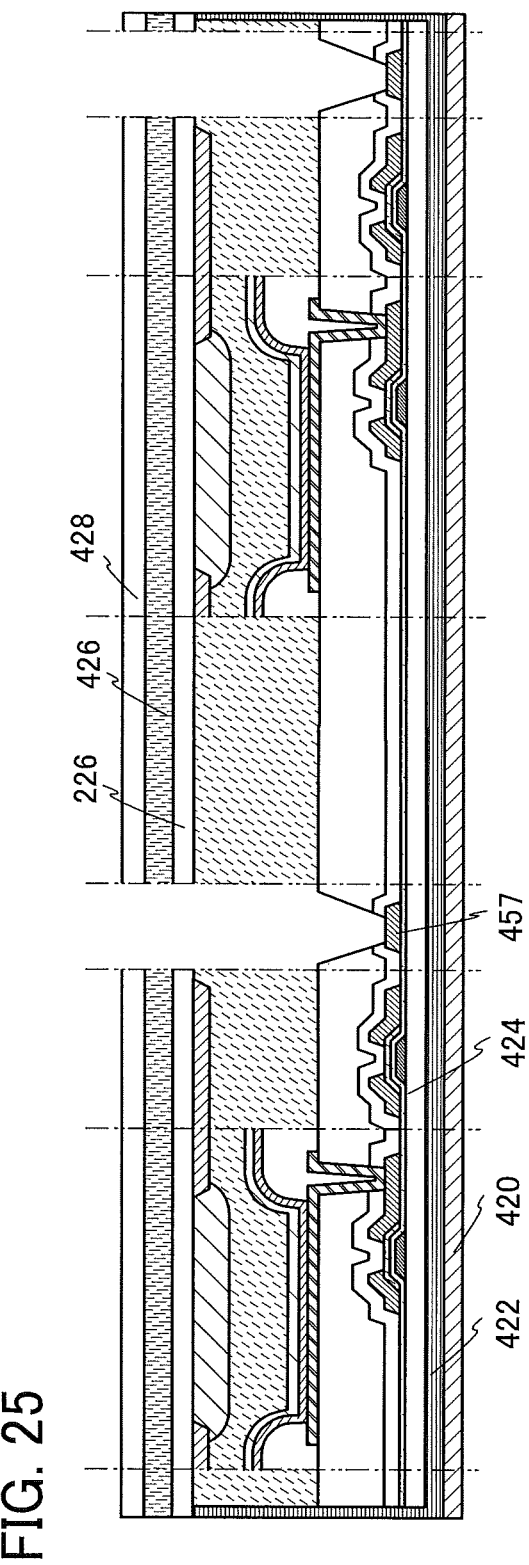
FIG. 25 illustrates a method for manufacturing a light-emitting device.

Next, the removed region of the flexible substrate 428 or the like leads to removal of the flexible substrate 428, the bonding layer 426, the insulating layer 226, the bonding layer 407, the EL layer 482, and the conductive layer 483 each overlapping with the conductive layer 457 (FIG. 25). An example of a method for removing each of the layers is as described above.

After that, the FPC 495 is electrically connected to the exposed conductive layer 457 with the connector 497 provided therebetween.

In the above manner, the light-emitting device in FIG. 14C can be manufactured.

In the method for manufacturing the light-emitting device of one embodiment of the present invention described above, peeling is performed in such a manner that a peeling starting point is formed and then the interface between the peeling layer and the layer to be peeled is made in a peelable state. Accordingly, the yield of the peeling process can be improved. As a result, the light-emitting device can be manufactured with a high yield.

This embodiment can be freely combined with any of the other embodiments.

Embodiment 3

In this embodiment, electronic devices and lighting devices which can be manufactured by employing the peeling method of one embodiment of the present invention will be described with reference to FIGS. 26A to 26G.

A light-emitting device, a display device, a semiconductor device, or the like that can be used for an electronic device or a lighting device can be manufactured with a high yield by employing the peeling method of one embodiment of the present invention. Moreover, a flexible electronic device or lighting device having high productivity can be manufactured by employing the peeling method of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The device manufactured by employing the peeling method of one embodiment of the present invention has flexibility and therefore can be incorporated along a curved inside/outside wall surface of a house or a building or a curved interior/exterior surface of a car.

Figure 26A:
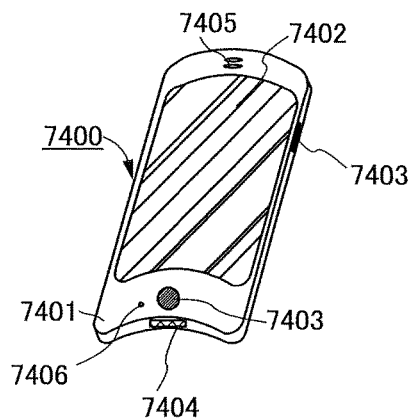
FIGS. 26A to 26G illustrate electronic devices and lighting devices.

FIG. 26A illustrates an example of a cellular phone. A cellular phone 7400 includes a display portion 7402 incorporated in a housing 7401, operation buttons 7403, an external connection port 7404, a speaker 7405, a microphone 7406, and the like. Note that the cellular phone 7400 is manufactured using the display device manufactured by employing the peeling method of one embodiment of the present invention for the display portion 7402. According to one embodiment of the present invention, a highly reliable cellular phone having a curved display portion can be provided with a high yield.

When the display portion 7402 of the cellular phone 7400 in FIG. 26A is touched with a finger or the like, data can be input into the cellular phone 7400. Moreover, operations such as making a call and inputting a letter can be performed by touch on the display portion 7402 with a finger or the like.

With the operation buttons 7403, power ON or OFF can be switched. In addition, a variety of images displayed on the display portion 7402 can be switched; switching a mail creation screen to a main menu screen, for example.

Figure 26B:
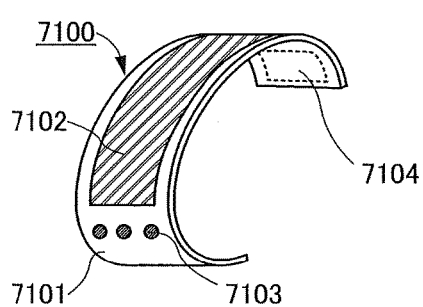

FIG. 26B is an example of a wristband-type portable display device. A portable display device 7100 includes a housing 7101, a display portion 7102, operation buttons 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation buttons 7103, power ON/OFF, switching of displayed videos, adjusting volume, and the like can be performed.

Here, the display portion 7102 includes a display device manufactured by employing the peeling method of one embodiment of the present invention. According to one embodiment of the present invention, a highly reliable portable display device having a curved display portion can be provided with a high yield.

Figure 26C:
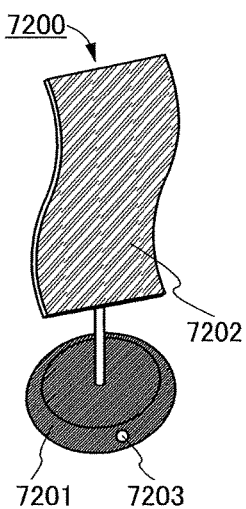
Figure 26D:
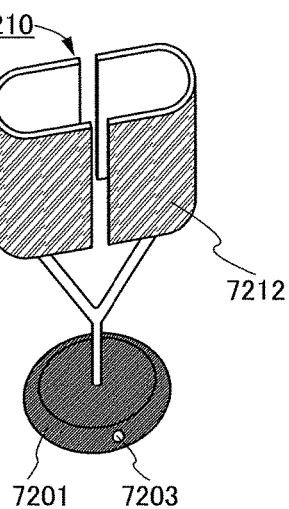
Figure 26E:
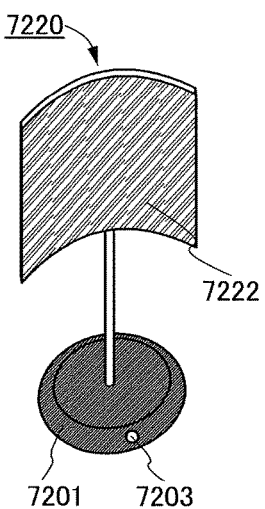

FIGS. 26C to 26E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 26C includes a light-emitting portion 7202 having a wave-shaped light-emitting surface, which is good-design lighting device.

A light-emitting portion 7212 included in the lighting device 7210 in FIG. 26D has two convex-curved light-emitting portions symmetrically placed. Thus, all directions can be illuminated with the lighting device 7210 as a center.

The lighting device 7220 illustrated in FIG. 26E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device manufactured by employing the peeling method of one embodiment of the present invention. According to one embodiment of the present invention, a highly reliable lighting device having a curved light-emitting portion can be provided with a high yield.

Figure 26F:
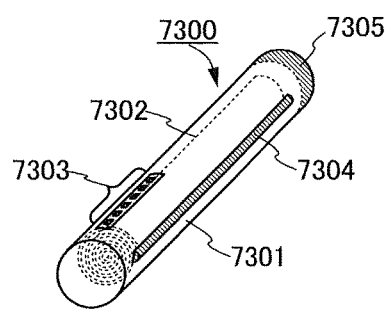

FIG. 26F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 26G:
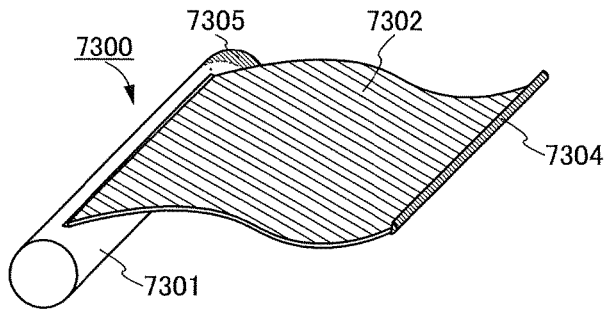

FIG. 26G illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation button 7303 is provided not in the center of the housing 7301 but on one side of the housing 7301 as illustrated in FIG. 26F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device manufactured by employing the peeling method of one embodiment of the present invention. According to one embodiment of the present invention, a lightweight and highly reliable display device can be provided with a high yield.

This embodiment can be freely combined with any of the other embodiments.

Embodiment 4

In this embodiment, a laser irradiation system that can be used for the peeling method of one embodiment of the present invention will be described with reference to FIGS. 27A and 27B.

Figure 27A:
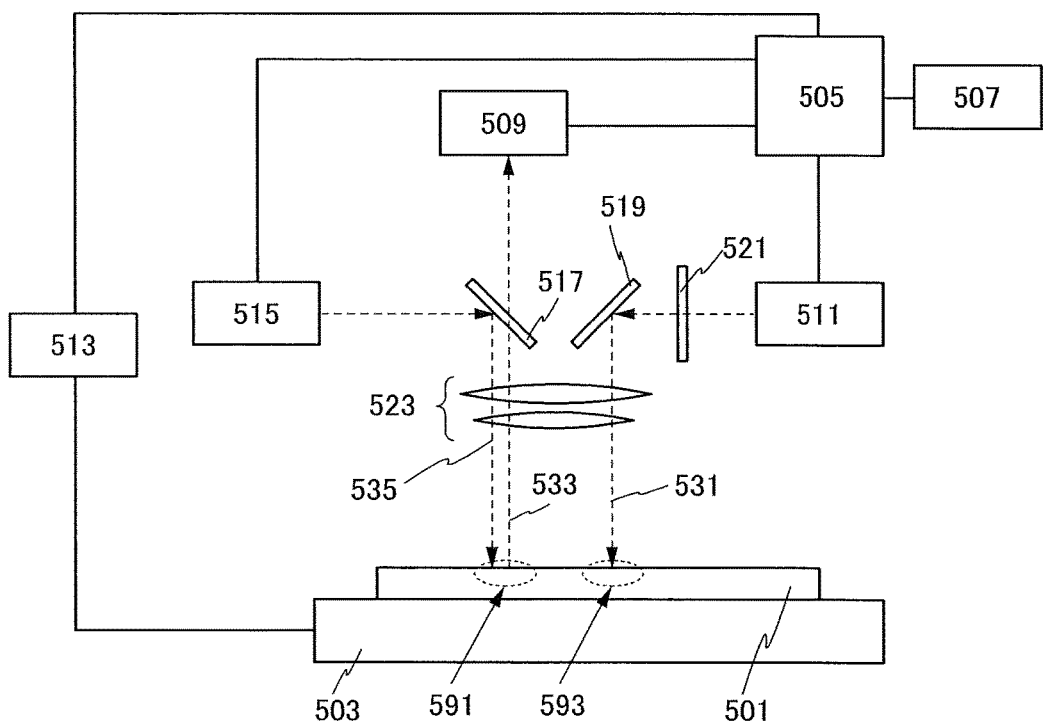
FIGS. 27A and 27B each show a laser irradiation system.
Figure 27B:
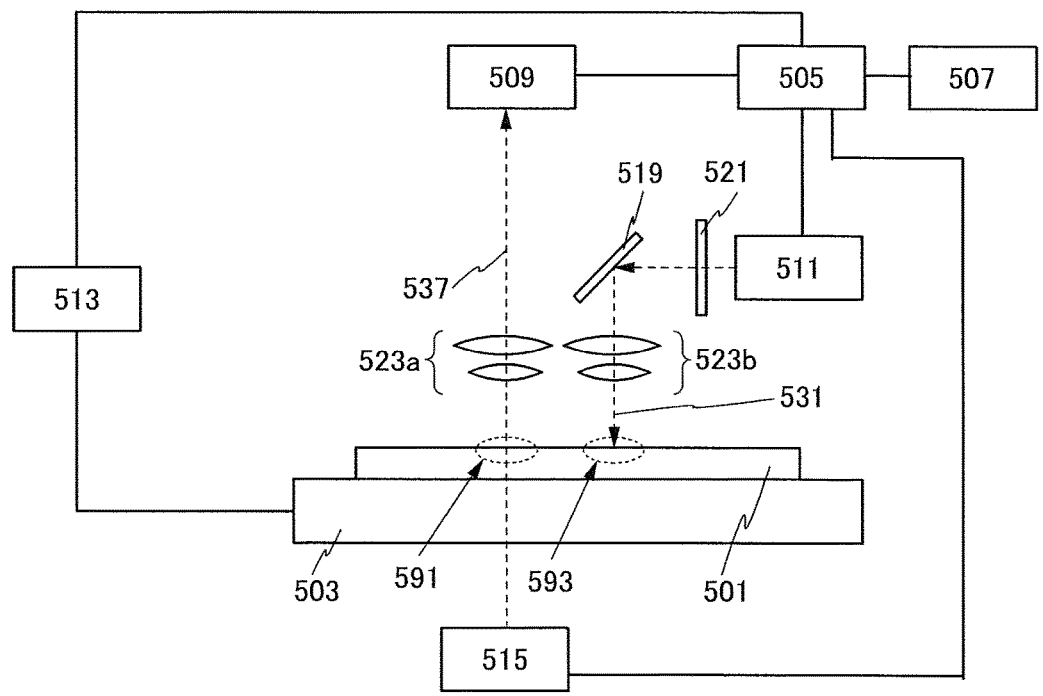

Laser irradiation systems illustrated in FIGS. 27A and 27B each include a stage 503, a processing portion 505, a display device 507, a camera 509, a laser device 511, an alignment mechanism 513, and a light source 515.

As a sample 501 disposed on the stage 503, the structure illustrated in FIG. 1B or FIG. 6A can be given as an example.

An observation result of the camera 509 is output to the display device 507 through the processing portion 505.

For example, an optical microscope including a camera can be used as the camera 509. Light detected by the camera 509 is processed in the processing portion 505 and displayed as an image in the display device 507.

The laser device 511 can be used to emit laser light for forming a peeling starting point.

The processing portion 505 is connected to the display device 507, the camera 509, the laser device 511, the alignment mechanism 513, and the light source 515. Since the laser irradiation systems in this embodiment include the processing portion 505, the alignment mechanism 513, the laser device 511, and the light source 515 can be set to operate automatically depending on the observation result of the camera 509 or the like. Moreover, a practitioner can operate as appropriate the alignment mechanism 513, the laser device 511, and the light source 515 depending on the observation result of the camera 509 or the like, which is output to the display device 507.

In the example described below, a laser light irradiation position 593 in the sample 501 is determined by a distance from a marker position 591. Note that the laser light irradiation position 593 may be detected directly by the camera 509.

First of all, the laser irradiation system in FIG. 27A is described.

First, light is detected by the camera 509 while the stage 503 is moved with the alignment mechanism 513. The sample 501 is irradiated with light 535 from the light source 515 through a half mirror 517 and a condenser lens 523. The camera 509 is irradiated with reflected light 533 from the sample 501 through the condenser lens 523 and the half mirror 517. As a result, the marker position 591 in the sample 501 is specified. At this time, a shutter 521 is closed.

A distance between the laser light irradiation position 593 and the marker position 591 are determined in advance, so that a predetermined position of the sample 501 can be irradiated with laser light even when the laser light irradiation portion 593 is not directly specified by the camera 509. Accordingly, the camera 509 and the light source 515 are preferably prevented from being irradiated with laser light. Note that a shutter overlapped with the camera 509 or the light source 515 may be provided.

Subsequently, the shutter 521 is opened so that laser light 531 is emitted from the laser device 511. The laser light irradiation position 593 (positioned at a predetermined distance from the marker position 591) in the sample 501 is irradiated with the laser light 531 through a mirror 519 and the condenser lens 523. Accordingly, a peeling starting point can be formed on the sample 501. Note that the condenser lens through which the laser light 531 is transmitted and the condenser lens through which the light 535 and the reflected light 533 are transmitted may be the same or different.

In the laser irradiation system in FIG. 27A, the marker position 591 and further the laser light irradiation position 593 can be specified by the reflected light 533 which is obtained when the light 535 from the light source 515 is reflected on the sample 501. Therefore, a position to be irradiated with laser light can be easily specified even in the case of a sample having a low light-transmitting property (e.g., a sample in which a light-blocking film is used as a peeling layer).

Next, the laser irradiation system in FIG. 27B is described.

First, light is detected by the camera 509 while the stage 503 is moved with the alignment mechanism 513. The camera 509 is irradiated with the light 535 from the light source 515 through the sample 501 and a condenser lens 523a. As a result, the marker position 591 in the sample 501 is specified. At this time, the shutter 521 is closed.

Subsequently, the shutter 521 is opened so that the laser light 531 is emitted from the laser device 511. The laser light irradiation position 593 in the sample 501 is irradiated with the laser light 531 through the mirror 519 and a condenser lens 523b. Accordingly, a peeling starting point can be formed on the sample 501.

In the laser irradiation system in FIG. 27B, the marker position 591 and further the laser light irradiation position 593 can be specified by light 537 (transmitted light) which is obtained when light from the light source 515 is transmitted through the sample 501.

In addition, in the laser irradiation systems in this embodiment, a peeling starting point can be formed at a predetermined position with the processing portion 505 even when a user does not check the marker position 591 or the laser light irradiation position 593 through the camera 509.

For example, the marker position 591 may be specified in such a manner that an image on the sample 501 which is taken in advance and an image detected by the camera 509 are overlapped with each other.

Furthermore, in the case where the laser light irradiation position 593 is directly specified, a position corresponding to an end portion of the bonding layer or a boundary between the bonding layer and the partition may be specified. At this time, different materials are preferably used for the bonding layer and the partition so that the position can be specified easily. For example, the boundary between the bonding layer and the partition can be specified clearly when particles of zeolite or the like are contained in one of the materials.

Next, a laser irradiation system capable of directly detecting the laser light irradiation position 593 by the camera 509 is described with reference to FIG. 32.

Figure 32:
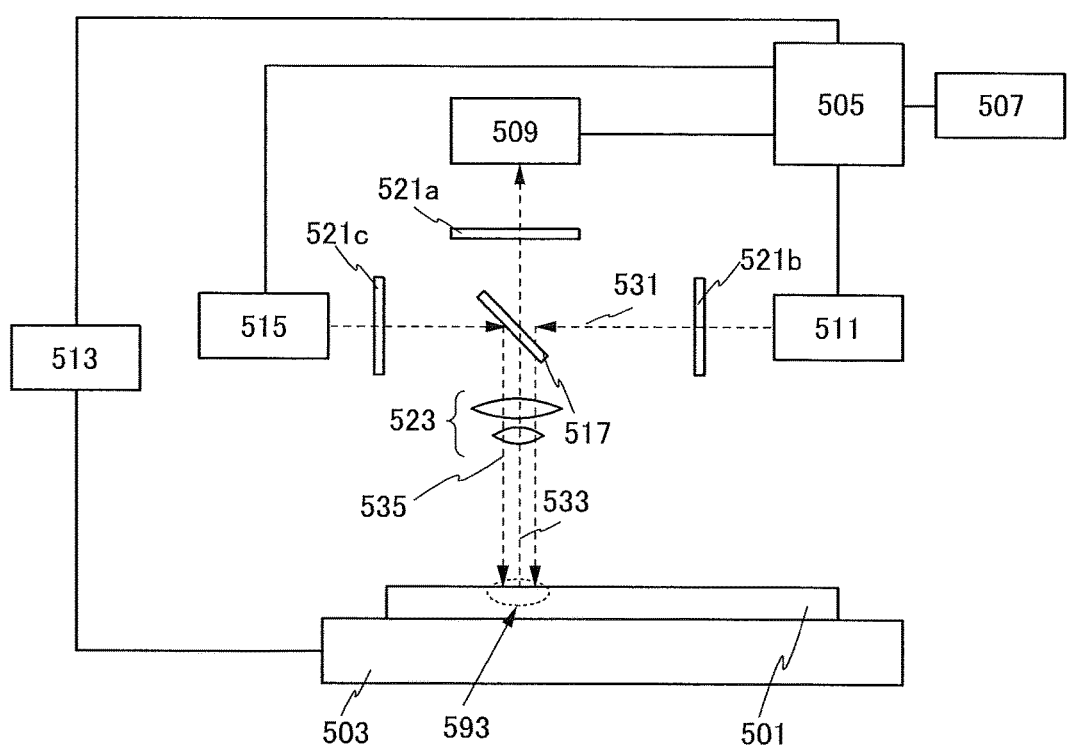
FIG. 32 shows a laser irradiation system.

In FIG. 32, a movable half mirror 517 is used. The sample 501 can be irradiated with the light 535 from the light source 515 or the laser light 531 by changing the direction of the half mirror 517.

First, a shutter 521a is opened, and light is detected by the camera 509 while the stage 503 is moved with the alignment mechanism 513. When a shutter 521c is opened, the sample 501 is irradiated with the light 535 from the light source 515 through the half mirror 517 and the condenser lens 523. The camera 509 is irradiated with the reflected light 533 from the sample 501 through the condenser lens 523 and the half mirror 517. As a result, the laser light irradiation position 593 in the sample 501 is specified. At this time, a shutter 521b is closed.

Subsequently, the shutters 521a and 521c are closed, and the shutter 521b is opened by changing the direction of the half mirror 517 so that the laser light 531 is emitted from the laser device 511. The laser light irradiation position 593 in the sample 501 is irradiated with the laser light 531 through the mirror 519 and the condenser lens 523. Accordingly, a peeling starting point can be formed on the sample 501.

This embodiment can be freely combined with any of the other embodiments.

Example 1

In this example, the peeling method of one embodiment of the present invention will be described. An example of a method for verifying whether or not a peeling starting point was formed in the peeling method of one embodiment of the present invention will be described.

First, a 200-nm-thick silicon oxynitride film was formed as a base film 653 over a glass substrate 651 serving as a support substrate. Next, a 30-nm-thick tungsten film 655 was formed over the base film 653. Then, nitrous oxide ($N_2O$) plasma treatment was performed on the tungsten film 655, and a tungsten oxide film 657 was foamed on the surface of the tungsten film 655. Here, the tungsten film 655 and the tungsten oxide film 657 correspond to the peeling layer. Next, five insulating layers were formed over a layer 659 to be peeled (hereinafter referred to as a layer 659). Specifically, a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film were stacked in this order. Then, the insulating layers and a glass substrate 663 serving as a counter substrate were attached to each other with an epoxy resin 661 (see FIGS. 29C and 29D).

Next, laser light irradiation was performed so that laser light would be overlapping with an end portion of the epoxy resin. Here, a pulse laser with a wavelength of 532 nm was used, and a pulse width was set to 10 nanoseconds (ns). The area of a region irradiated with the laser light is about 150 μm×150 μm.

Figure 28A:
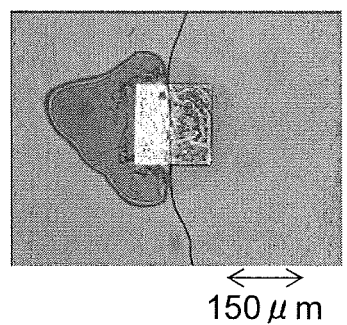
FIGS. 28A and 28B are optical micrographs of samples in Example.
Figure 28B:
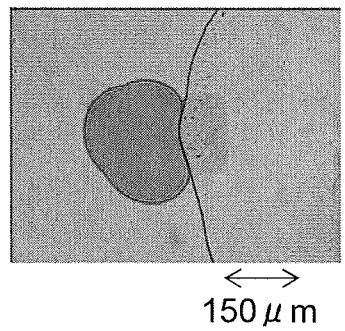

FIG. 28A shows the result of optical microscope observation of a sample irradiated with the laser light under a condition where an energy is 0.15 mJ. FIG. 28B shows the result of optical microscope observation of a comparative sample irradiated with the laser light under a condition where an energy is 0.045 mJ. Note that the observation was performed using transmitted light.

Figure 29A:
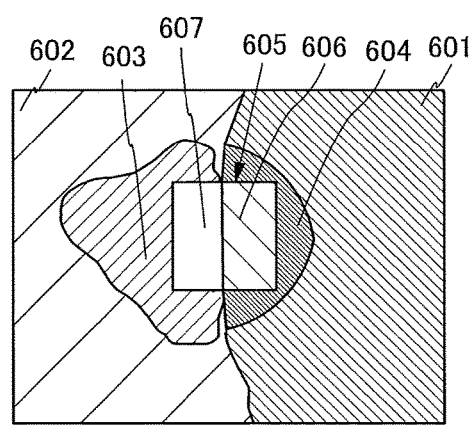
FIGS. 29A to 29D are diagrams illustrating the optical micrographs of samples in Example.
Figure 29B:
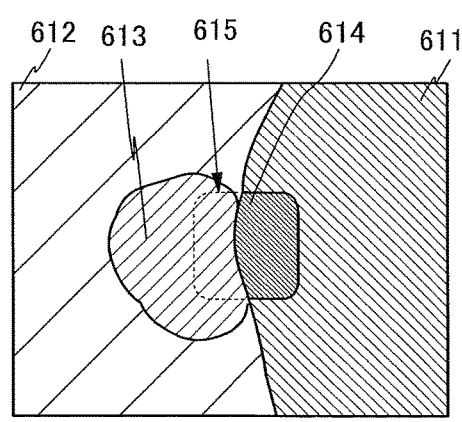
Figure 29C:
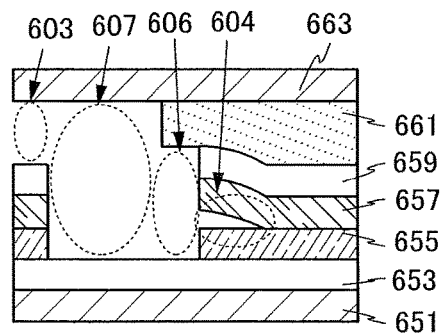
Figure 29D:
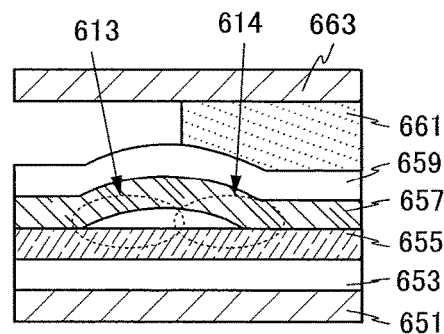

A schematic diagram of the photograph in FIG. 28A is illustrated in FIG. 29A, and a schematic cross-sectional view estimated therefrom is illustrated in FIG. 29C. Moreover, a schematic diagram of the photograph in FIG. 28B is illustrated in FIG. 29B, and a schematic cross-sectional view estimated therefrom is illustrated in FIG. 29D.

A region 601 illustrated in FIG. 29A is a region where the epoxy resin is provided, and a region 602 is a region where the epoxy resin is not provided. A laser light irradiation region 605 is over the region 601 and the region 602, and includes a laser light irradiation region 606 included in the region 601 and a laser light irradiation region 607 included in the region 602. The laser light irradiation region 606 transmits light partly, whereas the laser light irradiation region 607 transmits light almost entirely.

FIG. 29C shows that in a light-transmitted portion of the laser light irradiation region 606, the tungsten film 655, the tungsten oxide film 657, and the layer 659 are removed and the epoxy resin 661 remains. Moreover, not only the tungsten film 655, the tungsten oxide film 657, and the layer 659 but also the epoxy resin 661 does not exist in the laser light irradiation region 607. Then, a region 604 is a region where a space is formed between the tungsten film 655 and the tungsten oxide film 657. It is considered that, by irradiation with the laser light, the temperatures of the tungsten film 655 and the tungsten oxide film 657 rise, and a space is formed at an interface between the tungsten film 655 and the tungsten oxide film 657, which have low adhesion, or in the tungsten oxide film 657 due to thermal stress, emission of gas that remains in the layer, or the like.

When the sample in FIG. 28A is peeled by lifting the glass substrate 663, separation occurred at the interface between the tungsten film 655 and the tungsten oxide film 657.

A region 611 illustrated in FIG. 29B is a region where the epoxy resin is provided, and a region 612 is a region where the epoxy resin is not provided. A laser light irradiation region 615 is over the region 611 and the region 612. There is no region that completely transmits light in the laser light irradiation region 615, which shows that there is no region where the tungsten film 655 is completely removed by laser light irradiation.

As illustrated in FIG. 29D, a region 613 is a region where a space is formed between the tungsten film 655 and the tungsten oxide film 657 and where the epoxy resin 661 does not remain. A region 614 is a region where a space is formed between the tungsten film 655 and the tungsten oxide film 657 and where the epoxy resin 661 remains. It is considered that, by irradiation with the laser light, the temperatures of the tungsten film 655 and the tungsten oxide film 657 rise, and a space is formed at an interface between the tungsten film 655 and the tungsten oxide film 657, which have low adhesion, or in the tungsten oxide film 657 due to thermal stress, emission of gas that remains in the layer, or the like.

When the sample in FIG. 28B is peeled by lifting the glass substrate 663, the layer 659 was not able to be peeled from the glass substrate 651 to be transferred to the glass substrate 663 side because separation occurred at the interface between the epoxy resin 661 and the layer 659 or in the epoxy resin 661.

As described in Embodiment 1, at least one of the layers to be peeled that is in contact with a peeling layer may be damaged to form a peeling starting point. Here, in the case where a light-blocking film is used as the peeling layer, the peeling layer is also damaged, whereby transmittance of visible light in a damaged portion (a portion where a peeling starting point is formed) is changed after formation of the peeling starting point. Accordingly, whether or not a peeling starting point was able to be formed is preferably determined with ease. By employing the method of this example, separation is performed after it is verified that a peeling starting point can be surely formed, whereby the yield can be improved.

This application is based on Japanese Patent Application serial No. 2013-163029 filed with the Japan Patent Office on Aug. 6, 2013, the entire contents of which are hereby incorporated by reference.

What is claimed is:

1. A manufacturing method comprising:
    forming a peeling layer over a first substrate;
    forming a first layer over and in contact with the peeling layer;
    forming a functional element over the peeling layer;
    attaching the first substrate and a second substrate to each other with a bonding layer and a frame-shaped partition surrounding the bonding layer, wherein the second substrate faces the functional element with the bonding layer therebetween;
    curing the bonding layer, wherein an end portion of the bonding layer is positioned on an inner side than an end portion of the peeling layer; and
    separating the peeling layer and the first layer,
    wherein the frame-shaped partition is formed over the second substrate so as to comprise a slit at a corner.

2. The manufacturing method according to claim 1, further comprising:
    forming a peeling starting point by removing part of the first layer by laser light irradiation.

3. The manufacturing method according to claim 2,
    wherein the frame-shaped partition is in an uncured or semi-cured state in the step of forming the peeling starting point, and
    wherein the part of the first layer overlaps with the peeling layer and the bonding layer.

4. The manufacturing method according to claim 2,
    wherein the frame-shaped partition is in a cured state in the step of forming the peeling starting point, and
    wherein the part of the first layer overlaps with the peeling layer and the frame-shaped partition.

5. The manufacturing method according to claim 4,
    wherein part of the frame-shaped partition exists between the first layer and the second substrate after separating the peeling layer and the first layer.

6. The manufacturing method according to claim 1,
    wherein the frame-shaped partition is in contact with the bonding layer in the step of curing the bonding layer.

7. The manufacturing method according to claim 1,
    wherein the frame-shaped partition and the bonding layer are formed over the second substrate before attaching the first substrate and the second substrate to each other.

8. The manufacturing method according to claim 7,
    wherein the frame-shaped partition is formed before the bonding layer is formed.

9. The manufacturing method according to claim 1,
    wherein the first layer is an insulating layer, and
    wherein the functional element includes any one of a semiconductor element, a light-emitting element, and a display element.

10. A manufacturing method comprising:
    forming a first peeling layer over a first substrate;
    forming a first layer over the first peeling layer, wherein the first layer includes a second layer which is in contact with the first peeling layer;
    forming a second peeling layer over a second substrate;
    forming a third layer over the second peeling layer, wherein the third layer includes a fourth layer which is in contact with the second peeling layer;
    attaching the first substrate and the second substrate to each other with a first bonding layer and a frame-shaped partition surrounding the first bonding layer, wherein the first layer faces the third layer with the first bonding layer therebetween;
curing the first bonding layer, wherein an end portion of the first bonding layer is positioned on an inner side than an end portion of the first peeling layer;
forming a first peeling starting point by removing part of the second layer;
separating the first peeling layer and the first layer from the first peeling starting point;
attaching the first layer and a third substrate to each other with a second bonding layer and curing the second bonding layer;
forming a second peeling starting point by removing part of the fourth layer; and
separating the second peeling layer and the third layer from the second peeling starting point.

11. The manufacturing method according to claim 10, wherein the first peeling starting point and the second peeling starting point are each fainted by laser light irradiation.

12. The manufacturing method according to claim 10, wherein an end portion of the second peeling layer is positioned on an inner side than the end portion of the first bonding layer in the step of curing the first bonding layer.

13. The manufacturing method according to claim 10, wherein the first layer includes a light-emitting element, and
wherein the third layer includes a color filter.

14. The manufacturing method according to claim 10, wherein the frame-shaped partition is in a cured state in the step of forming the first peeling starting point, and
wherein the part of the second layer overlaps with the first bonding layer and the frame-shaped partition.

15. The manufacturing method according to claim 14, wherein the first layer includes part of the frame-shaped partition after separating the first peeling layer and the first layer.

16. The manufacturing method according to claim 10, wherein the frame-shaped partition is a first frame-shaped partition, and
wherein a second frame-shaped partition surrounding the second bonding layer is provided before attaching the first layer and the third substrate to each other.

17. The manufacturing method according to claim 16, wherein the second frame-shaped partition is in a cured state in the step of forming the second peeling starting point, and
wherein the part of the fourth layer overlaps with the second bonding layer and the second frame-shaped partition.

18. A manufacturing method comprising:
forming a first peeling layer over a first substrate;
forming a first layer over the first peeling layer, wherein the first layer includes a second layer which is in contact with the first peeling layer;
forming a second peeling layer over a second substrate;
forming a third layer over the second peeling layer, wherein the third layer includes a fourth layer which is in contact with the second peeling layer;
attaching the first substrate and the second substrate to each other with a first bonding layer and a frame-shaped partition surrounding the first bonding layer, wherein the first layer faces the third layer with the first bonding layer therebetween;
curing the first bonding layer, wherein an end portion of the first bonding layer is positioned on an inner side than each end portions of the first peeling layer and the second peeling layer;
forming a first peeling starting point by removing part of the second layer;
separating the first peeling layer and the first layer from the first peeling starting point;
attaching the first layer and a third substrate to each other with a second bonding layer and curing the second bonding layer;
forming a second peeling starting point by removing part of the third substrate, part of the second bonding layer, part of the fourth layer and part of the second peeling layer; and
separating the second peeling layer and the third layer from the second peeling starting point.

19. The manufacturing method according to claim 18, wherein the first peeling starting point is formed by laser light irradiation, and
wherein the second peeling starting point is formed by using a knife.

20. The manufacturing method according to claim 18, wherein the first layer includes a light-emitting element, and
wherein the third layer includes a color filter.

21. A manufacturing method comprising:
forming a first peeling layer over a first substrate;
forming a first layer over and in contact with the first peeling layer;
forming a second peeling layer over a second substrate;
forming a second layer over the second peeling layer;
attaching the first substrate and the second substrate to each other with a first bonding layer and a frame-shaped partition surrounding the first bonding layer, wherein the second substrate faces the first layer with the first bonding layer therebetween;
curing the first bonding layer, wherein an end portion of the first bonding layer is positioned on an inner side than an end portion of the first peeling layer;
separating the first substrate and the first layer;
attaching the first layer and a third substrate to each other with a second bonding layer and curing the second bonding layer; and
separating the second substrate and the second layer.

22. The manufacturing method according to claim 21, further comprising:
forming a peeling starting point by removing part of the first layer by laser light irradiation.

23. The manufacturing method according to claim 22, wherein the frame-shaped partition is in an uncured or semi-cured state in the step of forming the peeling starting point, and
wherein the part of the first layer overlaps with the first peeling layer and the first bonding layer.

24. The manufacturing method according to claim 22, wherein the frame-shaped partition is in a cured state in the step of forming the peeling starting point, and
wherein the part of the first layer overlaps with the first peeling layer and the frame-shaped partition.

25. The manufacturing method according to claim 24, wherein part of the frame-shaped partition exists between the first layer and the second substrate after separating the first substrate and the first layer.

26. The manufacturing method according to claim 21, wherein the frame-shaped partition is in contact with the first bonding layer in the step of curing the first bonding layer.

27. The manufacturing method according to claim 21, wherein the frame-shaped partition and the first bonding layer are formed over the second substrate before attaching the first substrate and the second substrate to each other.

28. The manufacturing method according to claim 27, wherein the frame-shaped partition is formed before the first bonding layer is formed.

29. The manufacturing method according to claim 27, wherein the frame-shaped partition is formed over the second substrate so as to comprise a slit at a corner.

30. The manufacturing method according to claim 21, wherein the first layer is an insulating layer.

\* \* \* \* \*

UNITED STATES PATENT AND TRADEMARK OFFICE
CERTIFICATE OF CORRECTION

PATENT NO. : 9,735,398 B2  
APPLICATION NO. : 14/450463  
DATED : August 15, 2017  
INVENTOR(S) : Tomoya Aoyama et al.

It is certified that error appears in the above-identified patent and that said Letters Patent is hereby corrected as shown below:

In the Specification

Column 13, Line 36; Change "Ruined" to --formed--.

Column 19, Line 17; Change "FIG. 10G" to --FIG. 10G,--.

Column 29, Line 44; Change "framing" to --forming--.

Column 31, Line 54; Change "Ruined" to --formed--.

Column 38, Line 37; Change "foamed" to --formed--.

In the Claims

Column 41, Line 20, Claim 11; Change "fainted" to --formed--.

Signed and Sealed this  
Fourteenth Day of November, 2017

Joseph Matal  
*Performing the Functions and Duties of the*  
*Under Secretary of Commerce for Intellectual Property and*  
*Director of the United States Patent and Trademark Office*